(12) United States Patent
Wang et al.

(10) Patent No.: US 12,300,749 B2
(45) Date of Patent: May 13, 2025

(54) SOURCE/DRAIN FEATURES WITH IMPROVED STRAIN PROPERTIES

(71) Applicant: Taiwan Semiconductor Manufacturing Co., Ltd., Hsin-Chu (TW)

(72) Inventors: Chih-Ching Wang, Kinmen County (TW); Wen-Yuan Chen, Taoyuan County (TW); Wen-Hsing Hsieh, Hsinchu (TW); Kuan-Lun Cheng, Hsin-Chu (TW); Chung-Wei Wu, Hsin-Chu County (TW); Zhiqiang Wu, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 18/447,483

(22) Filed: Aug. 10, 2023

(65) Prior Publication Data
US 2023/0387301 A1 Nov. 30, 2023

Related U.S. Application Data

(62) Division of application No. 17/314,815, filed on May 7, 2021.

(51) Int. Cl.
*H01L 29/78* (2006.01)
*H01L 21/02* (2006.01)
(Continued)

(52) U.S. Cl.
CPC ...... *H01L 29/7847* (2013.01); *H01L 21/0259* (2013.01); *H01L 21/26526* (2013.01);
(Continued)

(58) Field of Classification Search
CPC ............ H01L 29/7847; H01L 21/0259; H01L 21/26526; H01L 29/0665; H01L 29/42392;
(Continued)

(56) References Cited

U.S. PATENT DOCUMENTS 7,335,545 B2 * 2/2008 Currie ............... H01L 29/78684
257/E21.127
9,293,534 B2 3/2016 Tsai et al.
(Continued)

OTHER PUBLICATIONS

P. Packan et al., "High performance Hi-K + metal gate strain enhanced transistors on (110) silicon," 2008 IEEE International Electron Devices Meeting, 2008, pp. 1-4, doi: 10:1109/IEDM 2008.4796614. Dec. 2008.

*Primary Examiner* — Jami Valentine Miller
*Assistant Examiner* — Pratiksha Jayant Lohakare
(74) *Attorney, Agent, or Firm* — HAYNES AND BOONE, LLP

(57) ABSTRACT

A method includes receiving a semiconductor substrate. The semiconductor substrate has a top surface and includes a semiconductor element. Moreover, the semiconductor substrate has a fin structure formed thereon. The method also includes recessing the fin structure to form source/drain trenches, forming a first dielectric layer over the recessed fin structure in the source/drain trenches, implanting a dopant element into a portion of the fin structure beneath a bottom surface of the source/drain trenches to form an amorphous semiconductor layer, forming a second dielectric layer over the recessed fin structure in the source/drain trenches, annealing the semiconductor substrate, and removing the first and second dielectric layers. After the annealing and the removing steps, the method further includes further recessing the recessed fin structure to provide a top surface.
(Continued)

Additionally, the method includes forming an epitaxial layer from and on the top surface.

20 Claims, 31 Drawing Sheets

(51) Int. Cl.
*H01L 21/265* (2006.01)
*H01L 29/06* (2006.01)
*H01L 29/423* (2006.01)
*H01L 29/66* (2006.01)
*H01L 29/786* (2006.01)

(52) U.S. Cl.
CPC .... *H01L 29/0665* (2013.01); *H01L 29/42392* (2013.01); *H01L 29/66545* (2013.01); *H01L 29/66553* (2013.01); *H01L 29/66742* (2013.01); *H01L 29/7848* (2013.01); *H01L 29/78618* (2013.01); *H01L 29/78696* (2013.01)

(58) Field of Classification Search
CPC ......... H01L 29/66545; H01L 29/66553; H01L 29/66742; H01L 29/7848; H01L 29/78618; H01L 29/78696; H01L 29/0673; H01L 29/0676; H01L 29/165; H01L 29/0847; H01L 29/32; H01L 29/6656; H01L 29/775; H01L 29/66795; B82Y 10/00; B82Y 40/00
USPC ....................................................... 257/347
See application file for complete search history.

(56) References Cited

U.S. PATENT DOCUMENTS

| | | | |
|---|---|---|---|
| 9,299,801 B1* | 3/2016 | Bakhishev | H01L 21/26506 |
| 9,502,265 B1* | 11/2016 | Jiang | H01L 29/42392 |
| 9,559,120 B2* | 1/2017 | Cheng | H01L 27/0922 |
| 9,595,522 B2 | 3/2017 | Tsai et al. | |
| 10,833,194 B2* | 11/2020 | Clifton | H01L 29/105 |
| 2003/0209729 A1 | 11/2003 | Micovic et al. | |
| 2006/0030094 A1 | 2/2006 | Chui et al. | |
| 2006/0148215 A1* | 7/2006 | Zhu | H01L 29/66545 438/527 |
| 2006/0205167 A1* | 9/2006 | Kavalieros | H01L 29/165 257/E29.267 |
| 2008/0179636 A1* | 7/2008 | Chidambarrao | H01L 29/1054 438/150 |
| 2013/0099314 A1 | 4/2013 | Lu et al. | |
| 2013/0122674 A1* | 5/2013 | Lin | H01L 29/165 438/285 |
| 2013/0146949 A1* | 6/2013 | Tsai | H01L 29/0847 257/E21.24 |
| 2014/0103444 A1* | 4/2014 | Tsai | H01L 27/088 257/288 |
| 2015/0262886 A1* | 9/2015 | Nieh | H01L 29/7834 438/296 |
| 2015/0270342 A1* | 9/2015 | Tsai | H01L 29/045 438/283 |
| 2017/0229476 A1* | 8/2017 | Kim | H01L 23/5283 |
| 2018/0151574 A1 | 5/2018 | Li | |
| 2019/0057867 A1* | 2/2019 | Smith | H01L 29/66545 |
| 2019/0378915 A1* | 12/2019 | Frougier | H01L 29/78651 |
| 2020/0105929 A1 | 4/2020 | Zhang et al. | |
| 2020/0168742 A1* | 5/2020 | Wang | H01L 29/66742 |
| 2020/0303521 A1* | 9/2020 | Son | H01L 29/78696 |
| 2021/0005747 A1* | 1/2021 | Wu | H01L 29/7816 |

\* cited by examiner

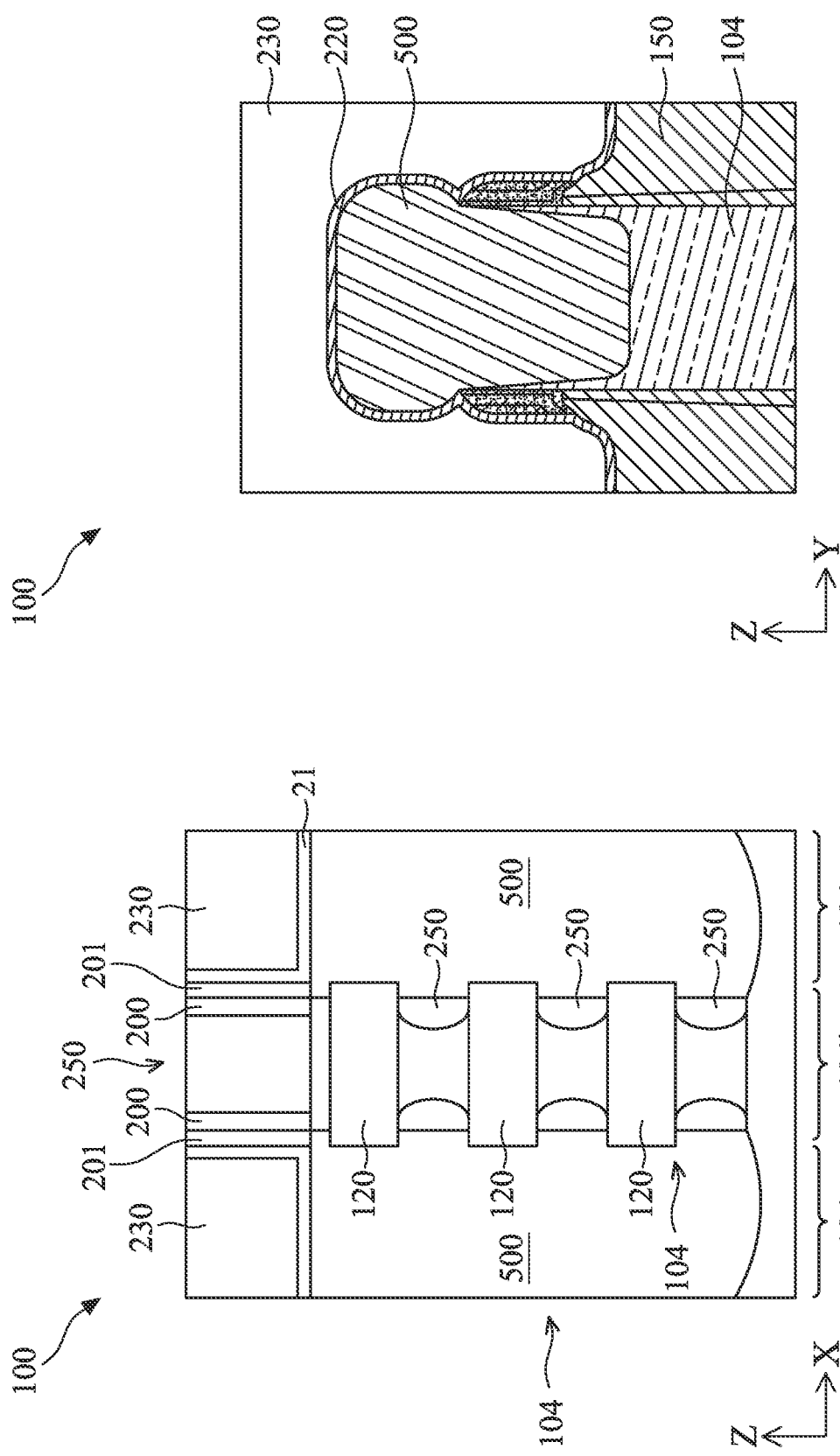

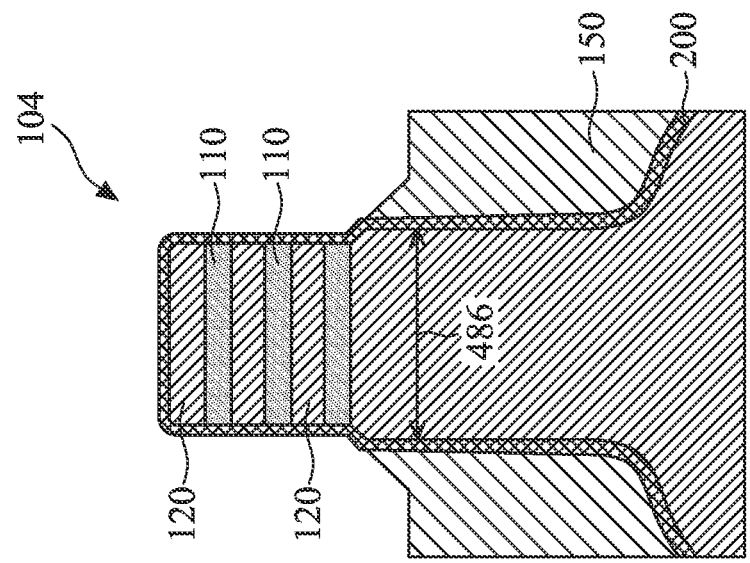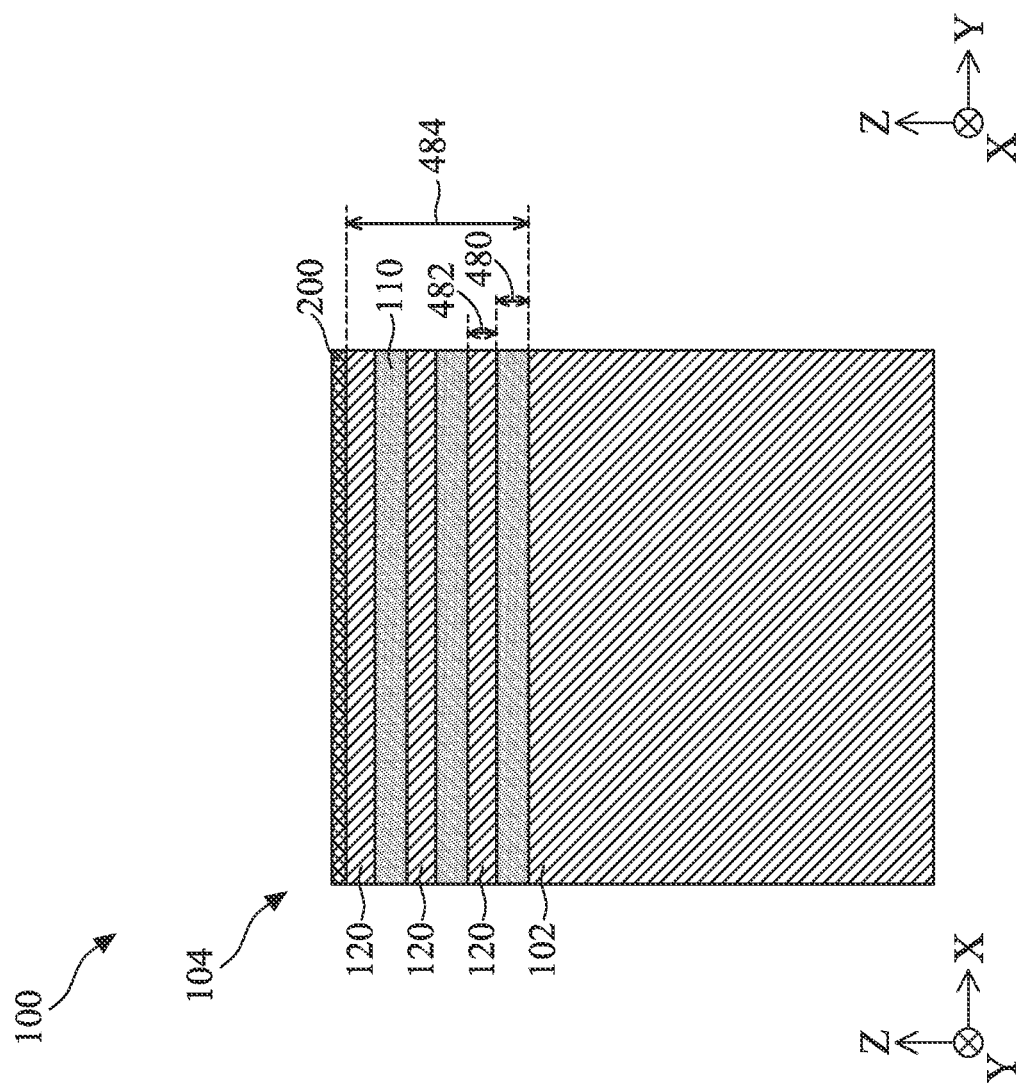
FIG. 3A
FIG. 3B

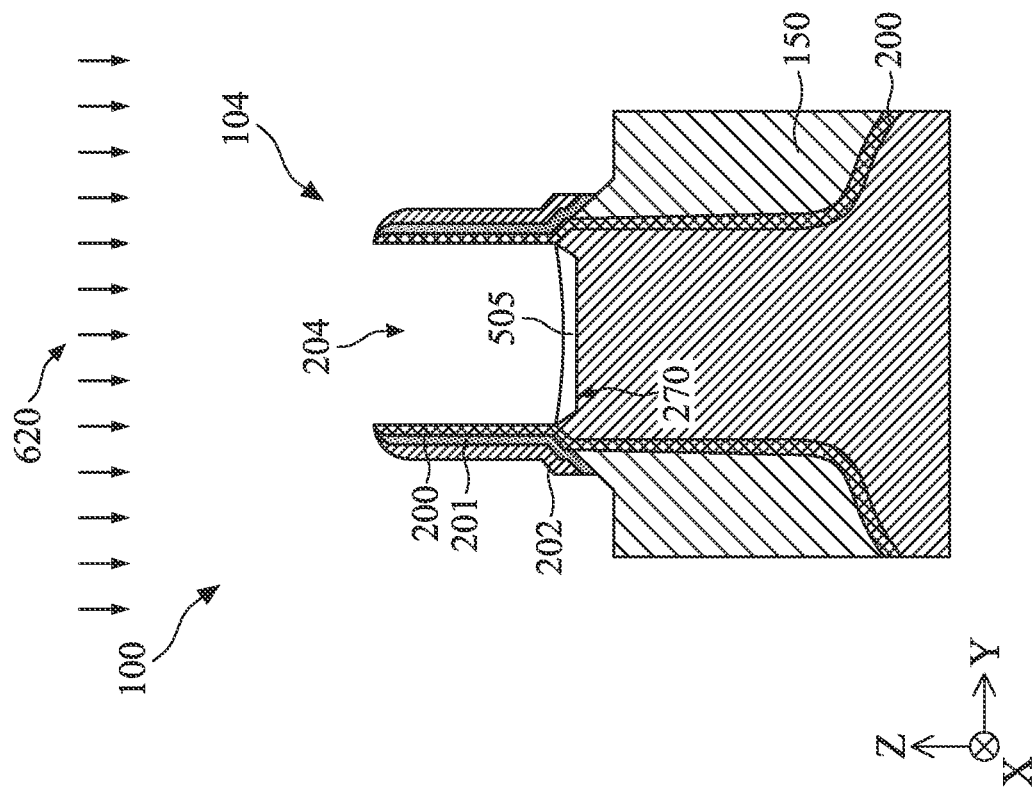
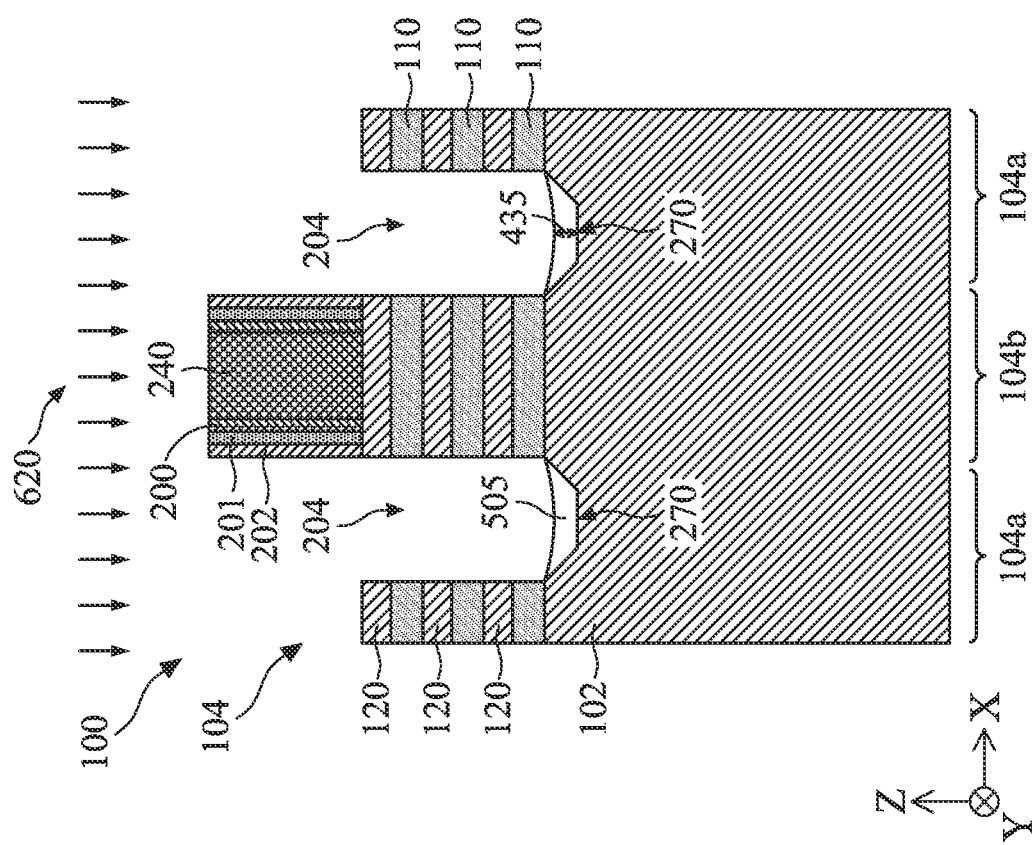
FIG. 6A
FIG. 6B

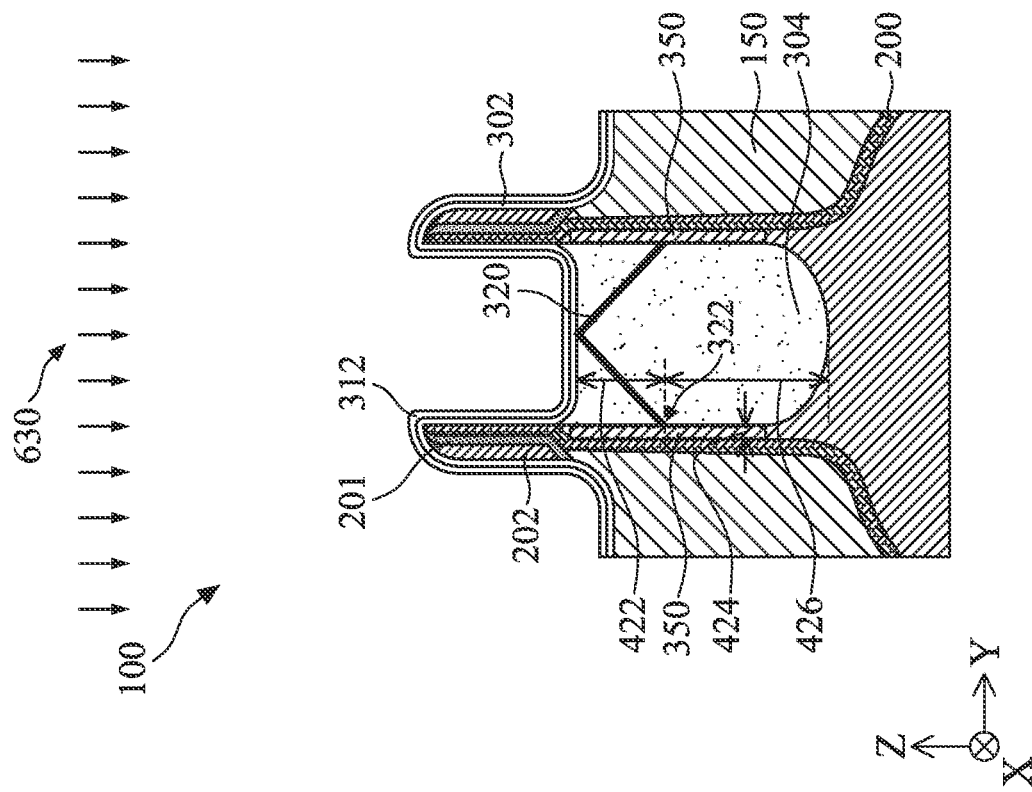
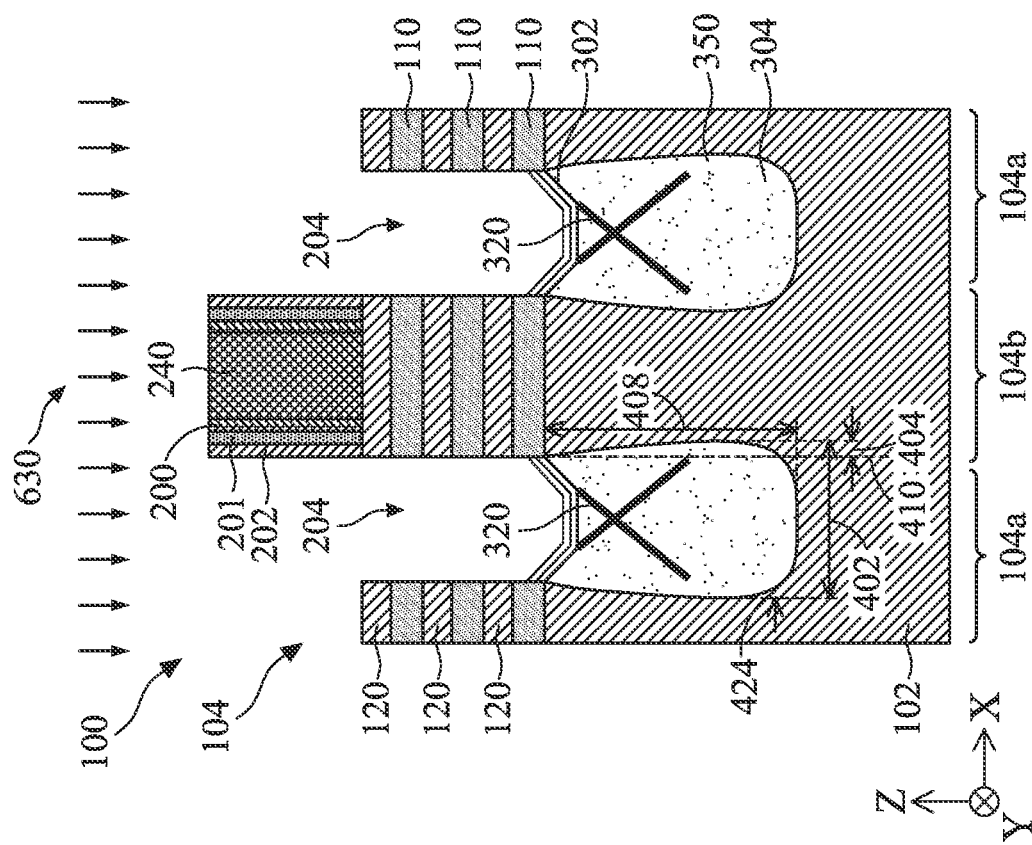
FIG. 9A
FIG. 9B

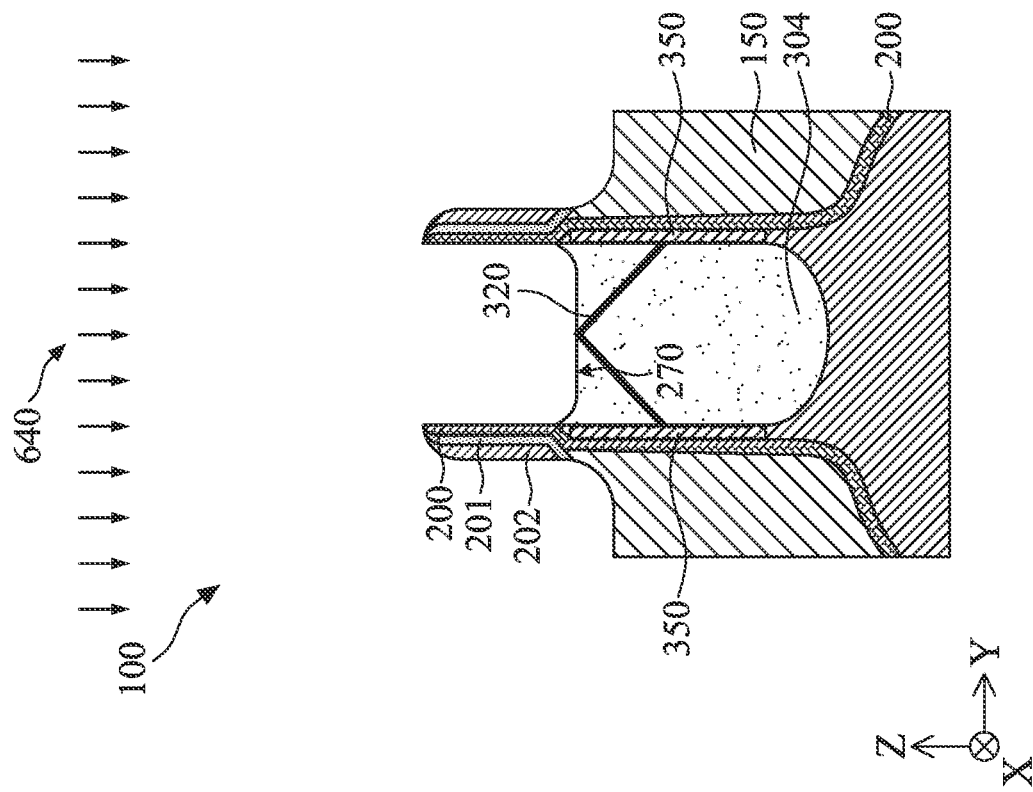
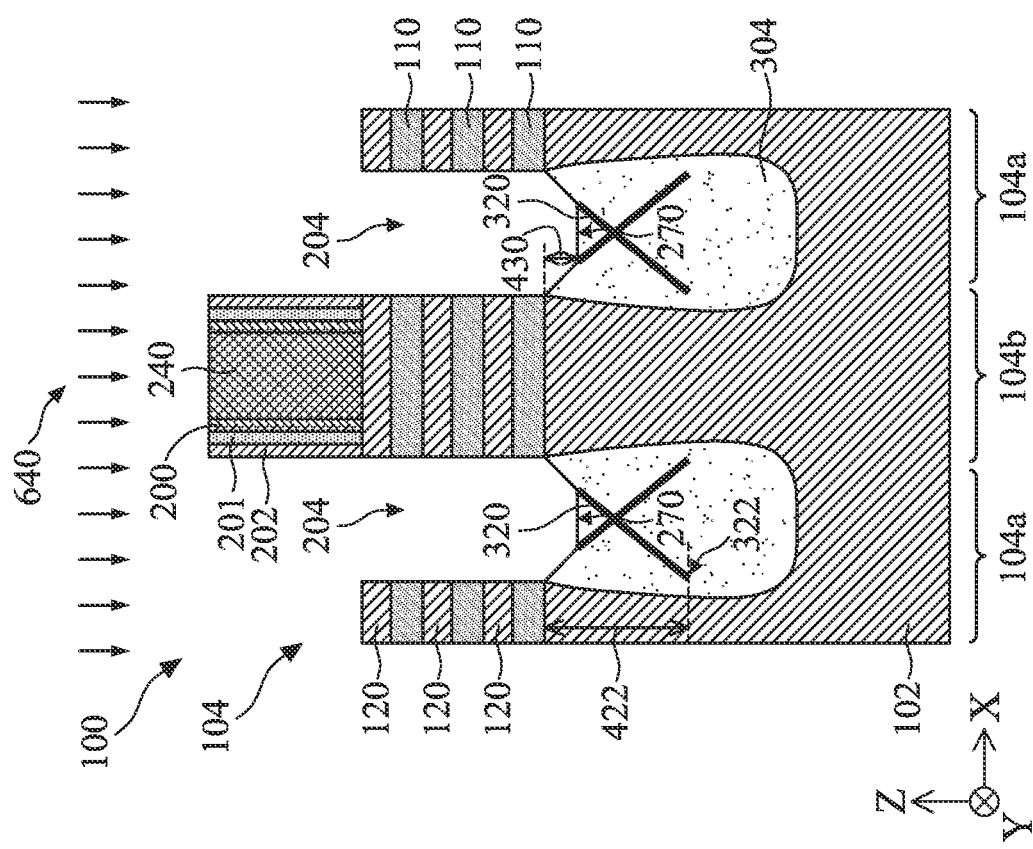
FIG. 10A
FIG. 10B

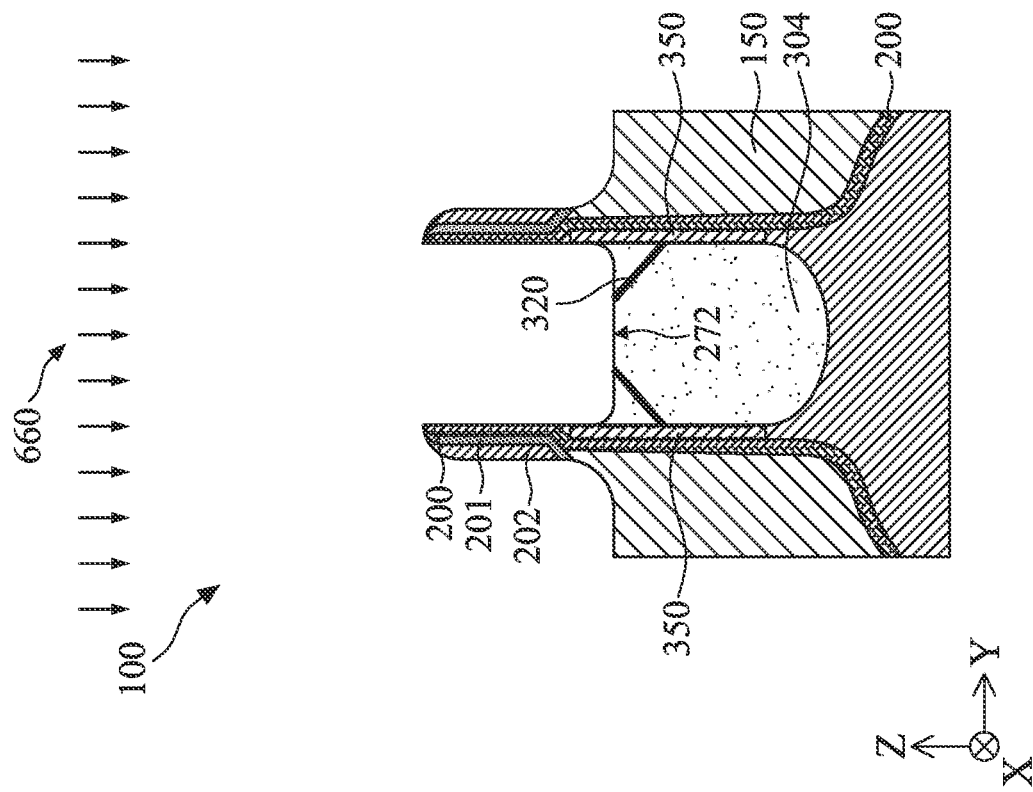
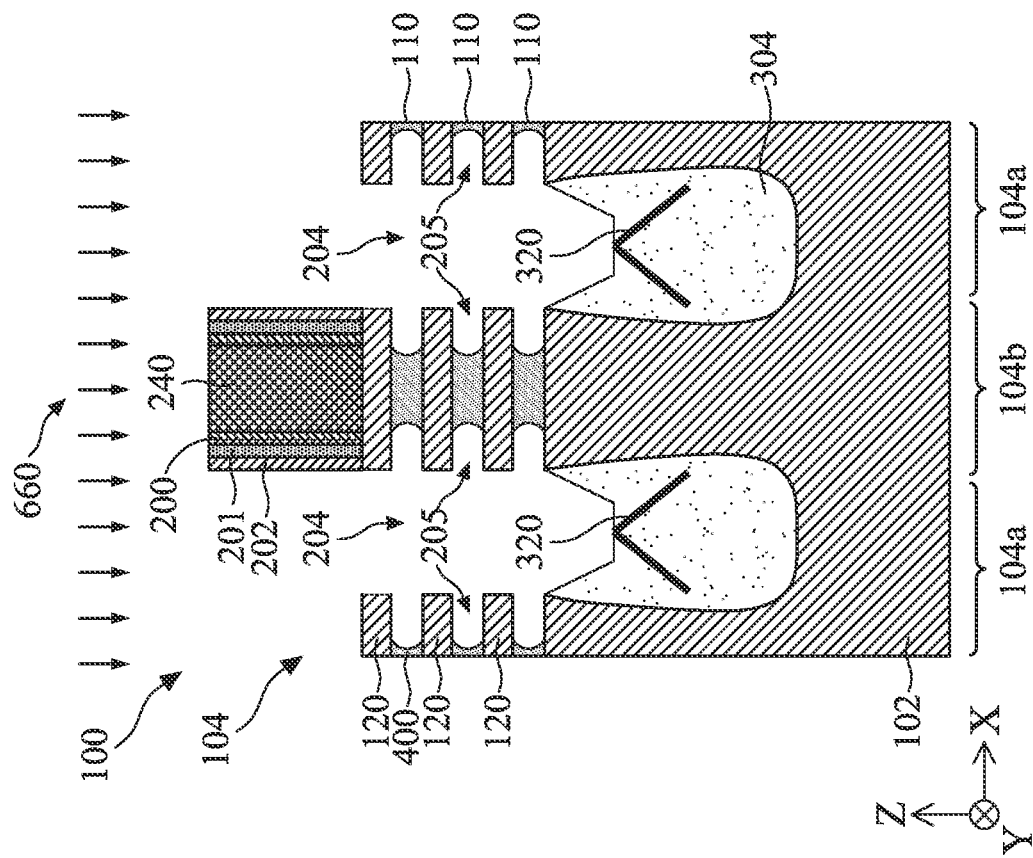
FIG. 12A
FIG. 12B

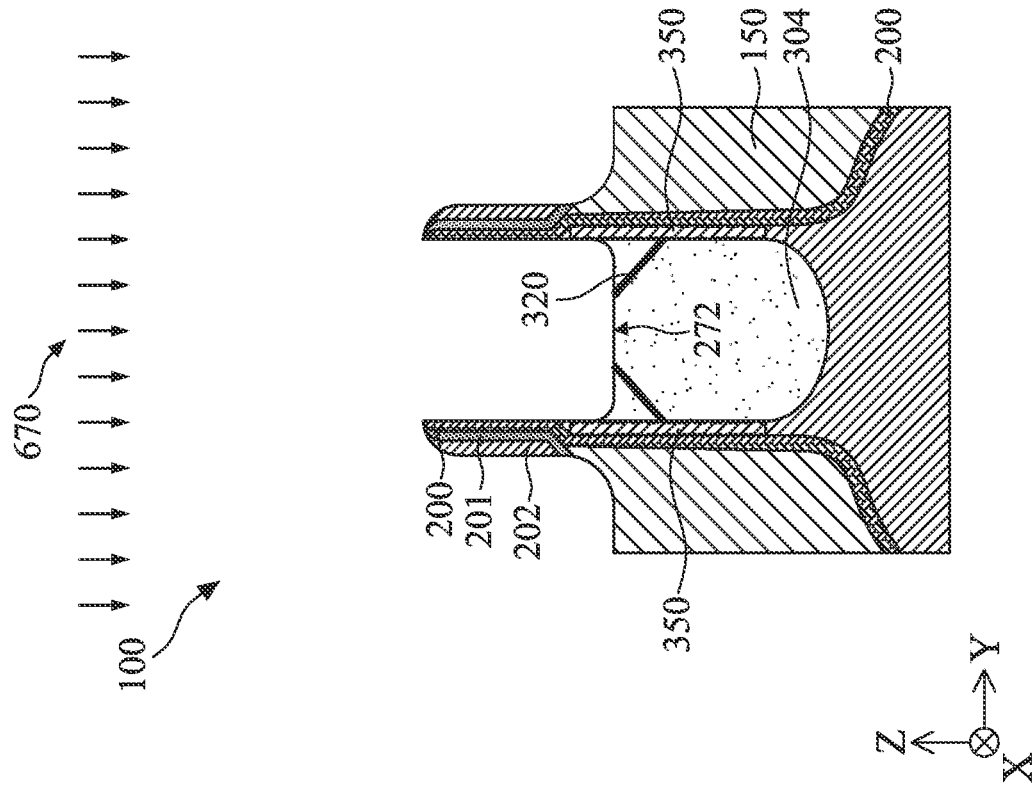
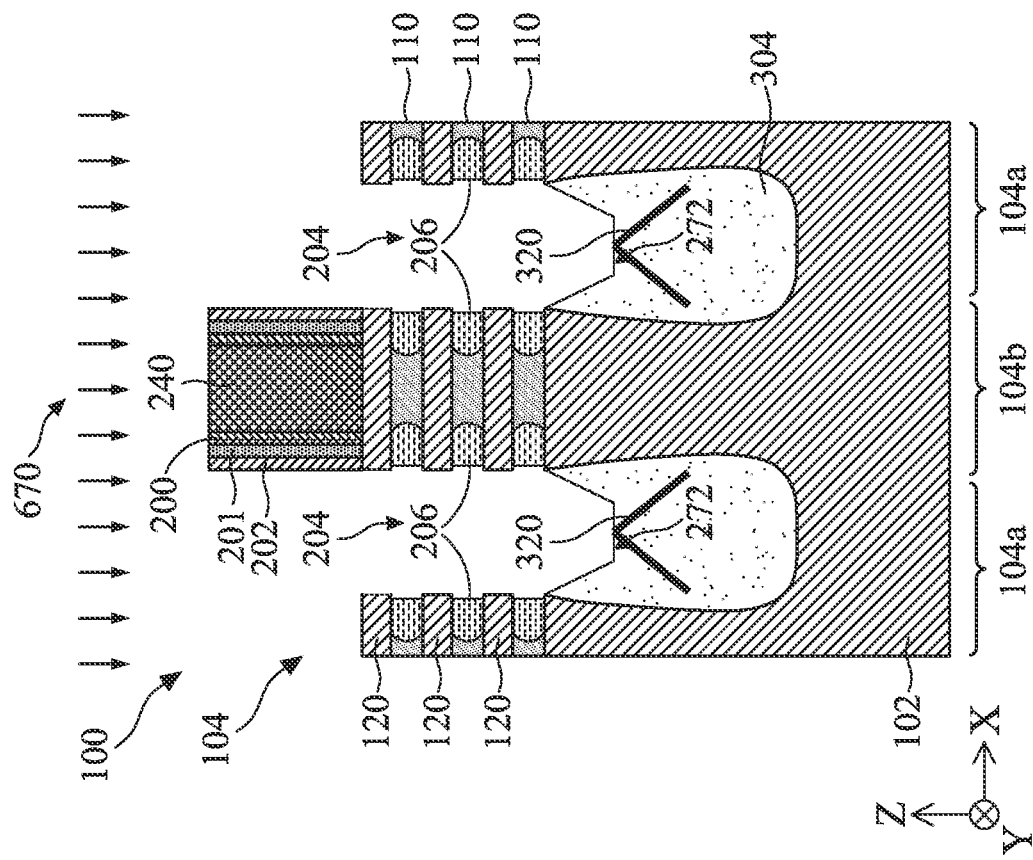
FIG. 13A
FIG. 13B

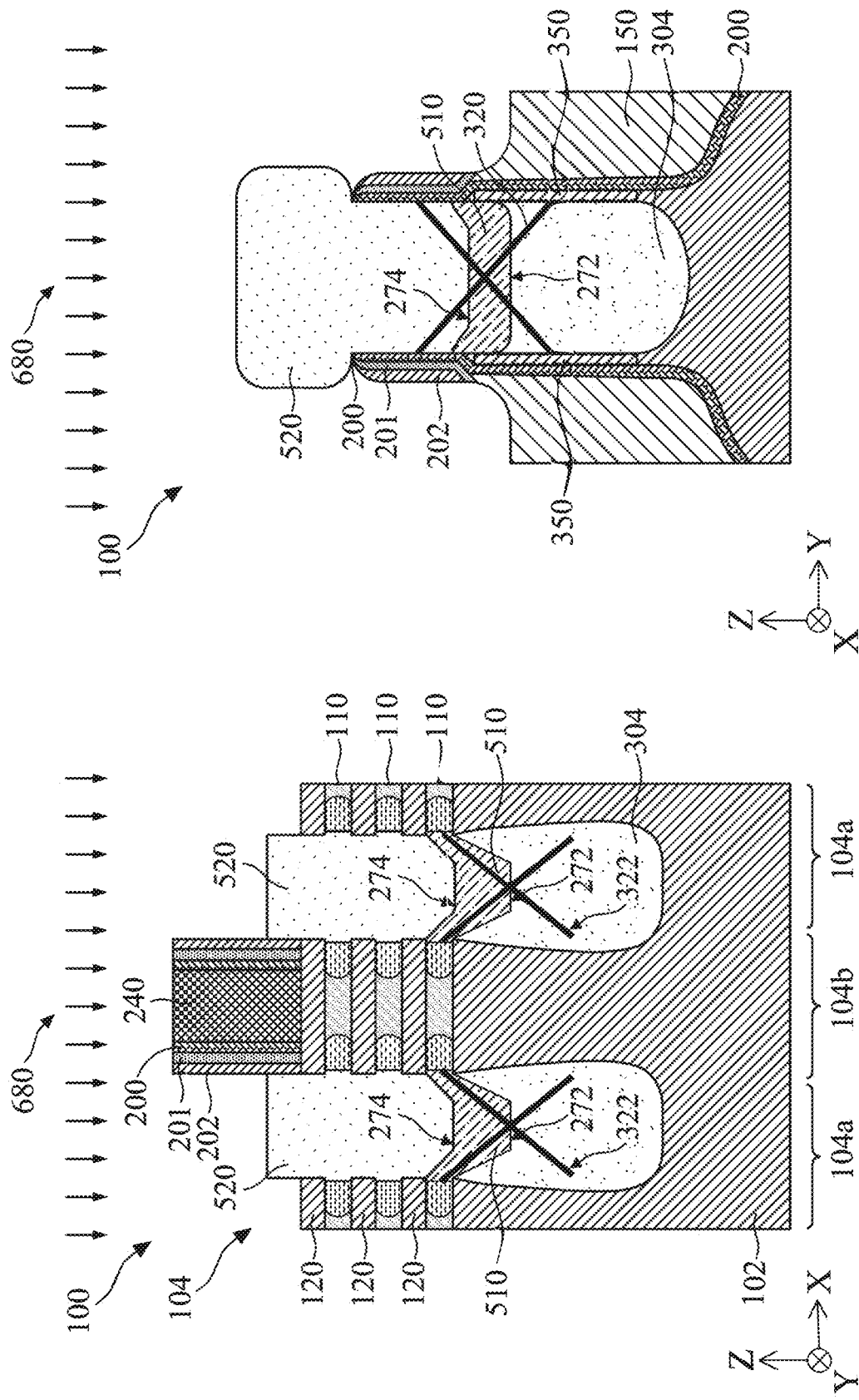

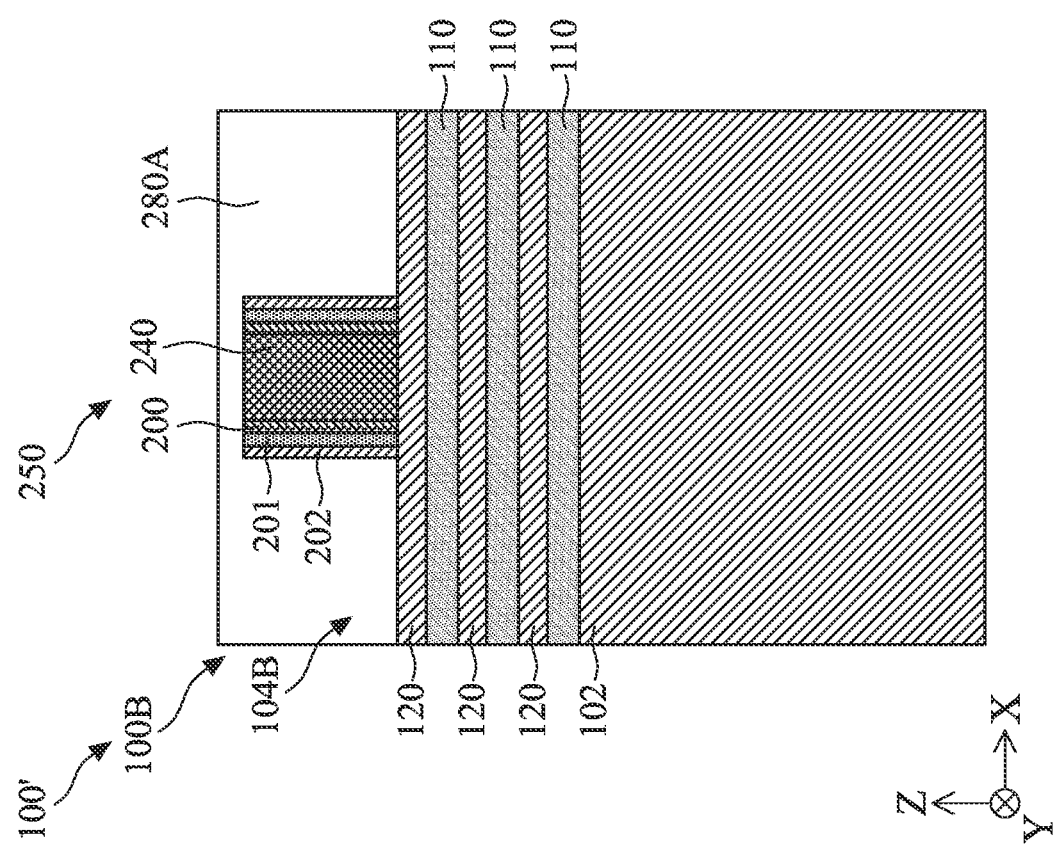
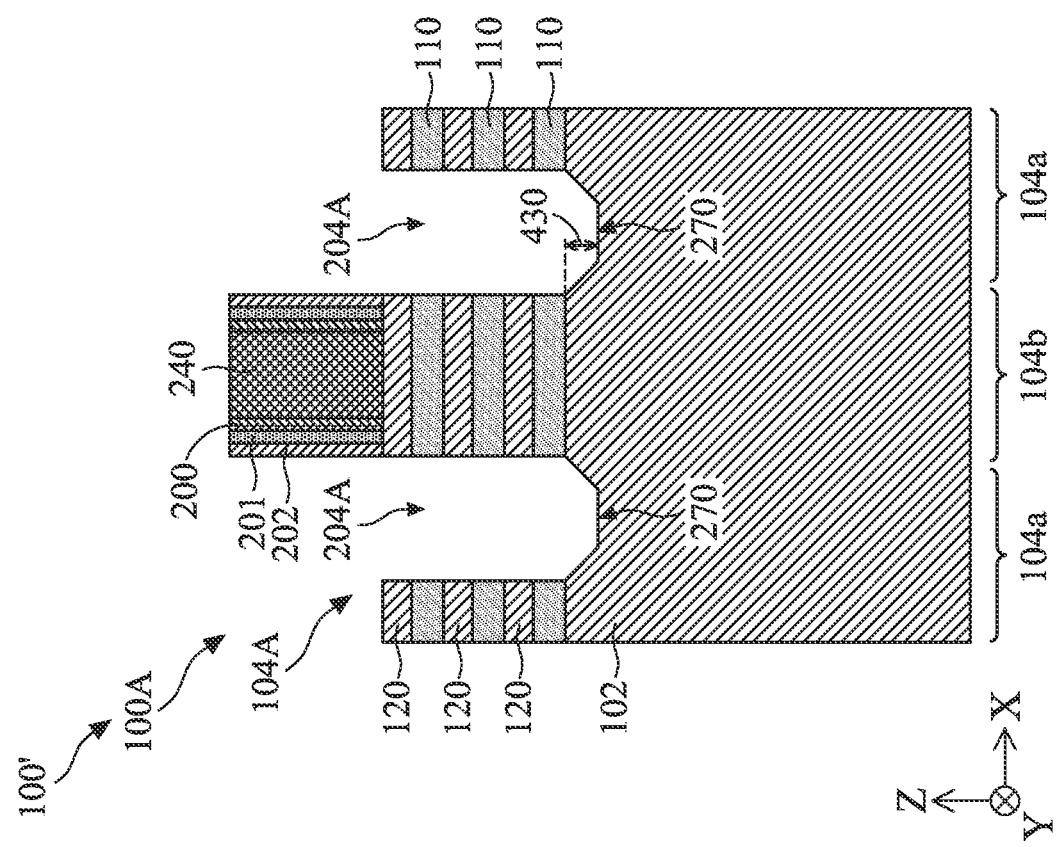
FIG. 19A
FIG. 19B

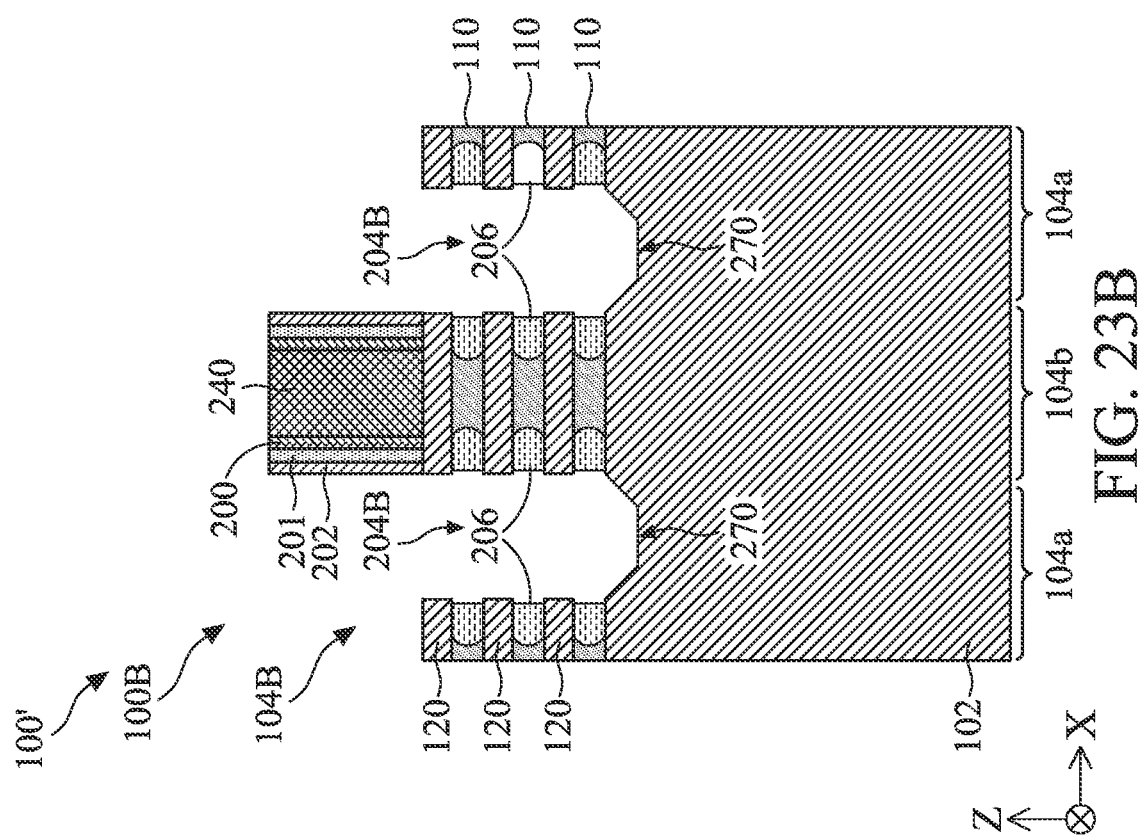
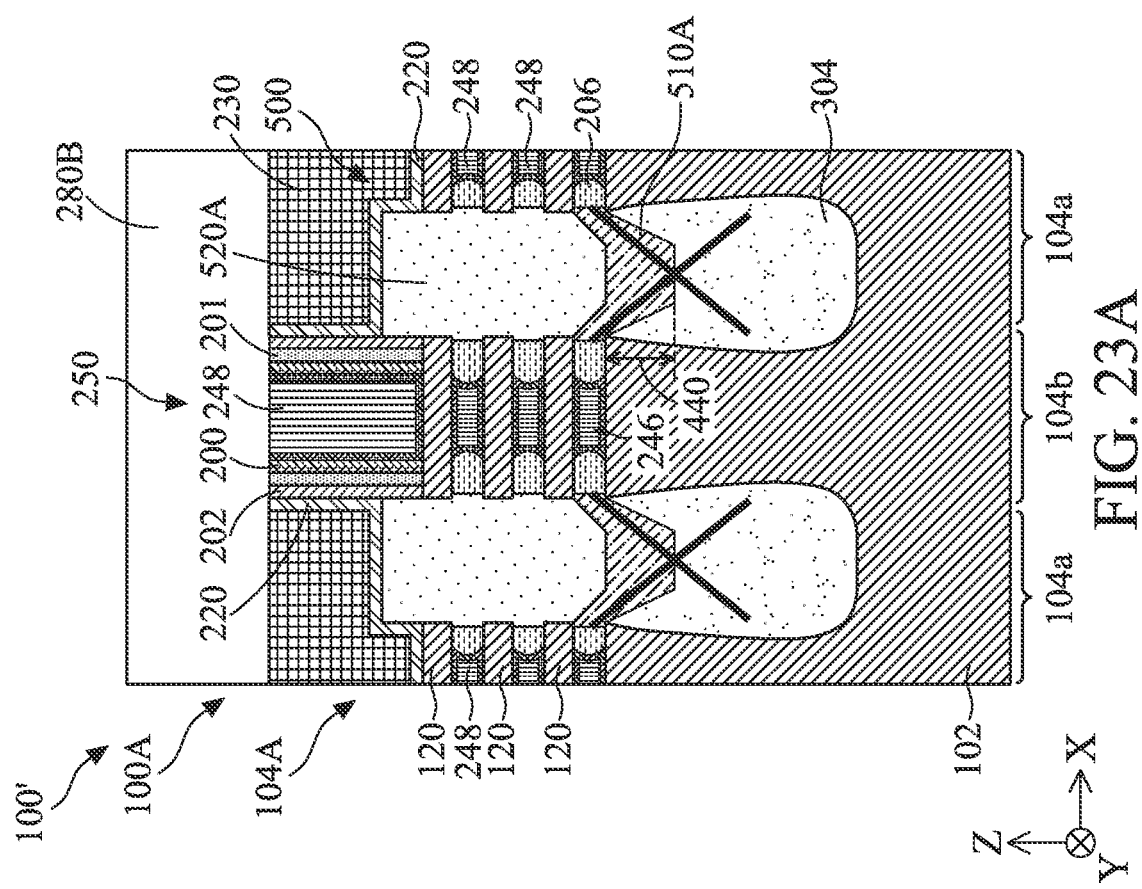
FIG. 23A
FIG. 23B

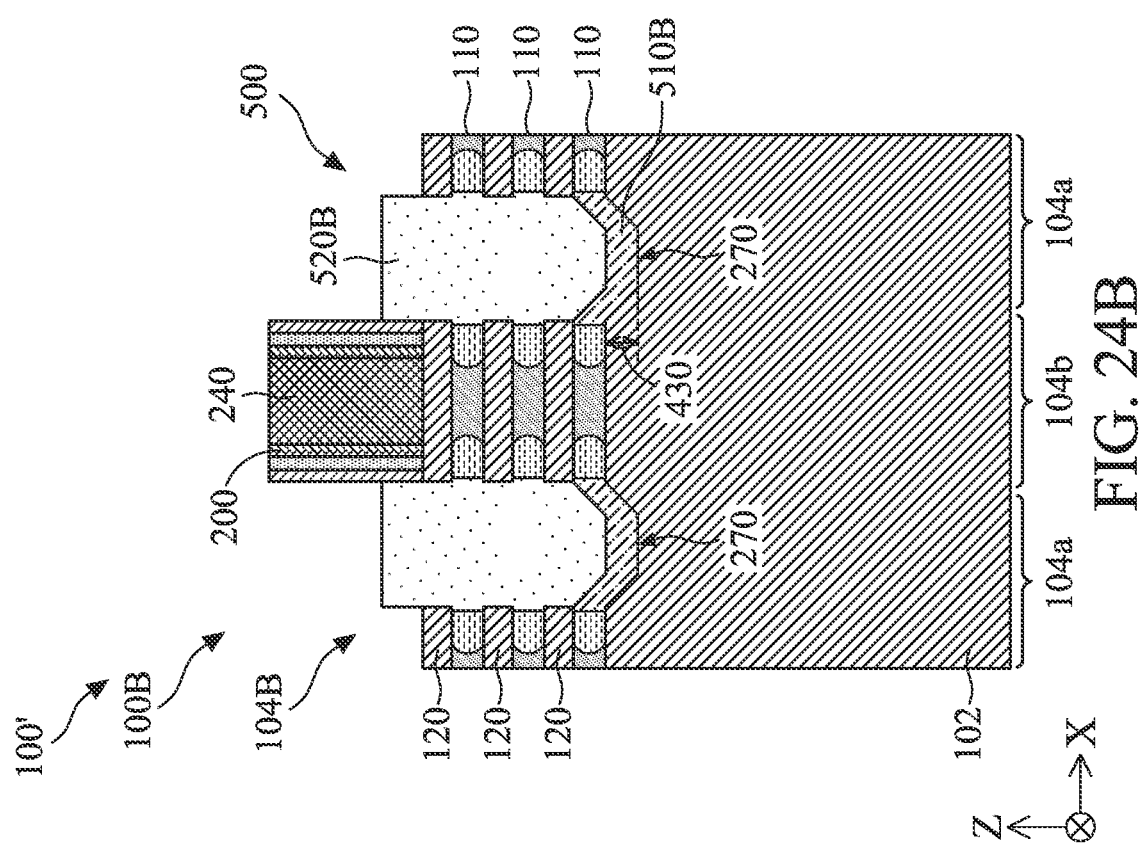
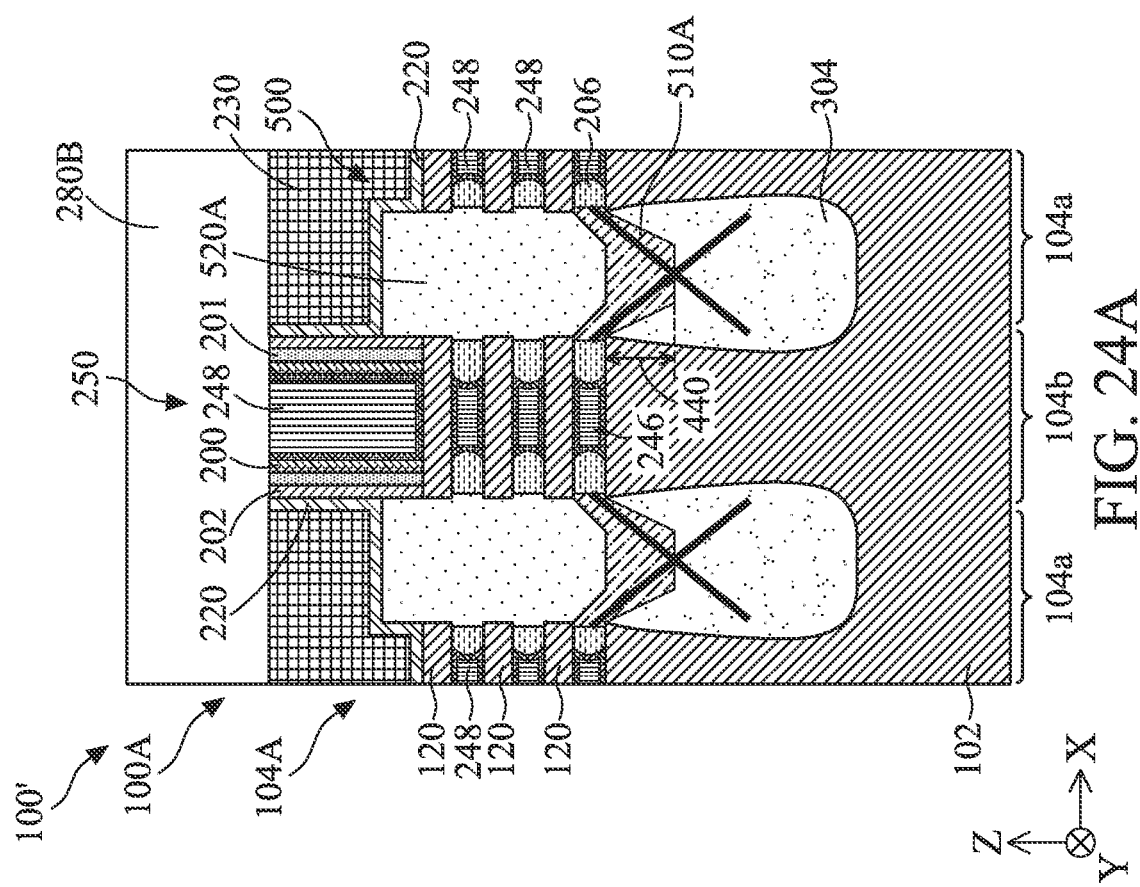

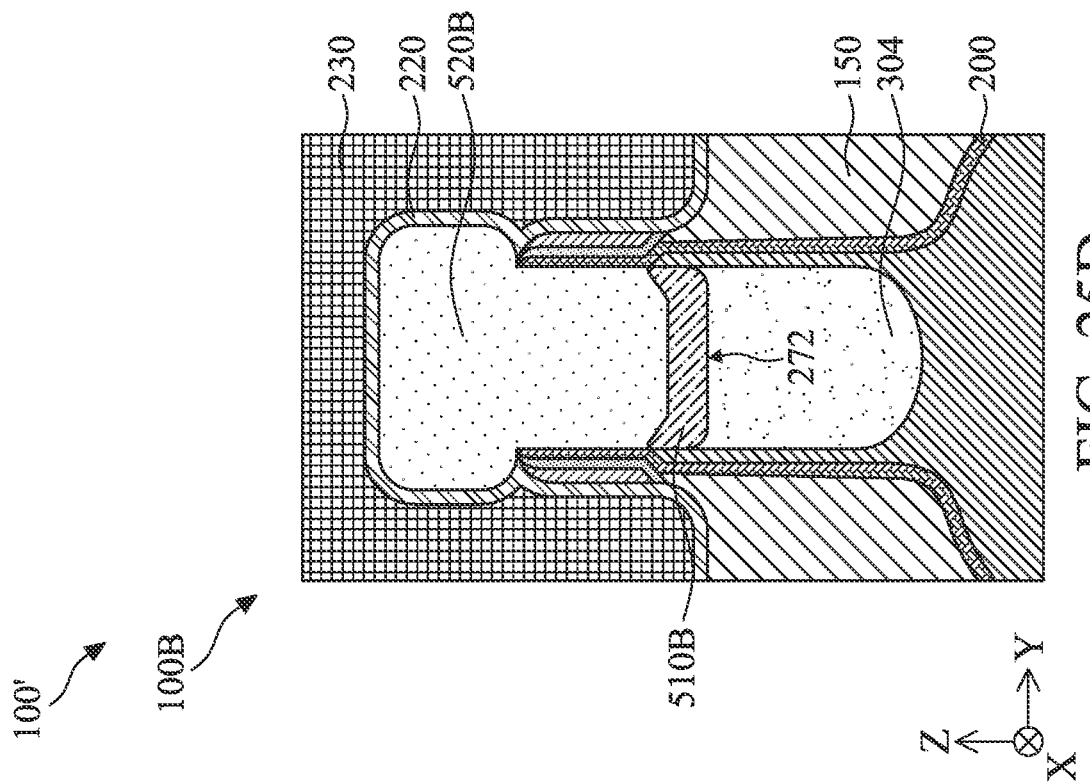
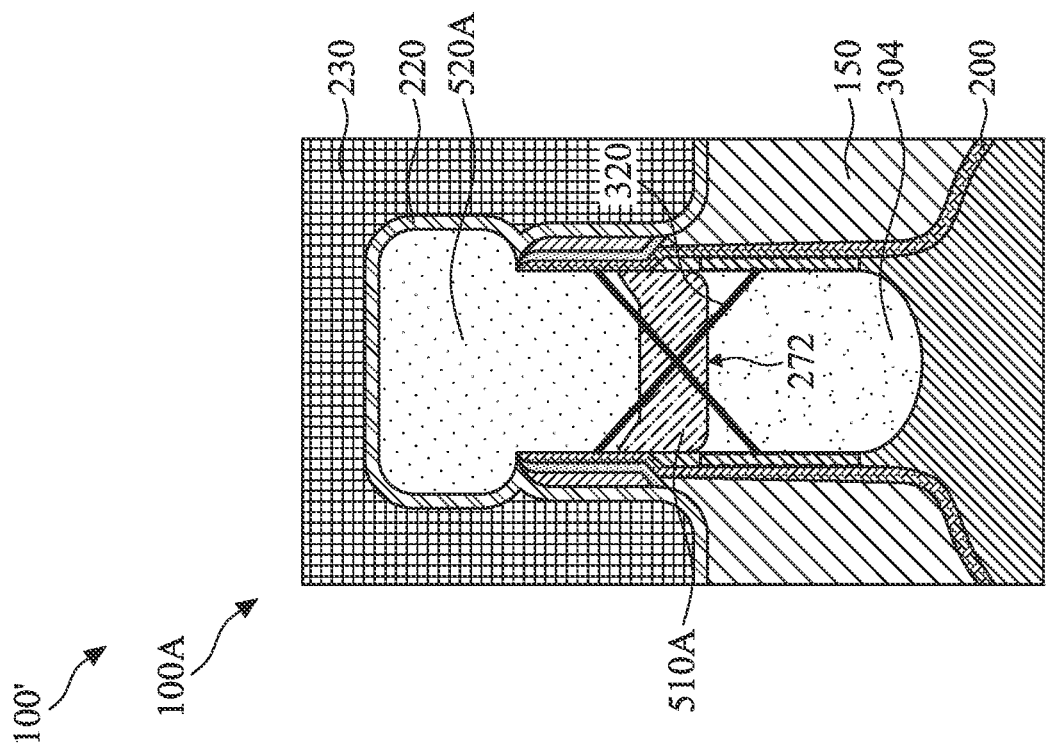

SOURCE/DRAIN FEATURES WITH IMPROVED STRAIN PROPERTIES

PRIORITY DATA

The present application is a divisional of U.S. patent application Ser. No. 17/314,815, filed May 7, 2021, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, nano-sheet-based devices have been introduced in an effort to improve gate control by increasing gate-channel coupling, reduce OFF-state current, and reduce short-channel effects (SCEs). Nano-sheet-based devices include a plurality of suspended channel layers stacked together to form the gate structure. The nano-sheet-based devices are compatible with conventional metal-oxide-semiconductor (MOS) processes, allowing them to be aggressively scaled down while maintaining gate control and mitigating SCEs. However, there remains a challenge to introduce sufficient and appropriate types of stresses into the source/drain features of nano-sheet-based devices. Therefore, although conventional nano-sheet-based devices have been generally adequate for their intended purposes, they are not satisfactory in every respect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1B is a diagrammatic cross-sectional view of an embodiment of a nano-sheet-based device of the present disclosure, along A-A' plane of FIG. 1A, fabricated according to some embodiments of the present disclosure.

FIG. 1C is a diagrammatic cross-sectional view of an embodiment of a nano-sheet-based device of the present disclosure, along B-B' plane of FIG. 1A, fabricated according to some embodiments of the present disclosure.

FIGS. 3A, 4A, 5A, 6A, 7A, 8A, 9A, 10A, 11A, 12A, 13A, 14A, 15A, 16A, and 17A are diagrammatic cross-sectional views of an embodiments of a nano-sheet-based device, along the A-A' plane of FIG. 1A, at various stages of fabrication according to an embodiment of a method of the present disclosure.

FIGS. 3B, 4B, 5B, 6B, 7B, 8B, 9B, 10B, 11B, 12B, 13B, 14B, 15B, 16B, and 17B are diagrammatic cross-sectional views of an embodiments of a nano-sheet-based device, along the B-B' plane of FIG. 1A, at various stages of fabrication according to an embodiment of a method of the present disclosure.

FIGS. 19A, 20A, 21A, 22A, 23A, 24A, and 25A are diagrammatic cross-sectional views of an NMOS component of a nano-sheet-based CMOS device of the present disclosure, along the A-A' plane of FIG. 1A, at various stages of fabrication according to an embodiment of a method of the present disclosure.

FIGS. 19B, 20B, 21B, 22B, 23B, 24B, and 25B are diagrammatic cross-sectional views of a PMOS component of a nano-sheet-based CMOS device of the present disclosure, along the A-A' plane of FIG. 1A, at various stages of fabrication according to an embodiment of a method of the present disclosure.

FIGS. 24C, and 25C are diagrammatic cross-sectional views of an NMOS component of a nano-sheet-based CMOS device of the present disclosure, along the B-B' plane of FIG. 1A, at different stages of fabrication according to an embodiment of a method of the present disclosure.

FIGS. 24D, and 25D are diagrammatic cross-sectional views of a PMOS component of a nano-sheet-based CMOS device of the present disclosure, along the B-B' plane of FIG. 1A, at different stages of fabrication according to an embodiment of a method of the present disclosure.

DETAILED DESCRIPTION

Figure 1A:
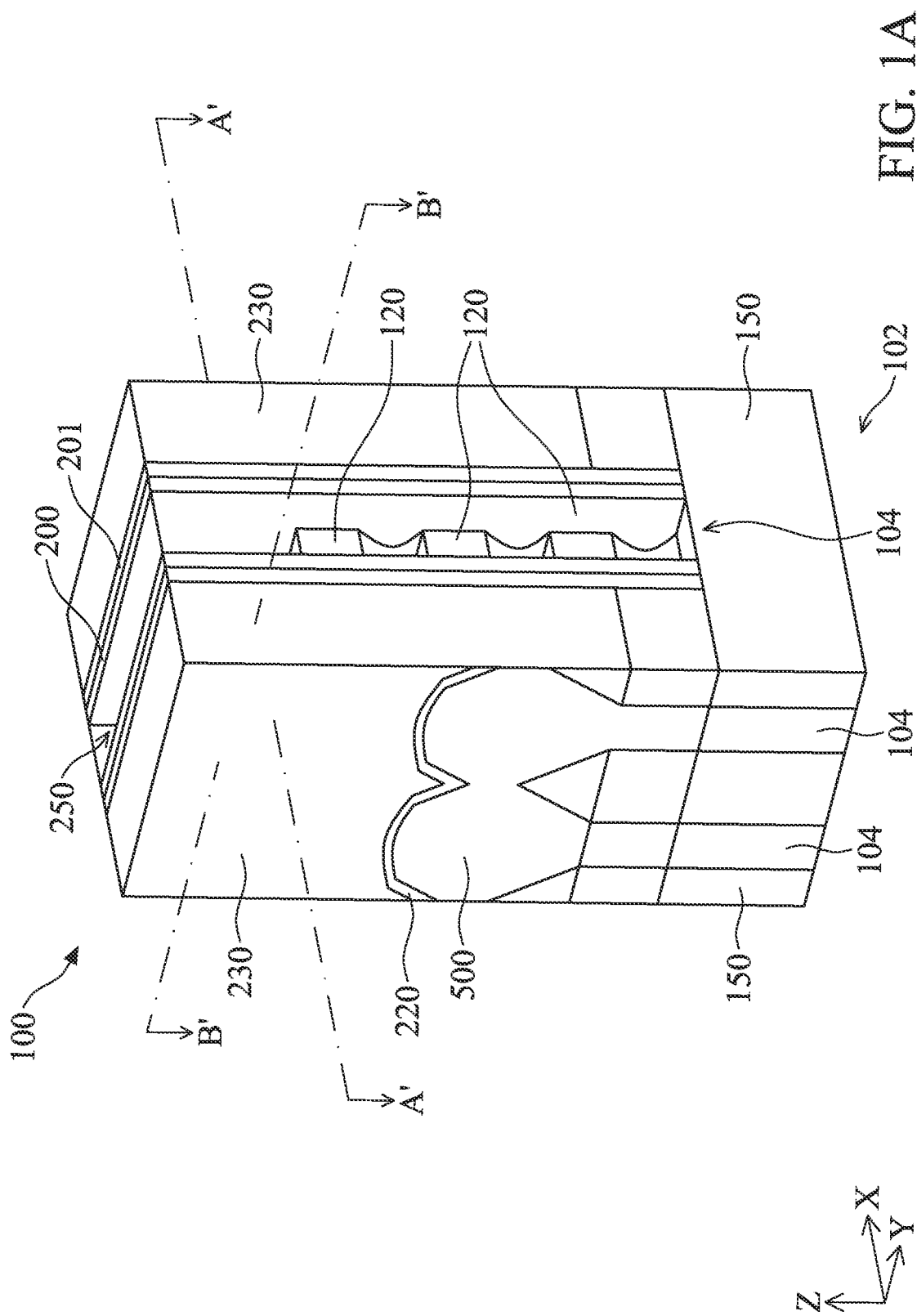
FIG. 1A is a three-dimensional (3D) perspective view of an embodiment of a nano-sheet-based device of the present disclosure, fabricated according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to ICs and semiconductor devices and methods of forming the same. More particularly, the present disclosure is related to vertically-stacked horizontally-oriented multi-channel transistors, such as nanowire transistors and nanosheet transistors. These types of transistors are sometimes referred to as gate-all-around (GAA) transistors, multi-bridge-channel (MBC) transistors, or some other names. In the present disclosure, they are referred to as nano-sheet-based transistors (or interchangeably nano-sheet-based devices). A nano-sheet-based device includes a plurality of suspended channel layers stacked one on top of another and engaged by a gate structure. The channel layers of a nano-sheet-based device may include any suitable shapes and/or configurations. For example, the channel layers may be in one of many different shapes, such as wire (or nanowire), sheet (or nanosheet), bar (or nano-bar), and/or other suitable shapes. In other words, the term nano-sheet-based devices broadly encompasses devices having channel layers in nanowire, nano-bars, and any other suitable shapes. Further, the channel layers of the nano-sheet-based devices may engage with a single, contiguous gate structure, or multiple gate structures. The channel layers connect a pair of source/drain features, such that the charge carriers may flow from the source region to the drain region through the channel layers during the operation (such as when the transistors are turned on), thereby forming currents.

Generally, fast devices require the charge carriers (such as electrons and/or holes) to have a large mobility, such that they move between the source/drain features through the channel layers at large speeds. Such large mobility may be achieved by introducing strain (or stress) into the source/drain features. Stress distorts the semiconductor crystal lattice and alters the band alignment. As a result, charge transport properties are affected. For example, tensile (or biaxial, expansion) strains increase electron mobility, and therefore benefit n-type devices; while compressive strains improve hole mobility, and therefore benefit p-type devices. Accordingly, by controlling the type, magnitude, and distribution of stress in a finished device, the device performance can be improved. The present disclosure provides methods of introducing strains into the channel layers by engineering dislocations into the adjacent source/drain features. The nano-sheet based devices presented herein may be an n-type metal-oxide-semiconductor (NMOS) device, a p-type metal-oxide-semiconductor (PMOS) device, or a complementary metal-oxide-semiconductor (CMOS) device. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

An example nano-sheet-based transistor 100 (or nano-sheet-based device 100, or device 100) is illustrated in FIGS. 1A and 1B. FIG. 1A is a three-dimensional (3D) perspective view of an embodiment of device 100 that may be implemented as an NMOS device, a PMOS device, or part of a CMOS device, according to embodiments of the present disclosure. FIG. 1B is a cross-sectional view of the device 100 of FIG. 1A along the line A-A'. FIG. 1C is a cross-sectional view of the device 100 of FIG. 1A along the line B-B'. As illustrated, the device 100 includes a semiconductor substrate 102 (or substrate 102). Fin structures (or fins) 104 are formed over the substrate 102, each extending lengthwise horizontally in an X-direction and separated from each other horizontally in a Y-direction. The X-direction and the Y-direction are perpendicular to each other, and the Z-direction is orthogonal (or normal) to a horizontal XY plane defined by the X-direction and the Y-direction. The substrate 102 may have its top surface parallel to the XY plane.

The fin structures 104 each have a source region 104a and a drain region 104a disposed along the X-direction. The source region 104a and the drain region 104a are collectively referred to as the source/drain regions 104a. Epitaxial source/drain features 500 are formed in or on the source/drain regions 104a of the fin structure 104. In some embodiments, the epitaxial source/drain features 500 may merge together, for example, along the Y-direction between adjacent fin structures 104 to provide a larger lateral width than an individual epitaxial source/drain feature. The fin structures 104 each further have a channel region 104b disposed between and connecting the source/drain regions 104a. The fin structures 104 each include a stack of suspended semiconductor layers 120 (also interchangeably referred to as "semiconductor layers 120," "suspended channel layers 120," or "channel layers 120") in the channel region 104b of the fin structures 104 and the stack extends vertically (e.g. along the Z-direction) from the substrate 102. Each of the suspended semiconductor layers 120 connects a pair of epitaxial source/drain features 500. The suspended semiconductor layers 120 may each be in one of many different shapes, such as wire (or nanowire), sheet (or nanosheet), bar (or nano-bar), and/or other suitable shapes, and may be spaced away from each other. In the depicted embodiments, there are three semiconductor layers 120 in the stack. However, there may be any appropriate number of layers in the stack, such as 2 to 10 layers. The semiconductor layers 120 may each engage with a single, contiguous gate structure 250. The gate structure 250 includes gate spacers 200 and 201, as well as a metal gate stack. Note that the metal gate stack of the gate structure 250 is illustrated as a transparent feature in FIG. 1A in order to illustrate the features (such as the semiconductor layers 120) that the metal gate stacks cover. Moreover, there may be fewer or more gate spacers. FIGS. 1A-1C have been abbreviated to provide a general picture of the device 100, and do not include all details. Additional details of the fin structures 104, the epitaxial source/drain features 500, and the gate structures 250 are described in conjunction with subsequent figures.

The device 100 further includes isolation features 150 within or over the substrate 102, separating adjacent fin structures 104 from each other. The isolation features 150 may be shallow trench isolation (STI) features. In some examples, the formation of the isolation features 150 includes etching trenches into the substrate 102 between the active regions (the regions in which the fin structures are formed) and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 150. The isolation features 150 may have a multi-layer structure such as a thermal oxide liner layer over the substrate 102 and a filling layer (e.g., silicon nitride or silicon oxide) over the thermal oxide liner layer. Alternatively, the isolation features 150 may be formed using any other isolation technologies. As illustrated in FIG. 1A, the fin structure 104 is located above the top surface of the isolation features 150. In the depicted embodiment, the device 100 further includes contact etch stop layers 220 over the epitaxial source/drain features 500; and interlayer dielectric (ILD) layer 230 over the epitaxial source/drain features 500 and over the contact etch stop layers 220.

Figure 2A:
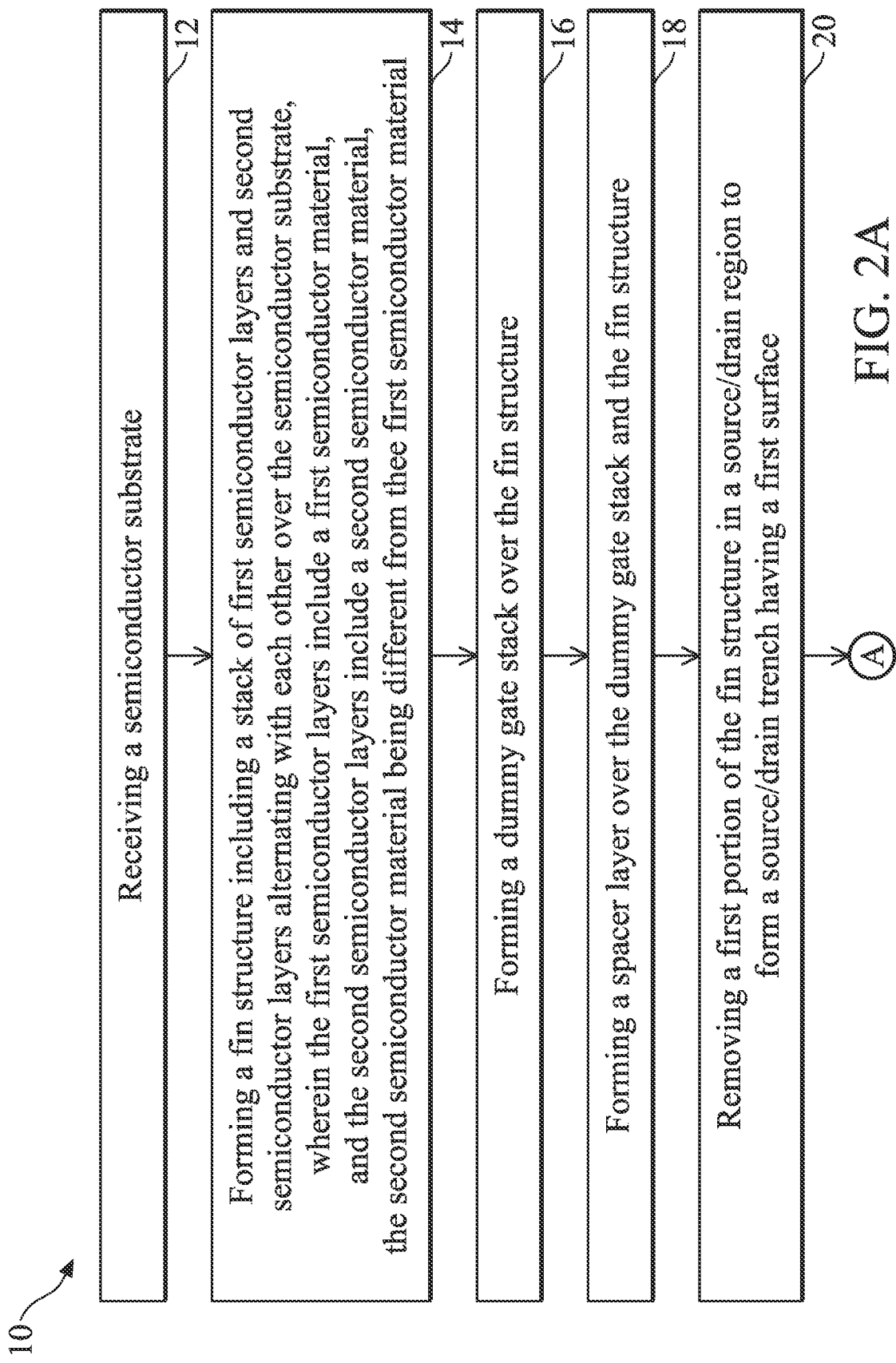
FIGS. 2A, 2B, and 2C are flowcharts illustrating a method of forming an embodiment of a nano-sheet-based device of the present disclosure according to various aspects of the present disclosure.
Figure 2B:
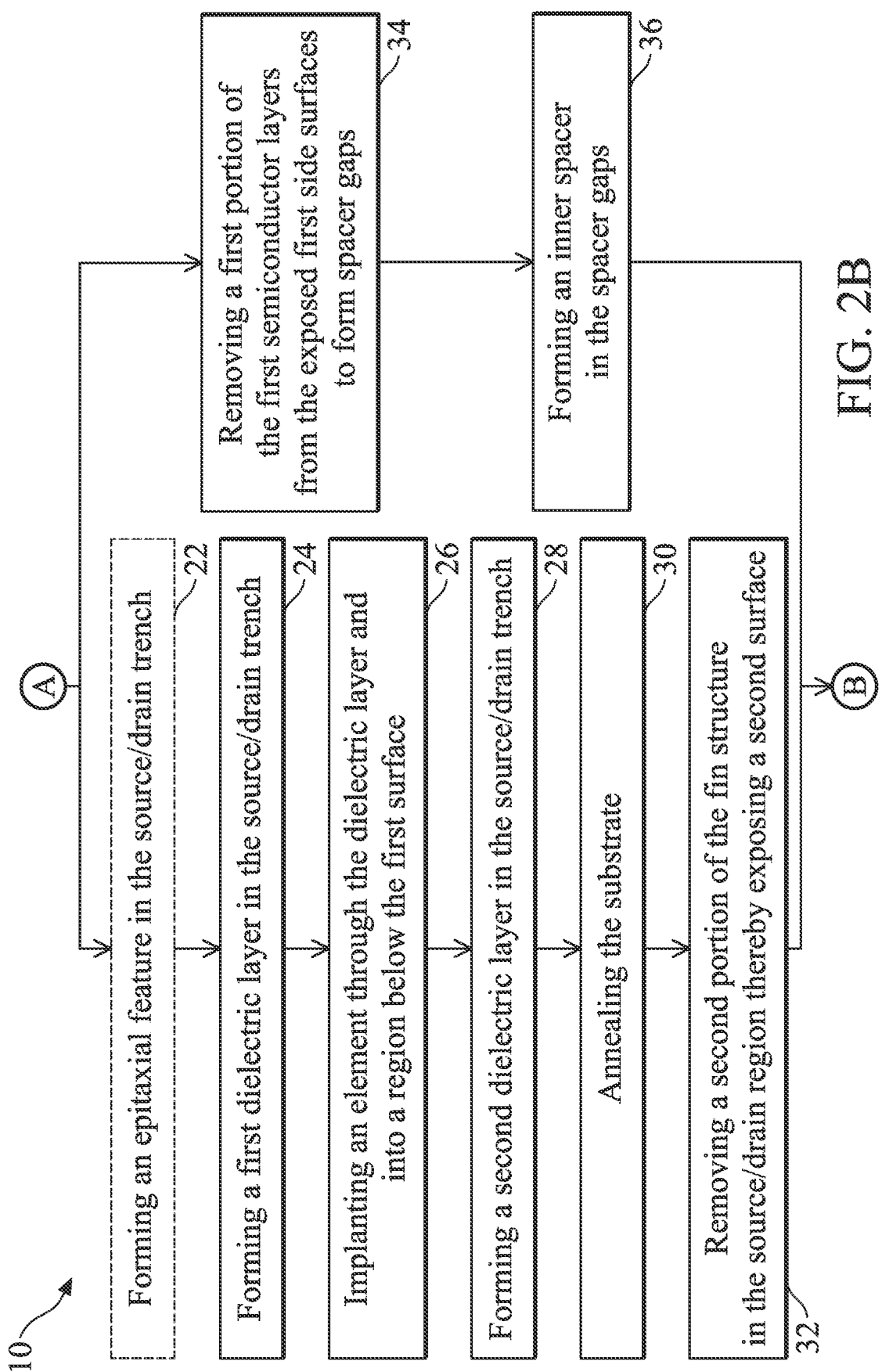
Figure 2C:
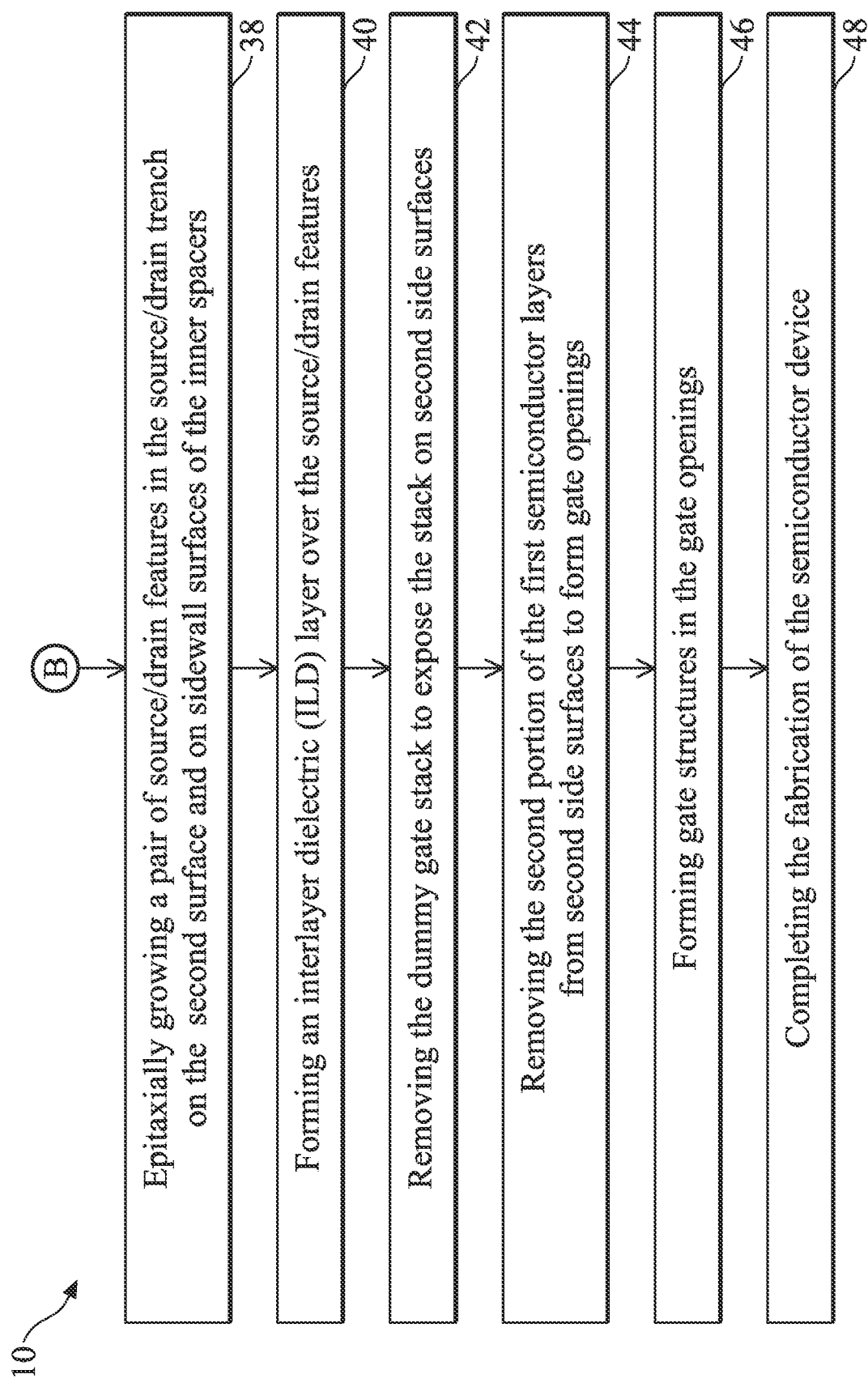

FIGS. 2A-2C are flow charts illustrating an example method 10 for fabricating a device 100 of the present disclosure according to some embodiments of the present disclosure. FIGS. 3A-17A are cross-sectional views of the device 100 along the A-A' plane of FIG. 1A constructed at various fabrication stages according to embodiments of the method 10. FIGS. 3B-17B are cross-sectional views of the device 100 along the B-B' plane of FIG. 1A constructed at various fabrication stages according to embodiments of the method 10.

Referring to block 12 of FIG. 2A and FIGS. 3A, 3B, an initial structure for the device 100 includes a substrate 102. In the depicted embodiments, the substrate 102 contains silicon (Si). The substrate 102 may alternatively or additionally includes another semiconductor material, such as germanium (Ge), silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 102 may also include a semiconductor-on-insulator substrate, such as Si-on-insulator (SOI), SiGe-on-insulator (SGOI), Ge-on-insulator (GOI) substrates. Descriptions below with respect to FIGS. 3A-17A and 3B-17B illustrate use the fabrication of an NMOS device 100 as an example. The same of similar methods may be implemented for other devices, such as CMOS devices, as described later.

Referring to block 14 of FIG. 2A and FIGS. 3A, 3B, a stack of semiconductor layers are formed over the substrate 102. The stack of semiconductor layers include semiconductor layers 110 and semiconductor layers 120 alternating with each other. For example, a semiconductor layer 110 is formed over the substrate 102; a semiconductor layer 120 is formed over the semiconductor layer 110; and another semiconductor layer 110 is formed over the semiconductor layer 120, so on and so forth. The material compositions of the semiconductor layers 110 and 120 are configured such that they have an etching selectivity in a subsequent etching process. In the depicted embodiments, the semiconductor layers 110 contain silicon germanium (SiGe), while the semiconductor layers 120 contain silicon (Si). In some other embodiments, the semiconductor layers 120 contain SiGe, while the semiconductor layers 110 contain Si. In yet some other embodiments, the semiconductor layers 120 and 110 both contain SiGe, but have different Ge atomic concentrations. The semiconductor layers 110 may each have a same or different thickness from each other, and from thickness(es) of the semiconductor layers 120.

In some embodiments, the semiconductor layers 110 may have a thickness 480 along the Z-direction; and the semiconductor layers 120 may have a thickness 482 along the Z-direction. For example, thicknesses 480 and 482 may each be about 1 nm to about 10 nm. As described later, the semiconductor layers 120 are subsequently processed into the channel layers 120. Accordingly, the thicknesses 482 may be configured based on the target dimensions of the channel layers 120. For example, thickness 482 may be about 1 nm to about 10 nm. If the thickness 482 is too small, such as less than 1 nm, the resistance within the channel layer 120 may be too high to achieve optimal device speeds. Moreover, the cost associated with reliably fabricating such thin layers may be too high to justify its benefit. Conversely, if the thickness is too large, such as larger than 10 nm, the additional thickness brings negligible benefit to the resistance yet impedes the overall goal of downsizing. Meanwhile, the semiconductor layers 110 are subsequently replaced with gate portions. Accordingly, the thickness 480 are configured based on the target thicknesses for the gate portions between the adjacent channel layers 120. For example, thickness 480 may be about 1 nm to about 10 nm. If the thickness 480 is too small, such as less than 1 nm, the gate control of the channel regions may be less than optimal; if the thickness 480 is too large, such as larger than 10 nm, the additional thickness brings negligible benefit to the gate control yet impedes with the overall goal of downsizing. The stack of semiconductor layers may include a suitable number of semiconductor layers, such as two to ten pairs of semiconductor layers 110 and semiconductor layer 120. If the number of semiconductor layers are too small, such as less than 2, the benefits associated with the nano-sheet-based configuration, such as the improved gate control and reduced OFF-state current, are lost. If the number of semiconductor layers are too large, such as greater than 10, the beneficial effect associated with the multiple channel layers may have been saturated, and cannot justify the additional cost associated with additional processing of the larger number of layers. The stack of semiconductor layers may have a total thickness 484. In some embodiments, the total thickness 484 may be about 10 nm to about 100 nm. In some embodiments, the total thickness 484 may be about 30 nm to about 60 nm in order to achieve an optimal balance between the various factors discussed above.

The stack of semiconductor layers are patterned into a plurality of fin structures 104 such that they each extend along the X-direction. The fin structures 104 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The fin structures 104 may have lateral widths 486 along the Y-direction that are the same between each other or different from each other. In some embodiments, the lateral widths 486 may be about 5 nm to about 60 nm. As described later, the methods of the present disclosure may be particularly suitable for devices that have relatively large lateral widths 486. For example, in some embodiments, the lateral widths 486 may be about 10 nm to about 30 nm. Moreover, the fin structures 104 may have a height dimension along the Z-direction. In some embodiments, the etching operations used to pattern the fin structures 104 also etch into the substrate 102. The trenches formed therefrom is filled with the isolation feature 150. Accordingly, the fin structures 104 have a height that exceed the height of the stack of semiconductor layers, and have a portion below a top surface of the substrate 102. In other words, the fin structures 104 may include a stack portion and a substrate portion. In some embodiments, a spacer layer 200 is formed to cover the fin structures 104.

Figure 4B:
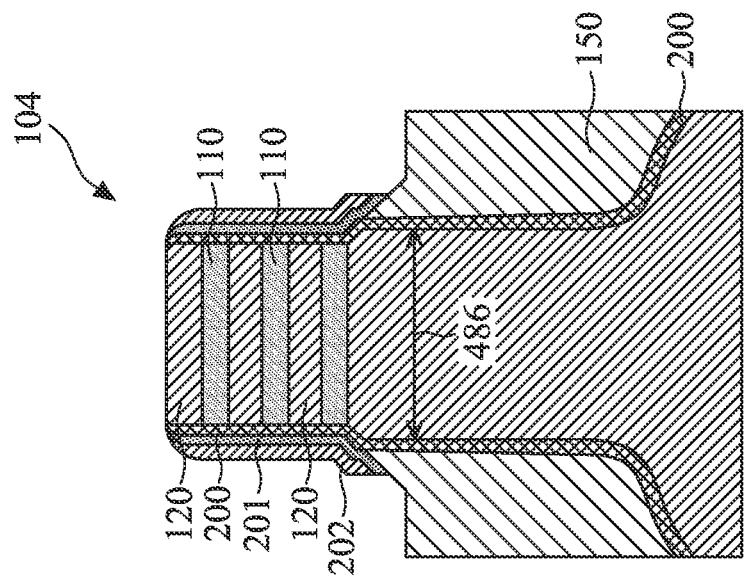
Figure 4A:
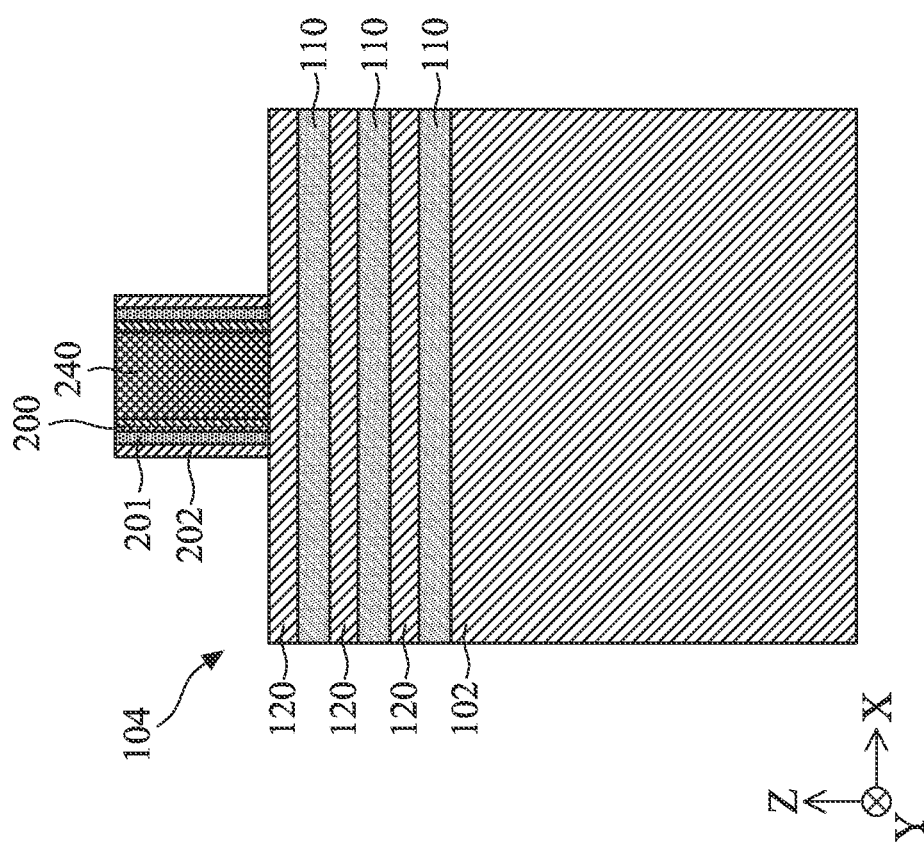

Referring to block 16 of FIG. 2A and FIGS. 4A, 4B, gate structures 250 are formed over a portion of each of the fin structures 104. In some embodiments, the gate structures 250 are also formed over the isolation features 150 in between adjacent fin structures 104. The gate structures 250 may be configured to extend lengthwise parallel to each other, for example, each along the Y-direction. In some embodiments, the gate structures 250 each wrap around the top surface and side surfaces of each of the fin structures 104. The gate structures 250 may include a dummy gate stack 240. The dummy gate stack 240 includes a dummy gate dielectric layer, a dummy electrode layer, as well as one or more hard mask layers (not shown) used to pattern the dummy gate electrode layer. In some embodiments, the dummy gate electrode layer includes polysilicon. The dummy gate stacks 240 may undergo a gate replacement process through subsequent processing to form metal gates, such as a high-k metal gate, as discussed in greater detail below. The dummy gate stacks 240 may be formed by a procedure including deposition, lithography, patterning, and etching processes. The deposition processes may include CVD, ALD, PVD, other suitable methods, or combinations thereof.

Referring to block 18 of FIG. 2A and FIGS. 4A, 4B, gate spacers are formed on the sidewalls of the dummy gate stacks 240. Gate spacers may include a single layer or a multi-layer structure. For example, in the depicted embodiment, a gate spacer layer 201 is formed over the top surface of the device, and a gate spacer layer 202 is formed over the gate spacer layer 201. The gate spacer layers 201 and 202 may each include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. In some embodiments, the gate spacer layers 201 and 202 may collectively has a thickness in the range of a few nanometers (nm). In some embodiments, the gate spacer layers 201 and 202 may be formed by depositing a spacer layer (containing the dielectric material) over the dummy gate stacks 240, followed by an anisotropic etching process to remove portions of the spacer layer 201 and 202 from the top surfaces of the dummy gate stacks 240. The anisotropic etching process also removes the spacer layer 200 from the top surfaces of the dummy gate stacks 240. After the etching process, portions of the spacer layer on the sidewall surfaces of the dummy gate stacks 240 substantially remain and become the gate spacers 201 and 202. In some embodiments, the anisotropic etching process is a dry (e.g. plasma) etching process. Additionally or alternatively, the formation of the gate spacer layers 201 and 202 may also involve chemical oxidation, thermal oxidation, ALD, CVD, and/or other suitable methods.

Figure 5A:
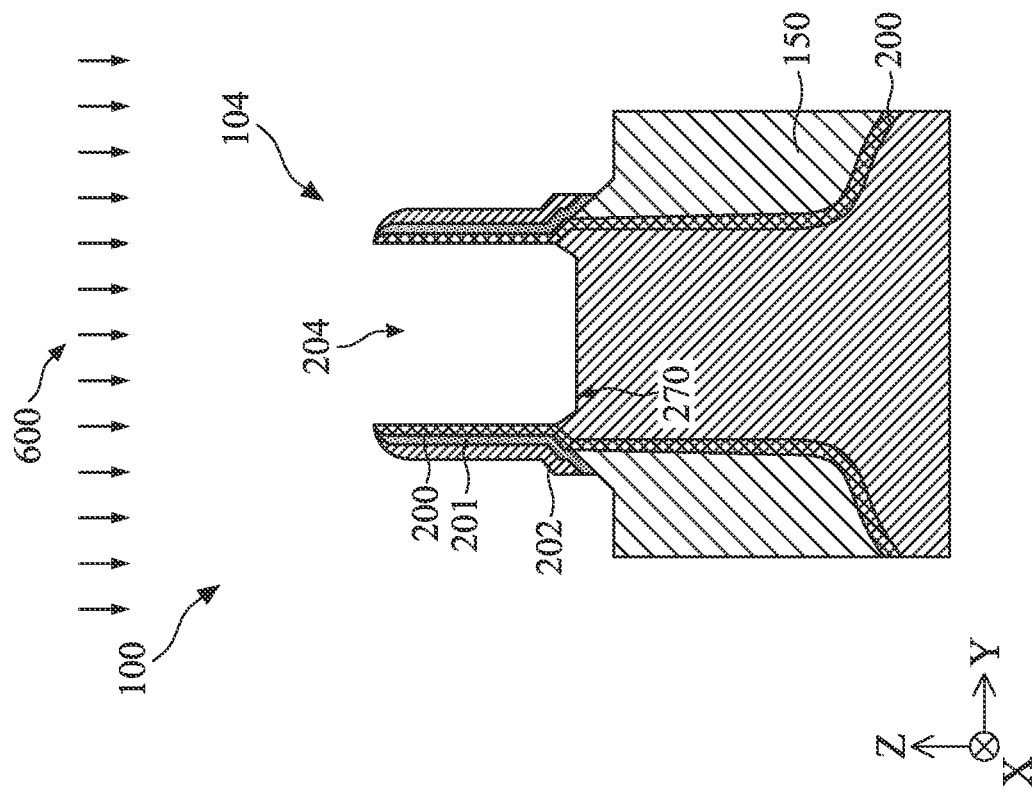
Figure 5B:
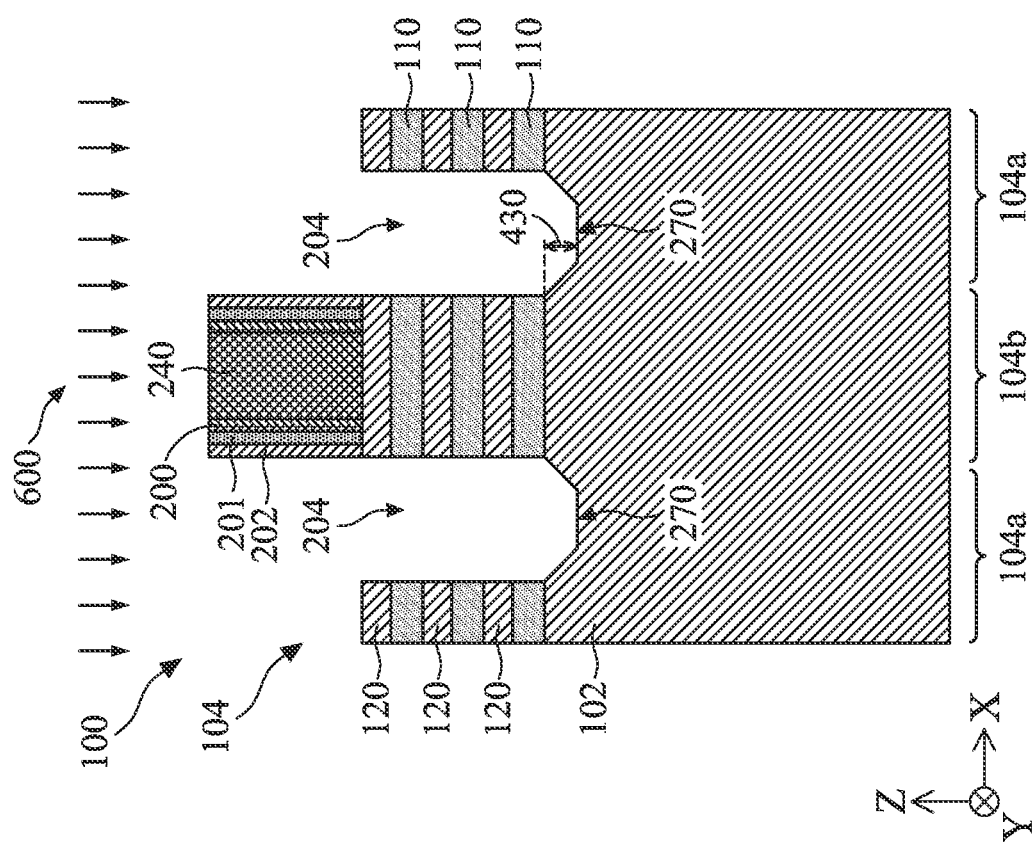

Referring to block 20 of FIG. 2A and FIGS. 5A and 5B, portions of the fin structure 104 adjacent to and exposed (i.e. not covered) by the gate structures 250 (e.g. in the source/drain regions 104a) are at least partially recessed (or etched away) by process 600 to form the source/drain trenches 204.

Meanwhile, the portions of the fin structure 104 underneath the gate structures 250 remain intact. Additional mask elements (such as photoresists) may also be employed to protect areas not designed to be removed during the process 600. In the depicted embodiment, the process 600 removes not only the exposed portions of fin structure 104, but also a portion of the underlying substrate 102. Accordingly, the bottom surface 270 of the source/drain trenches 204 extends below the top surface of the substrate 102. For example, a distance between the bottom surface 270 of the source/drain trenches 204 and the top surface of the substrate 102 may be distance 430 along the Z-direction. In some embodiments, having the source/drain trenches 204 extending into the substrate provides the benefit of forming deep source/drain features that fully utilize the lowest channel layer 120. In some embodiments, the distance 430 may be less than about 30 nm. The process 600 may include multiple lithography and etching steps, and may use any suitable methods, such as dry etching and/or wet etching. In other embodiments, the source/drain trenches 204 may have a bottom surface 270 that extends along or above the top surface of the substrate 102, depending on design requirements. This configuration may have the benefit of reduced OFF-state current, because source/drain features are not formed on both sides of the subchannel region (e.g. the region below the lowest channel layer) where gate control is the weakest.

Referring to block 22 of FIG. 2A and FIGS. 6A and 6B, an optional epitaxial process is performed to form an epitaxial layer 505 in the source/drain trenches 204 and on the bottom surfaces 270. In some embodiments, the epitaxial layer 505 has a thickness 435 configured to tune the height of the starting point for subsequent epitaxial growth. The epitaxial layer 505 may include any suitable materials (such as Si, Ge, etc.) and be formed using any suitable methods. In subsequently depicted embodiments, the epitaxial layer 505 is omitted.

Figure 7B:
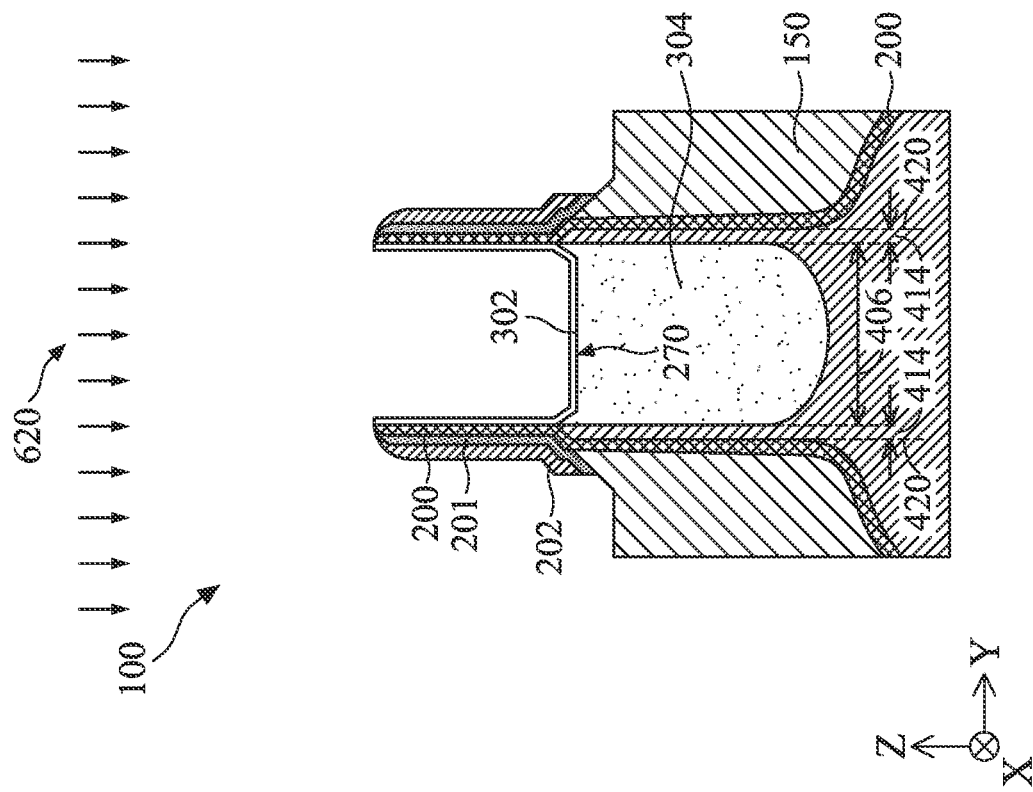
Figure 7A:
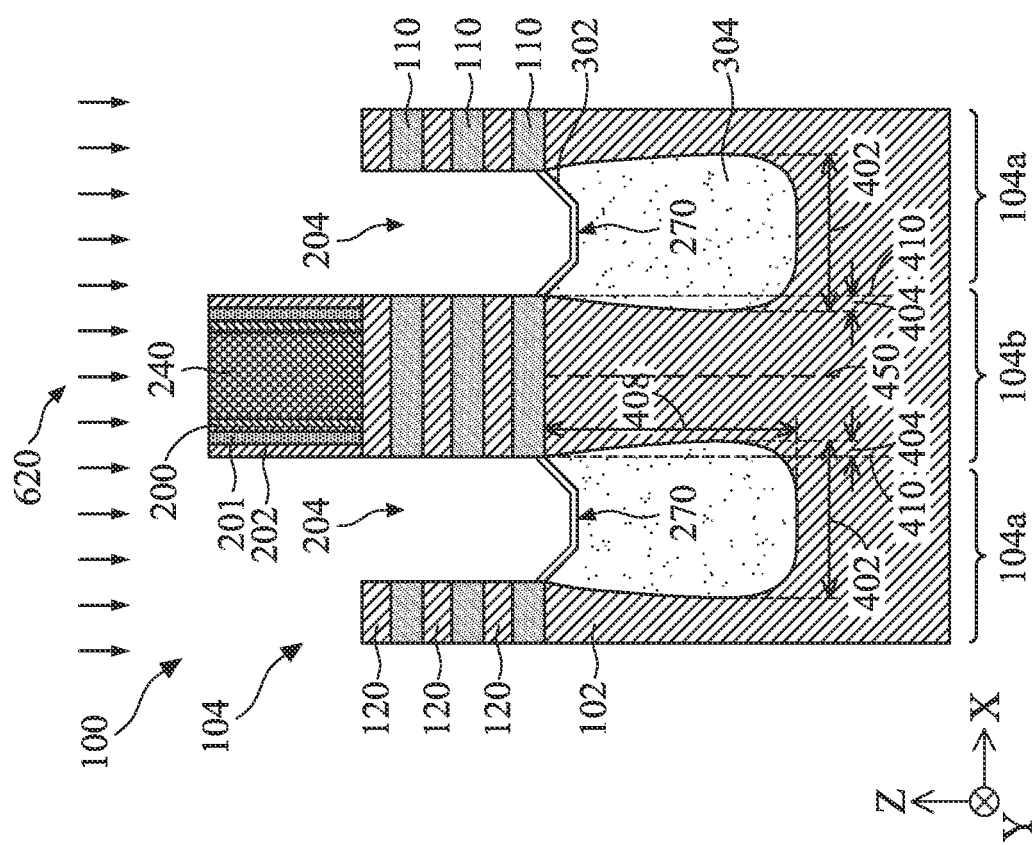

Referring to block 24 of FIG. 2B and FIGS. 7A and 7B, a dielectric layer 302 is formed to cover the bottom surface 270 of the source/drain trenches 204. In some embodiments, the dielectric layer 302 assists in the retaining (or "memorization") of the stresses created during a subsequent implanting process. Accordingly, the dielectric layer 302 may be interchangeably referred to as a stress film, a stress layer, or a stress memorization technique (SMT) layer. The dielectric layer 302 may include any suitable materials, such as silicon nitride, silicon oxide, silicon oxynitride, other suitable materials, or combinations thereof. The dielectric layer 302 may be formed by chemical vapor deposition (CVD), physical vapor deposition (PVD), atomic layer deposition (ALD), high density plasma CVD (HDPCVD), plating, other suitable methods, and/or combinations thereof. In some embodiments, the dielectric layer 302 has a thickness of about 1 nm to about 5 nm. If the thickness is too small, such as smaller than 1 nm, the dielectric layer 302 may not sufficiently retain the stresses provided by the subsequent implanting process. If the thickness is too large, such as larger than 5 nm, the additional thickness does not provide benefits that justify its cost. In some embodiments, the dielectric layer 302 is not used.

Still referring to block 26 of FIG. 2B and FIGS. 7A and 7B, a pre-amorphous implantation (PAI) process 620 is performed on the device 100. The PAI process 620 implants an implant species into the substrate 102 through the dielectric layer 302, damaging the lattice structure of the substrate 102, and thereby forming an amorphized region 304 in the region below the dielectric layer 302. Therefore, the amorphized region 304 include amorphous semiconductor material (such as amorphous silicon) in conjunction with damaged crystal lattice structures (such as damaged silicon crystal lattice structures). As depicted, the PAI process 620 forms the amorphized region 304 in the source/drain region 104a of the fin structures 104, such as the substrate portion of the fin structures 104. In the depicted embodiments, the bottom surface 270 of the source/drain trenches 204 are also the top surfaces of the amorphized regions 304, and may be hereinafter interchangeably referred to as the top surfaces 270 of the amorphized region 304. The top surfaces 270 includes both amorphous semiconductor material (such as Si) and damaged crystal lattice of the semiconductor material (such as crystalline Si). In some embodiments, the PAI process 620 implants the substrate 102 with Ge. Accordingly, in the depicted embodiments having Si in the substrate 102, the PAI process 620 introduces Ge as an impurity into the substrate 102 or the fin structure 104. Alternatively, the PAI process 620 could utilize other implant species, such as argon (Ar), xenon (Xe), boron fluoride (BF2), arsenic (As), indium (In), other suitable implant species, or combinations thereof. In other embodiments, the PAI process may implant Si into the Si substrate. Accordingly, the PAI process does not introduce impurities.

A patterned photoresist layer may be utilized to define where the amorphized region 304 is formed and protect other regions of the semiconductor device 100 from implantation damages. For example, the patterned photoresist layer exposes the source/drain regions, such that the source/drain regions are exposed to the PAI process 620 (forming amorphized region 304) while the dummy gate stacks 240 (and other portions of the device 100) are protected from the PAI process 620. Alternatively, a patterned hard mask layer, such as a SiN or SiON layer, is utilized to define the amorphized region. The patterned photoresist layer or the patterned hard mask layer may be part of the current manufacturing process (e.g., LDD or source/drain formation), thereby minimizing cost as no additional photoresist layer or hard mask is required for the PAI process 620.

The amorphized region 304 is formed according to design specifications. In some embodiments, the amorphized region 304 has a width 402 along the X-direction, a width 406 along the Y-direction, and a depth 408 along the Z-direction. The implantation energy causes the implanted species to vertically enter the substrate 102 and cause vertical amorphization. The amorphized depth 408 may be adjusted based on design specifications by tuning the implantation energy, implanted species, and/or the implantation dosages. In the present embodiment, the PAI process 620 implants Ge at an implant energy from about 5 KeV to about 60 KeV, and a dosage ranging from about $1 \times 10^{14}$ atoms/cm$^2$ to about $4 \times 10^{15}$ atoms/cm$^2$, depending on the implantation temperature. As described in detail later, the implantation process produces sources for dislocations and stresses. If the implant energy is too small, such as less than about 20 KeV, or if the dosage is too small, such as less than about $1 \times 10^{14}$ atoms/cm$^2$, there may be insufficient stresses formed and/or the formed stressed region may be too shallow. Conversely, as described later, the implantation process also damages the surface of the device 100 from which epitaxial features will subsequently form. If the implant energy is too large, such as larger than about 60 KeV, or if the dosage is too large, such as larger than about $2 \times 10^{14}$ atoms/cm$^2$, the damages caused may be too large to be later rectified, such that subsequently formed source/drain features may not have the optimal quality. In some embodiments, the implantation temperature is less than about 1000° C. Lower implantation temperature will enhance implant amorphization efficiency.

In some embodiments, the amorphized depth 408 is in a range about 10 to about 150 nanometers. In some embodiments, the amorphized depth 408 is less than about 100 nanometers.

The implanted species may further be scattered laterally to cause lateral amorphization, which results in amorphized region 304 extending to regions underneath the gate spacers 201 and 202. As depicted in FIGS. 7A and 7B, the amorphized region 304 extends beyond the edges of the source/drain trenches 204 along the X-direction. For example, a distance along the X direction between the edge 410 of the source/drain trenches 204 and the edges of the amorphized region 304 is distance 404. In some embodiments, the distance 404 is less than the distance between the edges of the source/drain trenches 204 and the middle line 450 of the dummy gate stack 240. Accordingly, the amorphized region 304 does not extend beyond the center line 450. Alternatively (not illustrated), the amorphized region 304 may extend within the edges of the source/drain trenches 204 along the X-direction. In such embodiments, the distance 404 is designated to have a negative value. In some embodiments, the distance 404 is about −10 nm to about +10 nm. In some embodiments, the dimension of the amorphized region 304 along the Y direction is restricted by the width of the fin structures 104. For example, the fin structures 104 have edge lines 420 that extend along the X-Z planes. A distance between the edges of the amorphized region 304 across the Y direction and the edge planes 420 of the fin structures 104 is distance 414. In some embodiments, the distance 414 is less than about 5 nm. The amorphized region 304 may be of any suitable profiles. In the depicted embodiments, the amorphized region 304 has a sidewall that has the shape of the letter "U" on the X-Z cross-section as well as on the Y-Z cross-section.

Figures 8A, 8B:
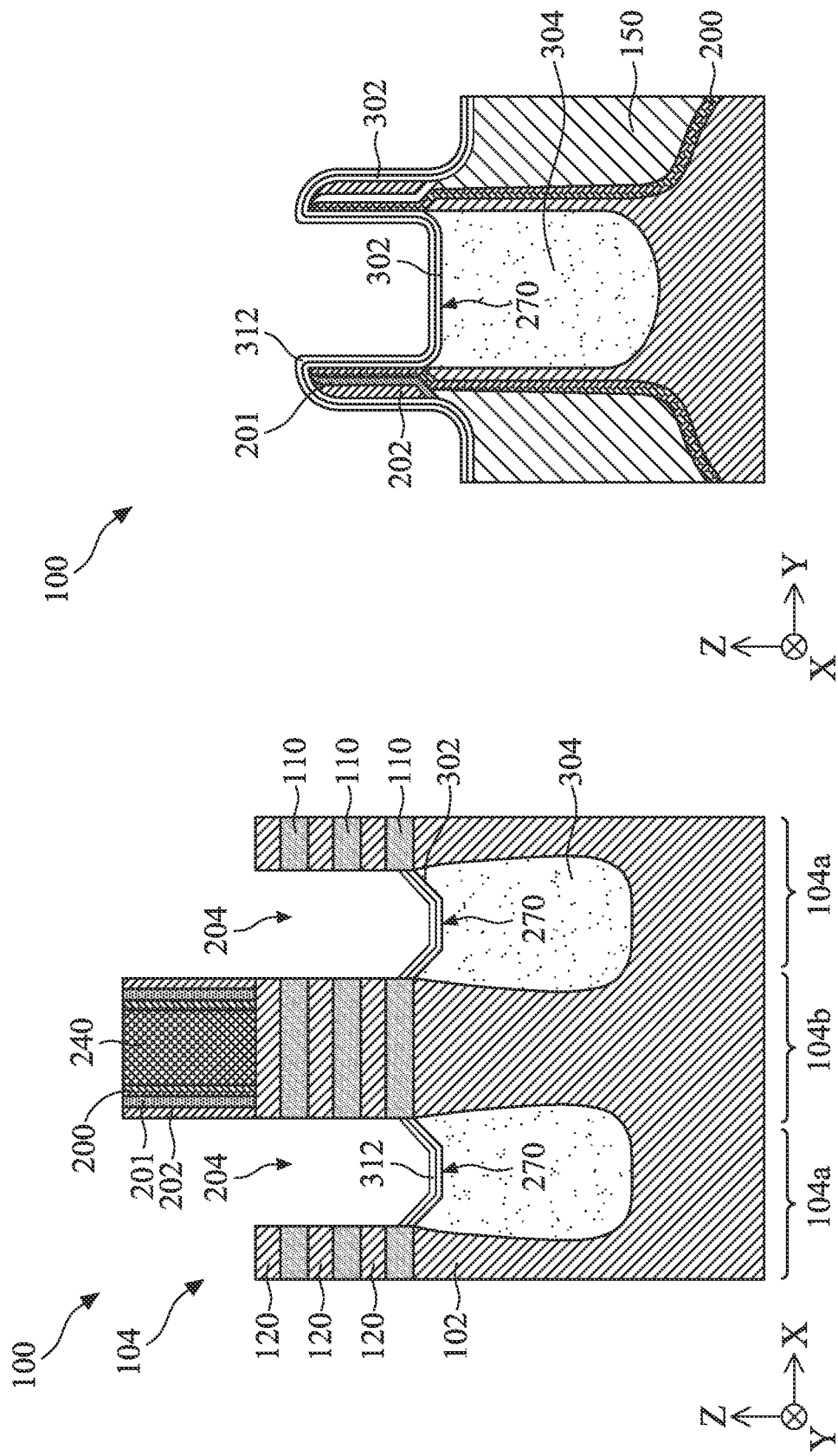

Referring to block 28 of FIG. 2B and FIGS. 8A and 8B, a dielectric layer 312 is formed over the dielectric layer 302. The dielectric layer 312 may be similar to the dielectric layer 302. For example, the dielectric layer 312 may include a dielectric material such as silicon nitride, silicon oxide, silicon oxynitride, other suitable materials, or combinations thereof. The dielectric layer 312 assists retaining stresses to be developed in the amorphized region 304 during a subsequent annealing process. In some embodiments, the dielectric layer 312 has a thickness of about 1 nm to about 5 nm. If the thickness is too small, such as smaller than 1 nm, the dielectric layer 302 may not sufficiently retain the stresses provided by the subsequent implanting process. If the thickness is too large, such as larger than 5 nm, the additional thickness does not provide benefits that justify its cost. The dielectric layer 312 may be formed by any suitable methods, such as CVD, PVD, ALD, HDPCVD, plating, other suitable methods, or combinations thereof.

Referring to block 30 of FIG. 2B and FIGS. 9A and 9B, the device 100 is subjected to an annealing process 630. The annealing process 630 is performed on the substrate 102 of the device 100. The annealing process 630 causes the amorphized region 304 to recrystallize. In other words, the amorphous portions of the amorphized region 304 is converted into crystalized portions. Meanwhile, defects within the amorphized region 304 (such as implanted species, voids, random dislocations) are reorganized to reduce entropy. As a result, fewer but longer crystal dislocations, such as dislocations 320, are developed that extend to the top surfaces. Accordingly, this annealing process 630 converts the amorphized region 304 into a stressor region 304 and stabilizes the structure for further processing. The annealing process 630 may be performed at a temperature of about 500° C. to about 1,400° C. Also, depending on the type of annealing process and the temperature utilized, the annealing process 630 may be performed for about 1 millisecond to about 5 seconds. In the present embodiment, the annealing process 630 is a rapid thermal annealing (RTA) process, utilizing a temperature in a range of about 800° C. to about 1,200° C. and is performed for a duration of about 0.5 second to about 5 seconds. In an embodiment, the annealing process 630 is a millisecond thermal annealing (MSA) process or micro-second thermal annealing (μSA) process, utilizing a temperature up to a Si melting point of about 1,400° C. and a duration in the range of milliseconds or microseconds, respectively. In some embodiments, the annealing process includes a pre-heat operation which minimizes or even eliminates end of range (EOR) defects, which are the remained defects at the amorphous/crystalline interface. In some embodiments, the parameters of the process 630 are configured to facilitate recrystallization and dislocation propagation.

In some embodiments, the dislocations 320 start formation at pinchoff points 322. In some embodiments, the pinchoff points 322 are formed in the stressor region 304 at a depth 422 of about 10 nm to about 150 nm, the depth being measured from the bottom surface of the source/drain trench 204. The pinchoff points 322 have a horizontal buffer 424 and a vertical buffer 426. In some embodiments, the depth 422 is about 10 nm to about 30 nm. The horizontal buffer 424 and the vertical buffer 426 are formed according to design specifications and are affected by the annealing process 630. In some embodiments, the pinchoff points 322 have a horizontal buffer 424 of about 5 nm to about 20 nm and a vertical buffer 426 of about 10 nm to about 40 nm. In some embodiments, the pinchoff points 322 are formed such that the pinchoff points 322 are not disposed within the channel region. In some embodiments, the dislocations extend from the pinchoff points 322. Accordingly, there are regions that do not include dislocations, which are therefore referred to as the forbidden zone, for example, forbidden zones 350.

Dislocations 320 may be developed in the <111> direction of a silicon semiconductor material. The <111> direction of silicon has an angle of about 45 to about 65 degrees, the angle being measured with respect to an axis parallel to a surface of the substrate 102. In the present embodiment, the dislocations 320 have a <111> direction with an angle of about 55 degrees, the angle being measured with respect to an axis parallel to the surface of the substrate 102. In other embodiments, where the semiconductor material is other than silicon, the dislocations 320 may develop along a different direction. The locations of the pinchoff points 322 and the lateral widths 486 of the fin structures 104 may be adjusted to increase the number of dislocations 320 that propagate to the top surfaces 270 of the stressor regions 304. As described above, the lateral width 486 of the fin structures 104 (see FIG. 3B) is about 10 nm to 30 nm. In some embodiments, the depth 422 of the pinchoff points 322 is about 10 nm to about 30 nm. Accordingly, dislocations 320 that extend in the <111> direction may reach the top surfaces 270 of the stressor regions 304. If the depths of the pinchoff points 322 are too large, such as larger than 30 nm, or if the lateral widths of the fin structures 104 are too small, such as less than 10 nm, the natural propagations of the dislocations may terminate at sidewalls of the fin structures 104 rather than being reaching the top surfaces 270. In some embodiments, a ratio of the depth 422 to the lateral widths 486 may be about 1.5 to about 2.2. Although FIGS. 9A and 9B depict six dislocations 320, more or fewer dislocations may be generated during the annealing process 630.

Referring to block 32 of FIG. 2A and FIGS. 10A and 10B, the dielectric layers 302 and 312 are removed from the top surfaces 270 of the stressor regions 304 in an etching process 640. The etching process 640 may be performed by wet etching using suitable etchants (such as phosphoric acid and/or hydrofluoric acid), or by dry etching using suitable etchant. The etching process 640 exposes the top surface 270 of the stressor regions 304. As described above, the top surface 270 of the stressor region 304 previously include amorphous materials and damaged crystal lattices caused by the implanting process 620. Portions of the amorphous materials may have been recrystallized during the annealing process 630. However, depending on the parameters of the process 620, such recrystallization may not completely convert all amorphous materials into the crystallized phase, and may include too much defects in the crystal lattices. In other words, after the removal of the dielectric layers 302 and 312, the stressor region 304 may have amorphous material and/or crystal structures with high level of defects exposed on the top surfaces 270. These materials do not function well as seeds for subsequent epitaxial growth processes, and may cause epitaxial features formed thereon to be of low quality. In some embodiments, the amount of the amorphous materials remaining as well as the defect level of the exposed crystal lattices are dependent upon the parameters of the implanting process 620. This may include, for example, implanting energy, time duration, the types of elements implanted, and other factors.

Figure 11A:
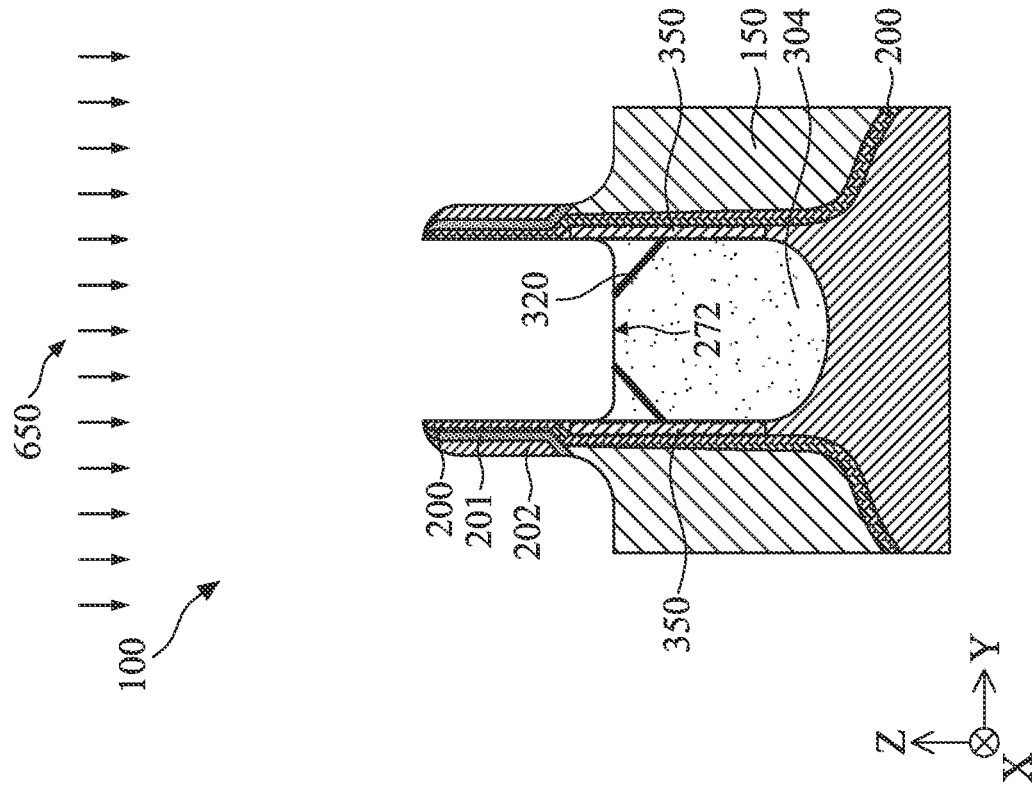
Figure 11B:
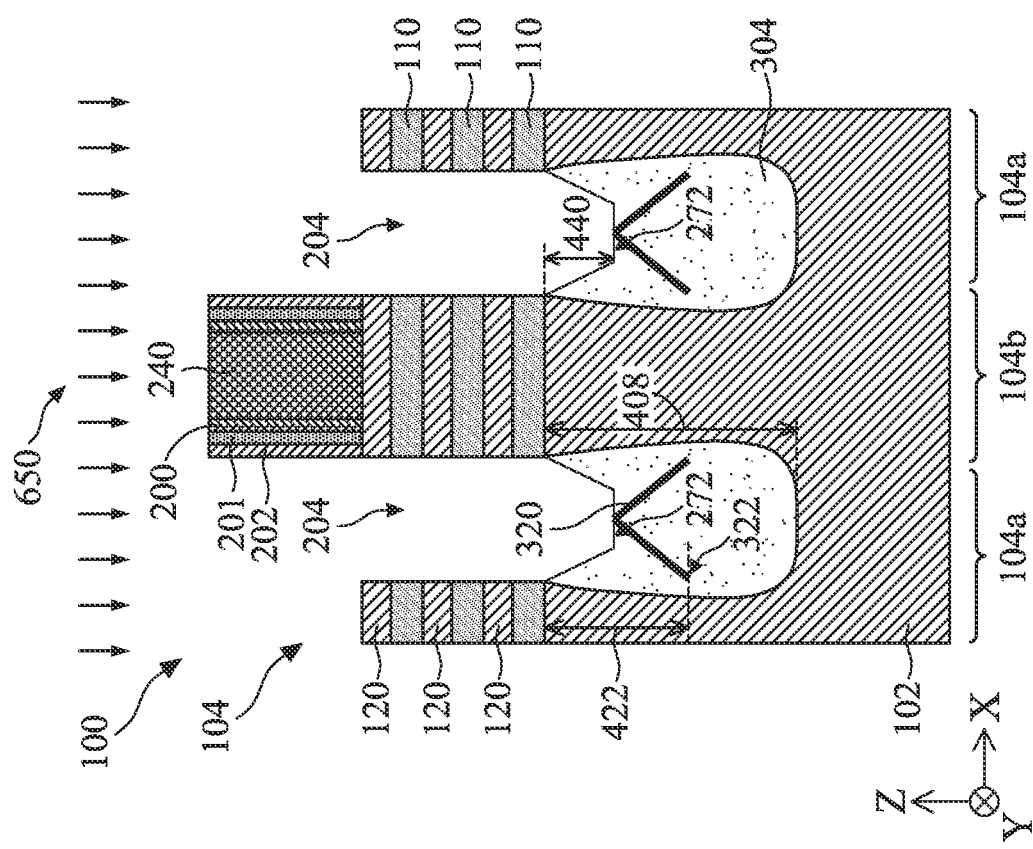

Accordingly, referring to block 32 of FIG. 2B and FIGS. 11A and 11B, a top portion of the stressor region is removed in etching process 650. As a result, the source/drain trenches 204 are extended deeper into the substrate 102 and have a new bottom surface 272. For example, previous to the process 650, the bottom surface of the source/drain trenches 204 extends below the top surface of the substrate 102 by the distance 430 (see FIG. 10A). After the process 650, the bottom surface of the source/drain trenches 204 extends below the top surface of the substrate 102 by a distance 440. In some embodiments, the distance 440 is less than the depth 406 of the stressor region 304. In other words, the etching process 650 does not remove all of the stressor region 304. Moreover, in some embodiments, the distance 440 is less than the depth 422 of the pinchoff points 322. In other words, at least a portion of the stressor region 304 that includes the dislocations 320 remain in the source/drain trenches 204 and remain exposed on the top surface of the stressor region 304. In some embodiments, the distance 440 is about 1 nm to about 30 nm. As described above, if the distance is too small, amorphous materials remain on top of the stressor regions 304 and may adversely affect the quality of the epitaxial layers formed thereon. If the distance is too large, the dislocations 320 may be removed entirely, and the stress effect described herein may no longer be available. The difference (Δ) between the distance 430 and distance 440 is the amount of material removed during the process 650. In some embodiments, the difference (Δ) is about 1 nm to about 10 nm. In some embodiments, this amount of materials removed corresponds to or may be greater than the amount of amorphous materials remaining described above. In other words, after the process 650, substantially all amorphous materials are removed, and severely damaged crystal structures are also removed. Therefore, the new exposed bottom surface 272 of the source/drain trenches 204, which is also the new exposed top surfaces 272 of the stressor region 304, are substantially free of amorphous materials, and include only crystalized semiconductor materials with low level of defects. The crystalized semiconductor materials still include dislocations 320 formed in previous annealing process 630. However, the lengths of the dislocations 320 may be reduced. These dislocations 320 exposed on the top surfaces 272 of the exposed stressor region serve as the seeds for growths of dislocations in subsequent epitaxial growth processes.

The method 10 proceeds to form gaps for inner spacers. As described earlier, the formation of the source/drain trenches 204 exposes sidewalls of the stack of semiconductor layers 110 and 120 (see FIGS. 5A and 5B). Referring to block 34 of FIG. 2B and FIGS. 12A and 12B, portions of the semiconductor layers 110 are removed through the exposed sidewall surfaces in the source/drain trenches 204 via a selective etching process, such as process 660. Because process 660 recesses the semiconductor layers 110 in a lateral direction along the X-direction, process 660 may interchangeably be referred to as a lateral etching process, or a lateral recessing process. The process 660 is designed to remove end portions of the semiconductor layers 110 but only minimally affect the semiconductor layers 120. For example, two end portions of the semiconductor layers 110 may be removed to form openings 205, while the end portions of the semiconductor layers 120 directly above and below the openings 205 are substantially preserved. In other words, openings 205 are formed in between the vertically adjacent semiconductor layers 120.

The openings 205 formed during the process 660 extend the source/drain trenches 204 into areas beneath the semiconductor layers 120 and under the gate spacer layers 201 and 202. The extent to which the semiconductor layers 110 are laterally recessed (or the size of the portion removed) is determined by the processing conditions such as the duration that the semiconductor layers 110 is exposed to an etching chemical. The process 660 may be any suitable processes. In an embodiment, the semiconductor layers 120 include Si and the semiconductor layers 110 include SiGe. The process 660 may be a wet etching process, such as a Standard Clean 1 (SC-1) solution. The SC-1 solution includes ammonia hydroxide ($NH_4OH$), hydrogen peroxide ($H_2O_2$), and water ($H_2O$). The SiGe semiconductor layers 110 may be etched away in the SC-1 solution at a substantially faster rate than the Si semiconductor layers 120. The etching duration is adjusted such that the size of the removed portions of SiGe layers is controlled. As a result, desired portions of the semiconductor layers 110 are removed while the semiconductor layers 120 are only minimally affected. The optimal condition may be reached by additionally adjusting the etching temperature, dopant concentration, as well as other experimental parameters. In another embodiment, the semiconductor layers 120 include SiGe and the semiconductor layers 110 includes Si. A cryogenic deep reactive ion etching (DRIE) process may be used to selectively etch away the Si semiconductor layer 110. For example, the DRIE process may implement a sulfur hexafluoride-oxygen ($SF_6$—$O_2$) plasma. The optimal condition may be reached by adjusting the etching temperature, the power of the Inductively Coupled Plasma (ICP) power source and/or Radio Frequency (RF) power source, the ratio between the $SF_6$ concentration and the $O_2$ concentration, the dopant (such as boron) concentrations, as well as other experimental parameters. For example, the etching rate of a Si semiconductor layer 110 using a $SF_6$—$O_2$ plasma (with approximately 6% $O_2$) may exceed about 8 µm/min at a temperature of about −80° C.; while the SiGe semiconductor layers 120 are not substantially affected during the process. In some embodiments, the etching process conditions cause the openings 205 to have curved surfaces.

Referring to block 36 of FIG. 2B and FIGS. 13A and 13B, dielectric inner spacers 206 are formed in the gaps 205 via process 670. In some embodiments, the inner spacers 206 may include a dielectric material selected from $SiO_2$, SiON, SiOC, SiOCN, or combinations thereof. In some embodiments, the proper selection of the dielectric material may be based on its dielectric constant. In some embodiments, the inner spacers 206 are formed by first depositing a dielectric material into both the source/drain trenches 204 and the openings 205. The deposition of the dielectric material may be any suitable methods, such as CVD, PVD, PECVD, MOCVD, ALD, PEALD, or combinations thereof. Subsequently, the dielectric material is partially etched back to form the inner spacers 206. Accordingly, the inner spacers 206 are formed between vertically adjacent semiconductor layers 120.

Referring to block 38 of FIG. 2C and FIGS. 14A and 14B, the method 10 proceeds to forming epitaxial source/drain features 500 in the source/drain trenches 204, and at least partially fill the source/drain trenches 204. The epitaxial source/drain features 500 may include more than one layer formed in different portions of the source/drain trenches 204. In the embodiments depicted in FIG. 14A, the epitaxial source/drain features 500 includes two epitaxial layers, epitaxial layer 510, and epitaxial layer 520. The epitaxial layer 510 is first formed in the bottom portion of the trenches 204 and on the top surfaces 272 of the stressor regions 304. In other words, the epitaxial layer 510 directly interfaces with the top surface of the stress regions 304. Additionally, the epitaxial layer 510 also interfaces with the inner spacers 206 on its sidewall surfaces. The epitaxial layer 520 is then formed inside the remaining portions of the source/drain trenches 204, and on sidewall surfaces of the semiconductor layers 120 and the inner spacers 206. The epitaxial layer 520 is further formed on the top surface of the epitaxial layer 510. In some embodiments, the epitaxial layers 510 and 520 each include the same or different materials, and fulfill the same or different functions.

In some embodiments, the epitaxial layers 510 and/or 520 are formed using an epitaxial process 680. The epitaxial process 680 may include performing an epitaxial deposition/partial etch process and repeating the epitaxial deposition/partial etch process. In other words, the epitaxial process 680 may be a cyclic deposition/etch (CDE) process. For example, the epitaxial process 680 may include a deposition operation that implements gaseous or liquid precursors. The precursors may interact with the crystal material on the top surface of the stressor region 304 so as to extend the crystal network (or lattice) of the crystal material, thereby forming a semiconductor epitaxy. In some embodiments, the deposition operation may use chemical vapor deposition (CVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. In some embodiments, the deposition of the silicon-containing epitaxial material has a deposition temperature of about 750° C. or less. In other embodiments, the deposition temperature ranges from about 500° C. to about 750° C. In some embodiments, the pressure of the deposition process ranges from about 50 Torr to about 500 Torr. Then, an etching operation (such as a dry etching operation utilizing a halogen-based etching chemical) is conducted to remove amorphous semiconductor materials from the surface of the semiconductor epitaxy. Subsequently, another deposition operation is conducted to further grow and increase the thickness of the semiconductor epitaxy. The parameters of the etching and deposition operations (such as temperatures, duration, and etching chemical compositions) may be adjusted based on the desired feature profile, dimensions, or other characteristics. The cyclic process is repeated until a desired thickness of the epitaxial layer 510 is reached. Subsequent, the growth of the epitaxial layer 520 may proceed using the same or different methods, and from the same or different precursors. Alternatively, the epitaxial process 680 may instead be a selective epitaxial growth (SEG) process that utilizes simultaneous deposition and etch operations.

During the epitaxial process 680, not only the epitaxial layer 510 grow, the dislocations 320 also grow. For example, the exposed dislocations 320 on the top surfaces of the stressor region 304 may serve as the seeds for the growth of the dislocations 320. The dislocations 320 grow as the epitaxial layer 510 grows. In some embodiments, the etching operations of the epitaxial process 680 may remove portions of the semiconductor epitaxy that include random dislocations or other defects. As a result, higher portions of the dislocations 320 are also removed in the etching operations. However, as the dislocations 320 originate from deep in the stressor regions 304, such etching operations do not entirely eliminate the dislocations 320. In a subsequent growth cycle, the dislocations further grow from the remaining portions of the dislocations 320 left from the etching operations. As a result, the dislocations 320 propagate through the crystal lattice of the growing epitaxial layers 510 and to the top surfaces of the epitaxial layers 510. Moreover, although FIG. 14A illustrates only four dislocations 320 that end on sidewall surfaces of the epitaxial layers 510, more dislocations 320 may be present. Some of these dislocations may propagates to top surfaces of the epitaxial layers 510 thereby may serve as seeds for further propagations into subsequently formed epitaxial layer 520. This is illustrated in FIG. 14B. In other words, the dislocations 320 crosses the interfaces between the stressor regions 304 and the epitaxial layers 510, as well as the interfaces between the epitaxial layers 510 and the epitaxial layers 520.

The epitaxial layers 510 and/or 520 may include suitable epitaxial materials. In the depicted embodiments, the epitaxial layers 510 and 520 are configured to form part of an epitaxial source/drain features 500 of an NMOS device 100. Accordingly, the epitaxial layers 510 and 520 include epitaxial materials suitable for an NMOS, such as silicon. In some embodiments, the epitaxial layers 510 and/or 520 are free of any dopants. Nevertheless, charge carriers in the epitaxial layers 510 and 520 may have increased mobility in migrating from one epitaxial layer 510 or 520 through the channel layers 120 to another epitaxial layer 510 or 520 (as compared to approaches not implementing the methods described here). This may be solely due to the increased tensile stress on the channel layers 120 caused by the dislocations in the epitaxial layers 510 or 520. In some embodiments, the epitaxial layers 510 and/or 520 may also be doped. For example, the dopant may include carbon (C), arsenic (As), phosphorous (P), antimony (Sb), bismuth (Bi), or combinations thereof. Such doping further improves the mobility of the charge carriers that flow through the channel layers 120.

In some embodiments, the profiles for the epitaxial layers 510 and 520, the dopant configurations, as well as the dislocation configurations described above may be designed in conjunction with one another to achieve optimal device performances. For example, the portion 122 of the substrate 102 immediately below the lowest channel layer 120 may be referred to as subchannel region 122. The subchannel region 122 is subject to only weak gate control. Therefore, when the electron mobility is too high in this area, OFF-state leakage may increase. In other words, there requires a method to increase mobility in the top channel layers 120 but not in the subchannel region 122. In such scenarios, the epitaxial layers 510 may be configured to primarily form in the bottom portions of the source/drain trenches 204. For instance, greater than 70% of the volume of the epitaxial layers 510 are configured to be below the top surface of the substrate 102. Accordingly, the epitaxial layers 510 may be configured differently from the epitaxial layers 520 to achieve different charge carrier mobility. For example, the epitaxial layers 510 may be configured to include carbon as a dopant, while the epitaxial layers 520 may be configured to include phosphorous or arsenic. Because a Si epitaxial layer doped with carbon has substantially lower electron mobility that that doped with phosphorous or arsenic, the OFF-state leakage may be reduced without sacrificing device speed.

Figures 15A, 15B:
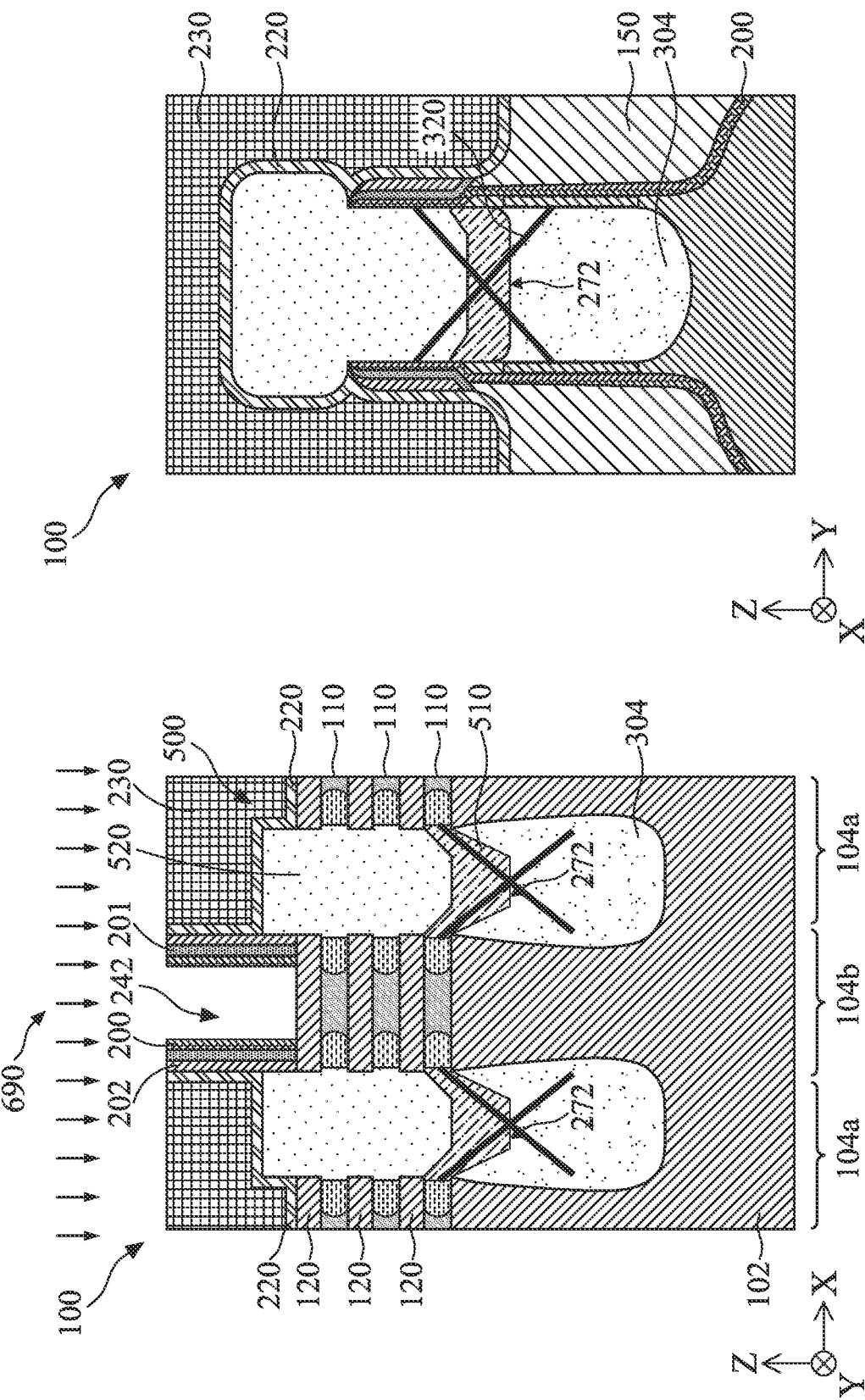

Referring to block of 40 of FIG. 2C and to FIGS. 15A and 15B, an interlayer dielectric (ILD) layer 230 is formed over the epitaxial source/drain features 500, as well as vertically over the isolation features 150. In some embodiments, an etch-stop layer 220 may be formed in between the ILD layer 230 and the source/drain features 500. The ILD layer 230 may also be formed in between the adjacent gate structures 250 along the X-direction, and in between the adjacent epitaxial source/drain features 500 along the Y-direction. The ILD layer 230 may include a dielectric material, such as a high-k material, a low-k material, or an extreme low-k material. For example, the ILD layer 230 may include $SiO_2$, SiOC, SiON, or combinations thereof. The ILD layer 230 may include a single layer or multiple layers, and may be formed by a suitable technique, such as CVD, ALD, and/or spin-on techniques. After forming the ILD layer 230, a CMP process may be performed to remove excessive ILD layer 230 and planarized the top surface of the ILD layer 230. Among other functions, the ILD layer 230 provides electrical isolation between the various components of the device 100.

Referring to block 42 of FIG. 2C and still referring to FIGS. 15A, 15B, the dummy gate stacks 240 are selectively removed in process 690. The removal of the dummy gate stacks 240 creates gate trenches 242, which expose the respective top surfaces and the side surfaces of the semiconductor stacks (along the Y direction). The processes 690 may be selected from any suitable lithography and etching processes. In some embodiments, the lithography process may include forming a photoresist layer (resist), exposing the resist to a patterned radiation, performing a post-exposure bake process, and developing the resist to form a masking element, which exposes a region including the gate structures 250. Then, the dummy gate stacks 240 are selectively etched through the masking element. In some other embodiments, the gate spacer 201 and/or 202 may be used as the masking element or a part thereof.

Figures 16A, 16B:
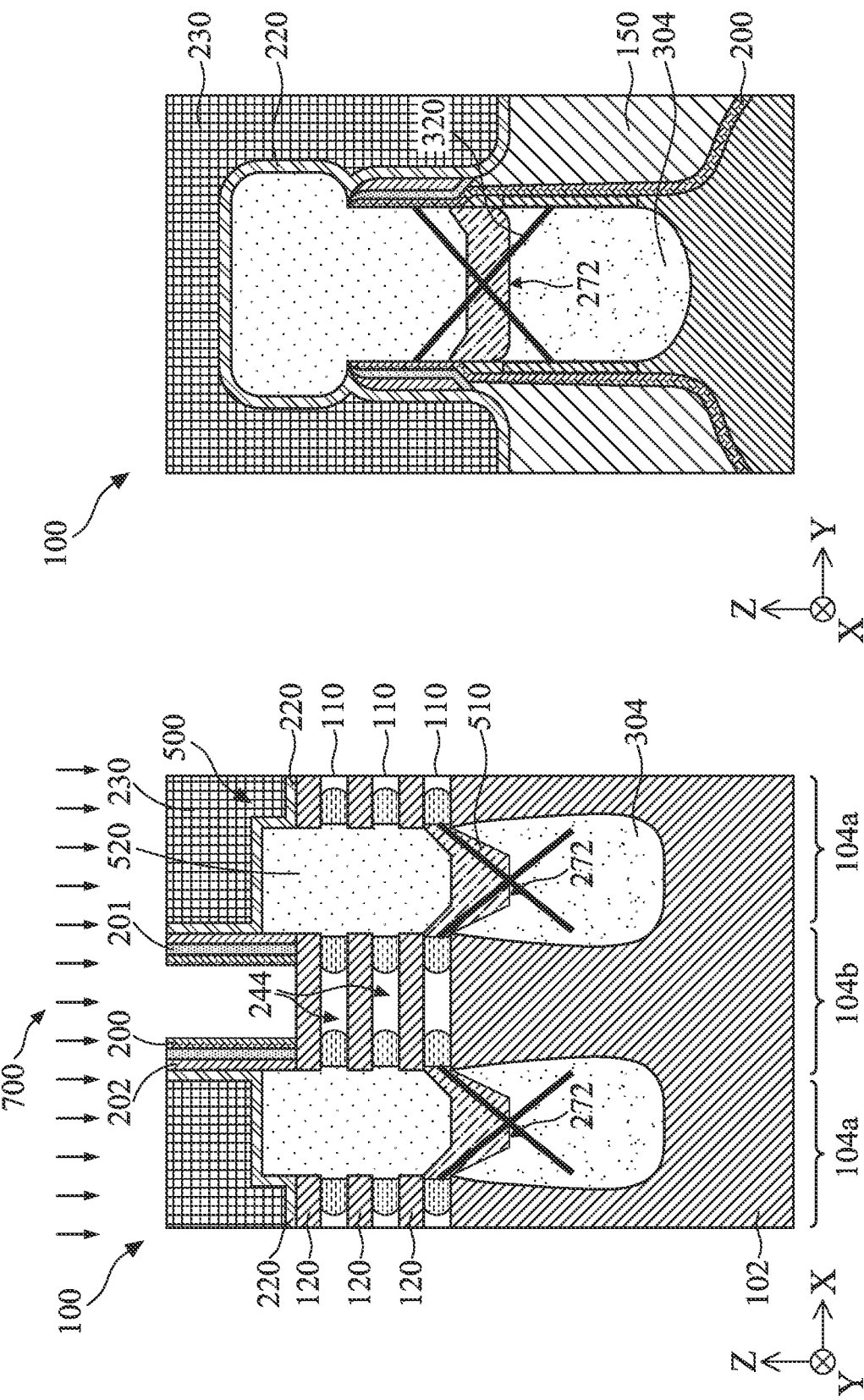

Referring to blocks 44 of FIG. 2C and FIGS. 16A and 16B, the remaining portions of the semiconductor layers 110 are selectively removed during process 700 through the exposed side surfaces of the semiconductor stack. Similar to processes 660, process 700 may be configured to completely remove the semiconductor layers 110 without substantially affect the semiconductor layers 120. The removal of the remaining portions of the semiconductor layers 110 form suspended semiconductor layers 120, as well as openings 244 in between the vertically adjacent semiconductor layers 120. Accordingly, the center portions of the semiconductor layers 120 each have exposed top, bottom, and sidewall surfaces. In other words, the center portions of each of the semiconductor layers 120 are now exposed circumferentially around the X-direction. The processes 700 may be any suitable etching processes, such as a dry etching process, a wet etching process, or combinations thereof.

Figures 17A, 17B:
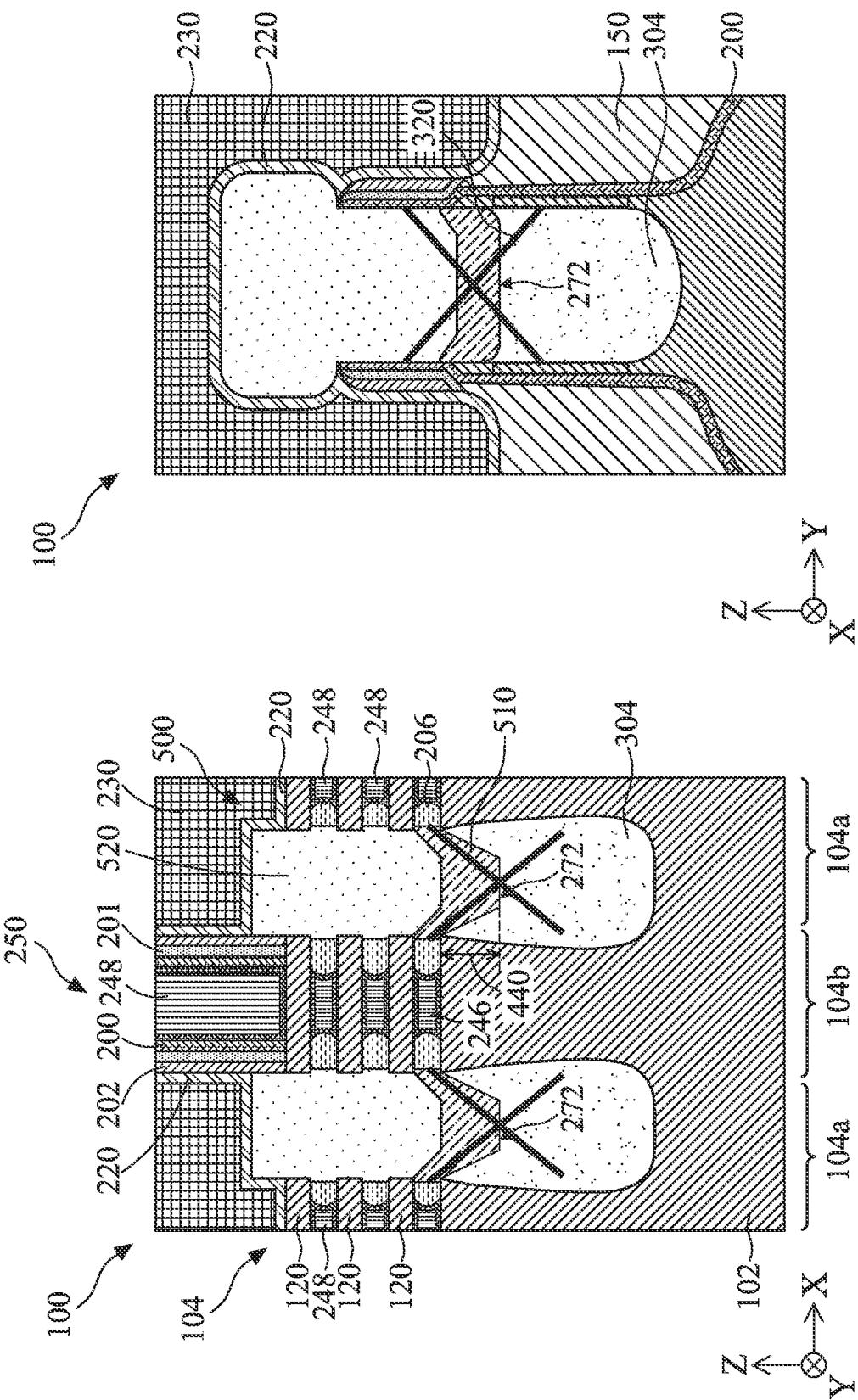

Referring to block 46 of FIG. 2C and FIGS. 17A and 17B, metal gate stacks are formed in the openings 244 and the gate trenches 242. For example, a gate dielectric layer 246 is formed over and between the semiconductor layers 120, and a conductive metal layer 248 is formed over and between the portions of the gate dielectric layers 246. In some embodiments, the gate dielectric layer 246 may be a high-k dielectric layer. The high-k gate dielectric layer 246 may be formed conformally such that it at least partially fills the gate trenches 242 and the openings 244. In some embodiments, the high-k gate dielectric layer 246 may be formed around the exposed surfaces of each of the semiconductor layers 120, such that it wraps around each of the semiconductor layers 120 in 360°. The high-k gate dielectric layer 246 may further be formed over the side surfaces of the inner spacers 206, and the gate spacer layers 201. The high-k gate dielectric layer 246 may contain a dielectric material having a dielectric constant greater than a dielectric constant of $SiO_2$, which is approximately 3.9. For example, the high-k gate dielectric layer may include hafnium oxide ($HfO_2$), which has a dielectric constant in a range from about 18 to about 40. As various other examples, the high-k gate dielectric layer may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The formation of the high-k gate dielectric layer 246 may be by any suitable processes, such as CVD, PVD, ALD, or combinations thereof. In some embodiments, an interfacial layer is formed to interpose between the semiconductor layers 120 and the gate dielectric layers 246. However, in some embodiments, the interfacial layer 245 is omitted.

The conductive metal layer 248 is formed over the gate dielectric layer 246 and fills the remaining spaces of the gate trenches 242 and the openings 244. The conductive metal layer 248 may include a work function metal layer. In the depicted embodiment, the conductive metal layer 248 is configured for the NMOS transistor. Accordingly, the work function metal layer may include any suitable n-type work function metal materials, such as titanium (Ti), silver (Ag), tantalum aluminum (TaAl), tantalum aluminum carbide (TaAlC), titanium aluminum nitride (TiAlN), tantalum carbide (TaC), tantalum carbonitride (TaCN), tantalum silicon nitride (TaSiN), manganese (Mn), zirconium (Zr), other suitable n-type work function materials, or combinations thereof. The conductive metal layer 248 may further include a fill metal layer. The fill metal layer may include any suitable materials, such as aluminum (Al), tungsten (W), copper (Cu), cobalt (Co), nickel (Ni), platinum (Pt), ruthenium (Ru), or combinations thereof. In some embodiments, a CMP is performed to expose a top surface of the ILD layer 230. The gate dielectric layer 246 and the conductive metal layer 248 collectively form the high-k metal gate stack. The high-k metal gate stack and the gate spacer layers 201 and 202 collectively form the new gate structures 250. The gate structures 250 engage multiple semiconductor layers 120 to form multiple gate channels.

Referring to block 48 of FIG. 2C, method 10 continues to form additional features and complete the fabrications of the device 100. For example, silicide features, contact features, via features, metal lines, etc. are formed on device 100. Additional steps can be provided before, during, and after the method 10, and some of the steps described may be replaced or eliminated, for additional embodiments of the method. It is further understood that additional features can be added in the device 100, and some of the features described may be replaced or eliminated, for additional embodiments of the device 100.

Referring back to FIGS. 2A-2C, and particularly to FIG. 2B, although the description above describes processing the stressor regions 304 (associated with blocks 22-32) before forming the inner spacers 206 (associated with blocks 34-36), these two processes may proceed in any other sequences. For example, the method may alternatively proceed from block 20 of FIG. 2A to blocks 34-36 of FIG. 2B and then to blocks 22-32 of FIG. 2B. For another example, the two branches of FIG. 2B may proceed in alternating sequences.

The disclosure above describes forming an NMOS device 100 with increased stresses in the transistor channels that improve the electron mobility and thereby device speeds. In some embodiments, the device 100 may be a CMOS device having an NMOS component and a PMOS component coupled together. Accordingly, the method described above with respect to NMOS may be adapted to provide a CMOS device, where the NMOS component includes features described herein. For example, FIGS. 18A-18B illustrate a flow chart of a method 10' associated with processing a CMOS device 100' according to some embodiments of the present disclosure; and FIGS. 19A-25A, 19B-25B, 25C, and 25D illustrate the CMOS device 100' at different stages of fabrication of the method 10' of FIGS. 18A-18B, according to some embodiments of the present disclosure.

Figure 18A:
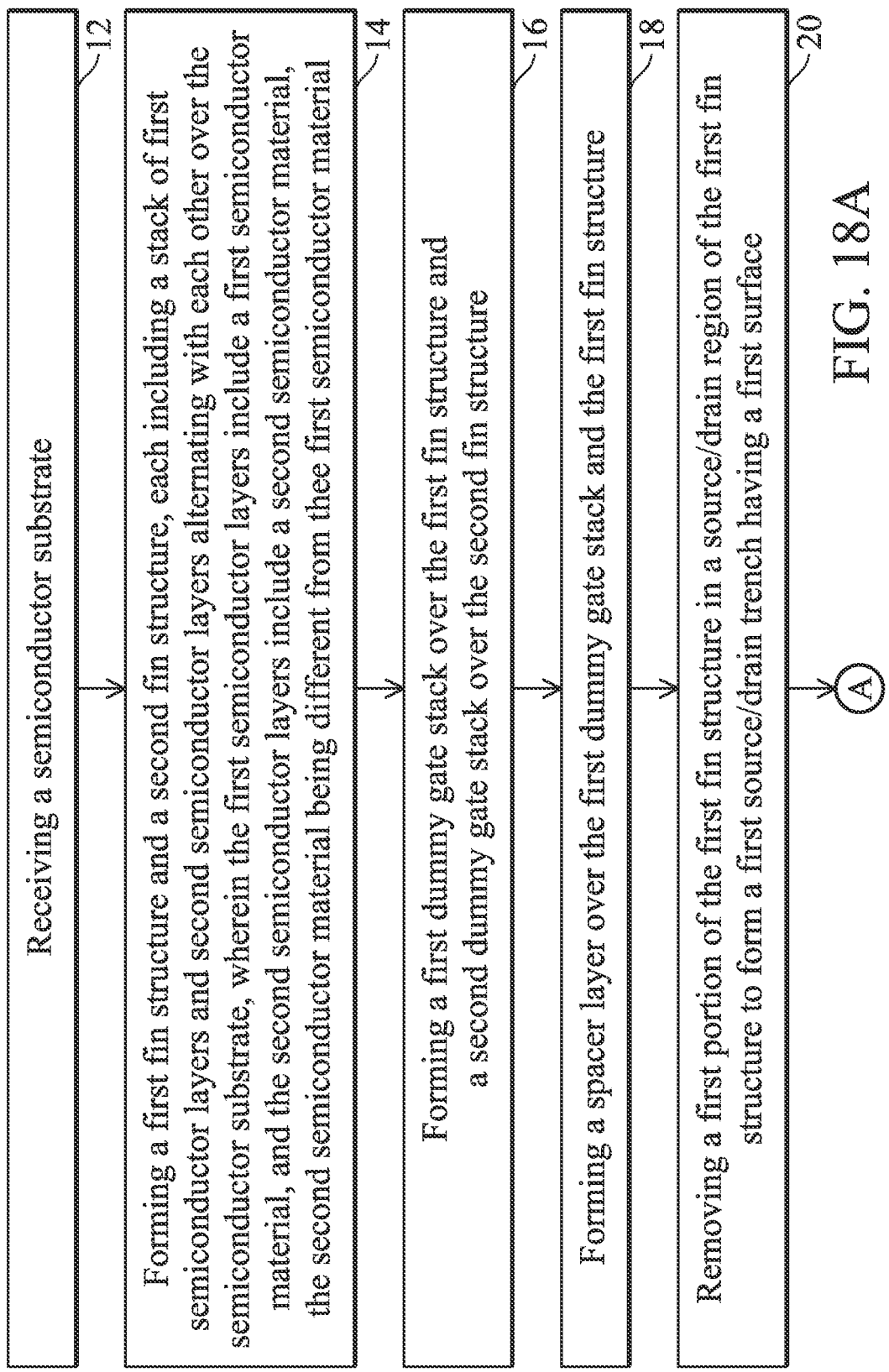
FIGS. 18A and 18B are flowcharts illustrating a method of forming an embodiment of a nano-sheet-based CMOS device of the present disclosure according to various aspects of the present disclosure.

Referring to block 12 of FIG. 18A, a semiconductor substrate 102 is received. The substrate 102 may be similar to the substrate 102 described above with respect to FIGS. 3A and 3B. Moreover, the semiconductor substrate 102 includes an NMOS region configured for an NMOS component 100A and a PMOS region configured for a PMOS component 100B. Referring to block 14 of FIG. 18A and FIGS. 19A and 19B, fin structures 104A and 104B are formed in the NMOS region and PMOS region, respectively. The fin structures 104A and 104B each resemble the fin structures 104 described above with respect to FIGS. 3A and 3B, and may be formed using similar methods. For example, the fin structures 104A and 104B each include a stack of semiconductor layers 110 and semiconductor layers 120 having different material compositions. Moreover, the fin structures 104A may have a lateral width of about 10 nm to about 30 nm; and the fin structures 104B may have a lateral width of about 1 nm to about 30 nm. As described above, if the lateral width of the fin structures 104A is too small, such as less than 10 nm, there may not insufficient room for the subsequently formed dislocations in the stressor regions to propagate such that they are terminated by the sidewall surfaces of the fin structures 104A rather than reaching the top surfaces of the stressor regions. As described later, the PMOS component 100B are not configured to develop dislocations, and the lateral widths of the fin structures 104B may be less than 10 nm. Referring to block 16 of FIG. 18A and FIGS. 19A and 19B, dummy gate stacks 240 are formed over the fin structures 104A and 104B. The dummy gate stacks 240 resembles the dummy gate stack 240 described above with respect to FIGS. 4A and 4B, and may be formed using similar methods. Moreover, in some embodiments, the dummy gate stacks 240 on the fin structures 104A and that on the fin structures 104B are separated and not physically connected with each other. In some embodiments, the dummy gate stacks 240 on the fin structures 104A and that on the fin structures 104B are physically connected. For example, one single dummy gate stack 240 may extend across the fin structure 104A and the fin structure 104B. Referring to block 18 of FIG. 18A and FIGS. 19A and 19B, gate spacer 201-202 are formed over the dummy gate stacks 240 and over the exposed portions of the fin structures 104A and 104B. The gate spacer 201-202 also resemble those gate spacers 201-202 described above with respect to FIGS. 4A and 4B. A mask element 280A is formed to cover the PMOS region while exposing the NMOS region. Referring to block 20 of FIG. 18A and FIGS. 19A-19B, portions of the fin structure 104A on both sides of the dummy gate stack 240 and not covered by the dummy gate stack 240 or the gate spacers 201 and 202 are removed to form source/drain trenches 204A. Meanwhile, the PMOS region is covered under the mask element 280A and is not affected. The source/drain trenches 204A resemble the source/drain trenches 204 described above with respect to FIGS. 5A and 5B, and may be formed using similar methods.

Figure 18B:
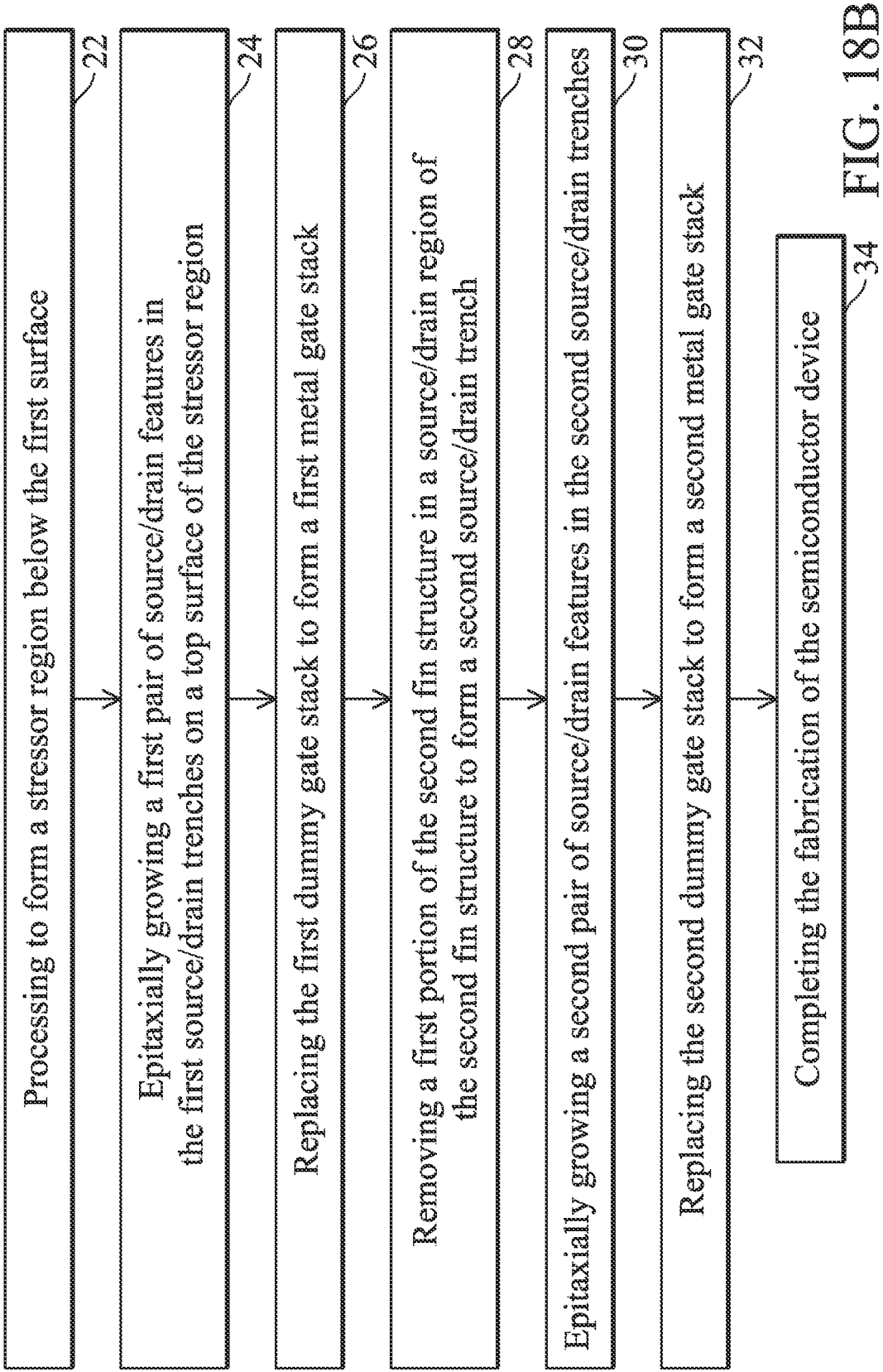
Figures 20A, 20B:
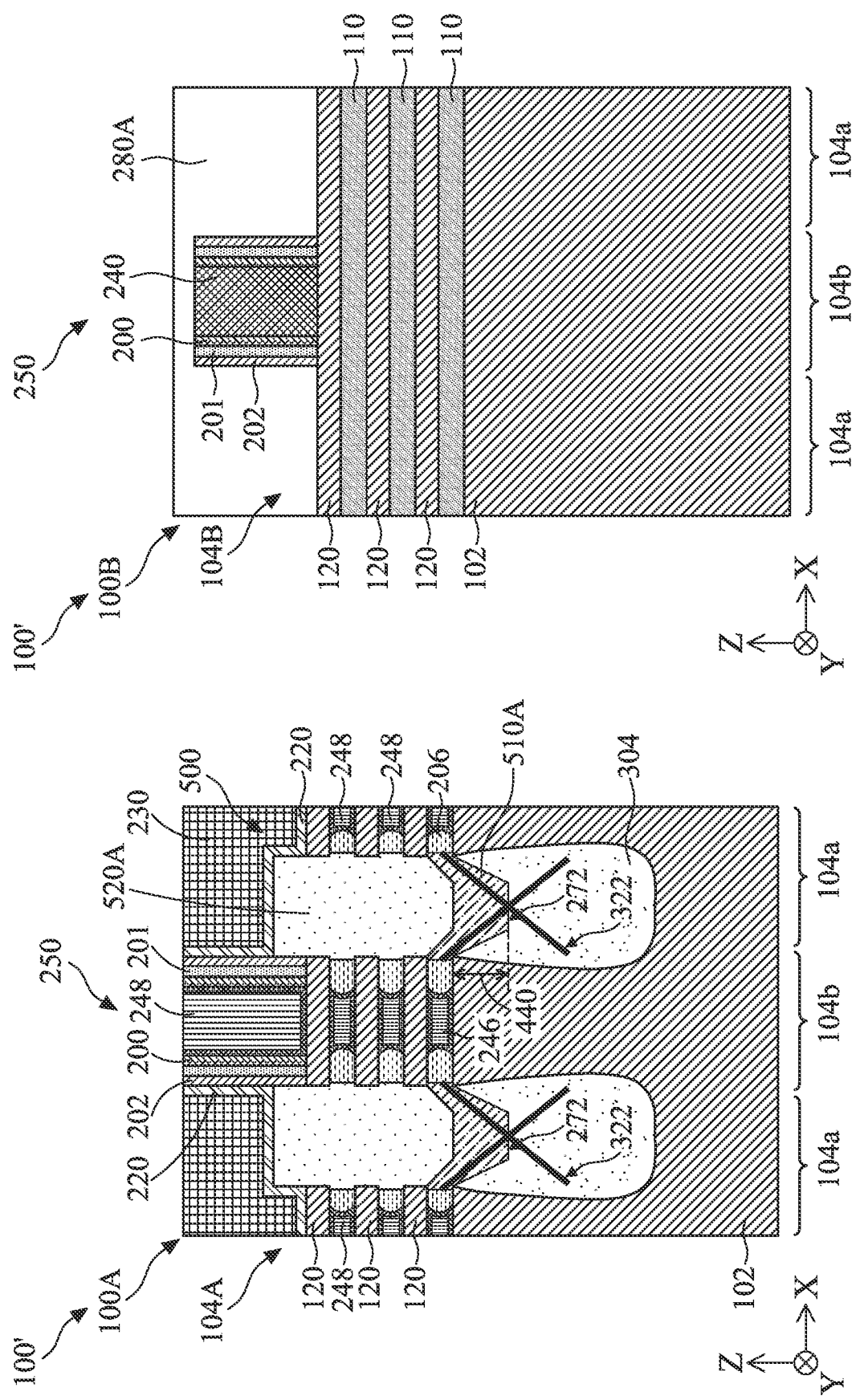

Referring to blocks 22-26 of FIG. 18B and to FIGS. 20A and 20B, the method 10' proceeds to process the NMOS region to form NMOS 100A that is substantially similar to blocks 22-36 of FIG. 2B and to FIGS. 6A-17A and 6B-17B. For example, referring to block 22 of FIG. 18B, a stressor region 304 is formed in the NMOS region that substantially resembles the stressor region 304 described above with respect to FIGS. 6A-11A and 6B-11B. For example, an optional epitaxial layer 505 may be grown on the bottom surfaces of the source/drain trenches 204A, a dielectric layer 302 is formed to cover the bottom surfaces of the source/drain trenches 204A, an amorphized region 304 is formed in the substrate 102 below the bottom surfaces of the source/drain trenches 204A by implanting through the dielectric layer 302 implantation species (such as Si, Ge, As, etc.), a dielectric layer 312 is formed to cover the dielectric layer 302, an annealing process is conducted to recrystallized the amorphized region 304 and convert the amorphized region 304 into a stressor region 304. Moreover, the annealing causes dislocations 320 to develop in the stressor regions 304, such as originating from pinchoff points 322. At least some of the dislocations 320 extend to top surfaces 270 of the stressor regions 304. In the depicted embodiments, a distance between the top surfaces 270 and the top surface of the substrate 102 is distance 430. Furthermore, top portions of the stressor regions 304 that includes amorphous materials and/or severely damaged crystal structures are removed, thereby exposing a crystalline top surface 272 having dislocations 320 embedded therein. In the depicted embodiments, the top surface 272 extends below the top surface of the substrate 102. For example, the distance between the top surface 272 and the top surface of the substrate 102 is distance 440. The distance 440 is substantially similar to the distance 440 described above with respect to FIG. 11A. Additionally, inner spacers 206 are formed between adjacent semiconductor layer 120, using methods substantially similar to those described above with respect to FIGS. 13A and 13B.

Referring to block 24 of FIG. 18B and to FIGS. 20A and 20B, source/drain features (including epitaxial layers 510A and 520A) are formed in the source/drain trenches. The epitaxial layers 510A and 520A substantially resemble the epitaxial layers 510 and 520 described above with respect to FIGS. 14A and 14B. For example, the epitaxial layers 510A are formed directly on the top surfaces 272 and extend the crystal lattices of the stressor regions 304. Accordingly, dislocations 320 extend from within the stressor regions 304, across the top surfaces 272, and into the epitaxial layers 510A. The epitaxial layers 520A are formed on top of the epitaxial layers 510A and further extends the crystal lattices of the epitaxial layers 510A. Accordingly dislocations 320 may further extend from within the epitaxial layers 510A, across the interfaces 274 between the epitaxial layers 510A and 520A, and into the bulk of the epitaxial layers 520A. In the depicted embodiments, the epitaxial layers 510A extends to the surface 272, and the distance between the surface 272 and the top surface of the substrate 102 is distance 440.

Referring to block 26 of FIG. 18B and FIGS. 20A and 20B, the dummy gate stacks 240 in the NMOS region are replaced by a metal gate stack. This process is substantially similar to blocks 40-46 of FIG. 2C and FIGS. 15A-17A and 15B-17B. Accordingly, metal gate structures 250 are formed between the epitaxial layers 510A and 520A.

Figure 21B:
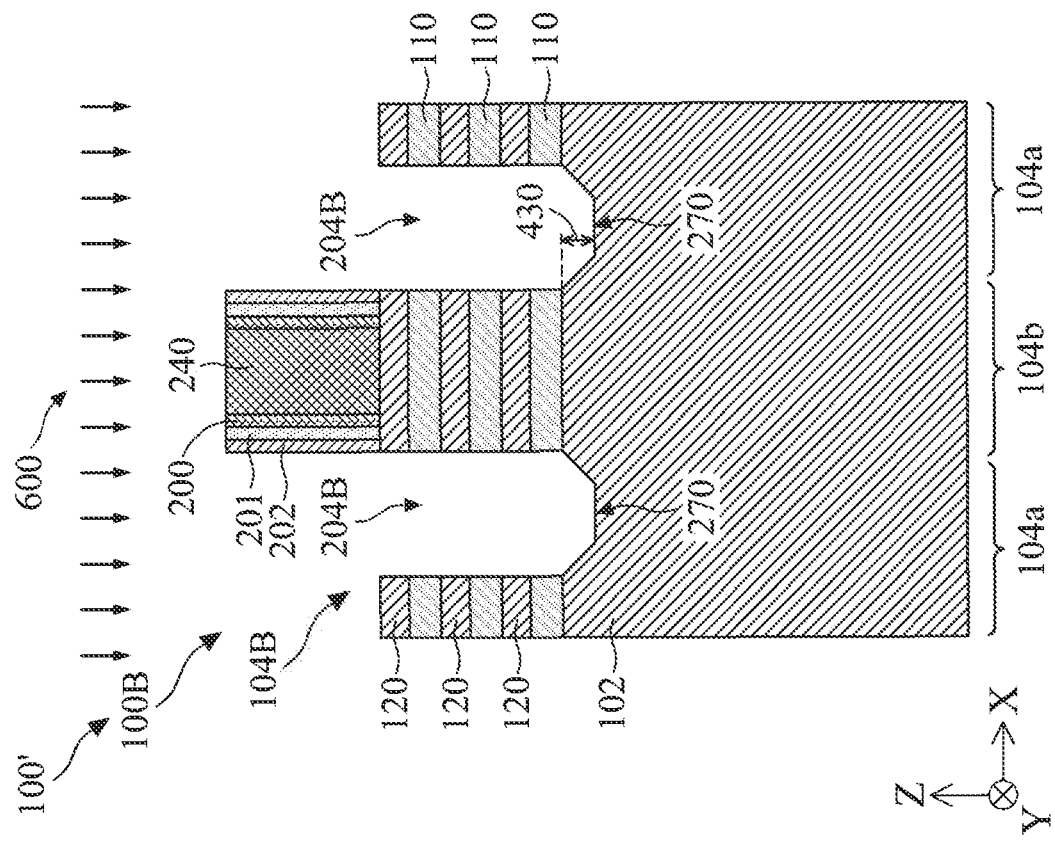
Figure 21A:
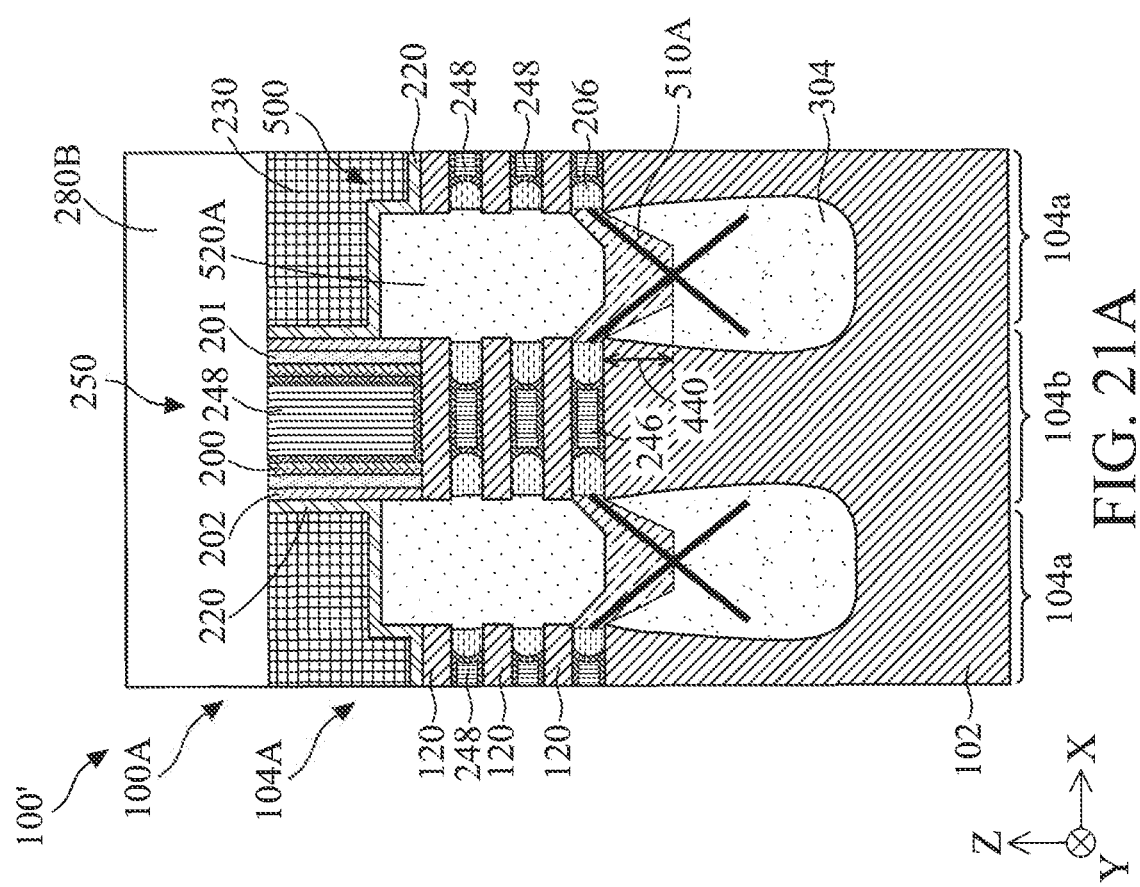
Figure 22A:
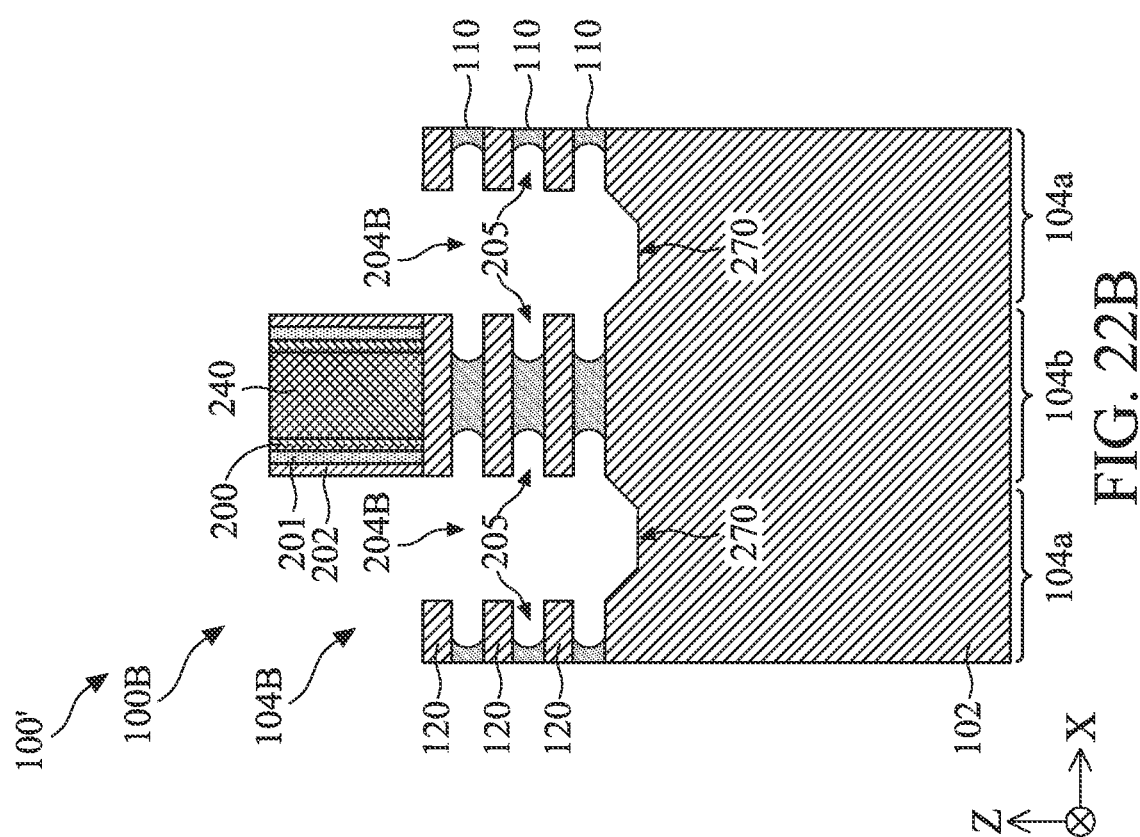
Figure 22B:
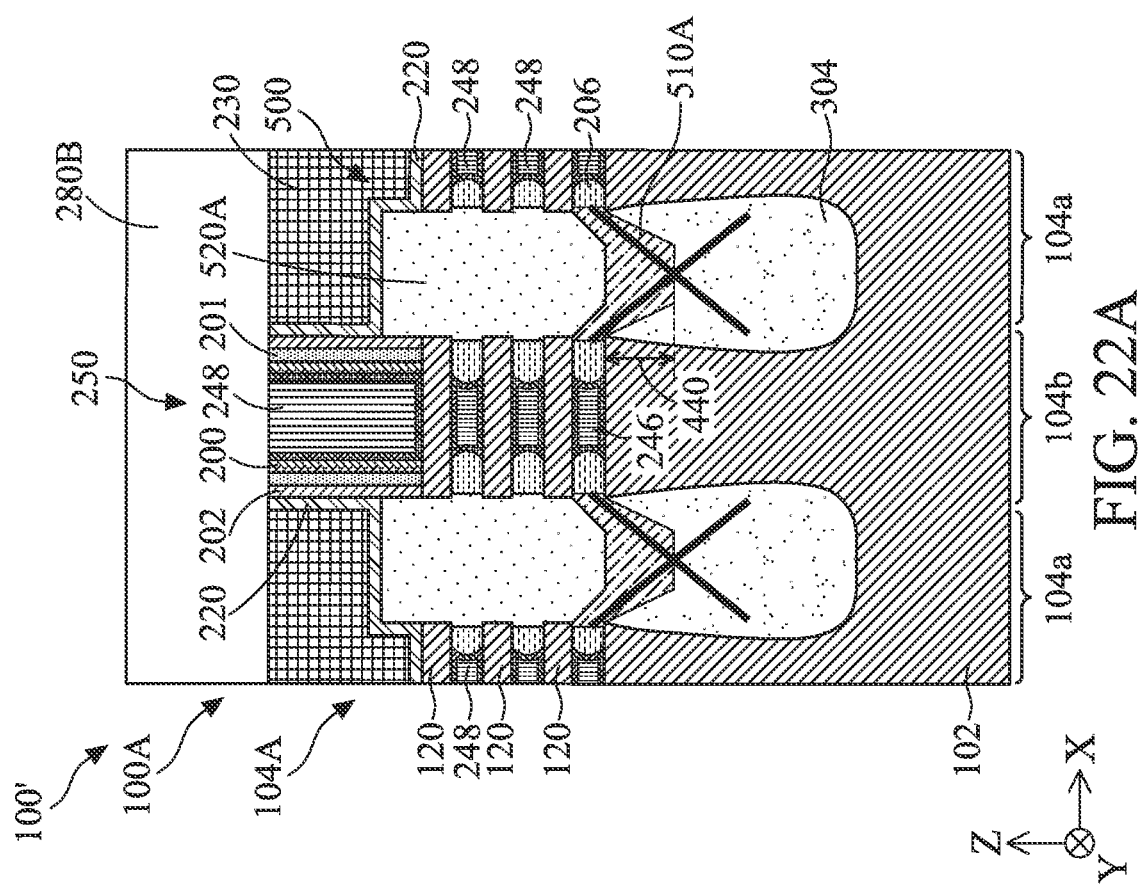

Referring to block 28 of FIG. 18B and FIGS. 21A and 21B, the mask element 280A is removed from the PMOS region to expose the fin structures 104B and the dummy gate stacks 240 formed thereon. Moreover, mask element 280B is formed to cover the NMOS region. Thereafter, a portion of the second fin structure in the source/drain regions are removed to form source/drain trenches 204B. This process generally resembles that associated with block 20 of FIG. 2A and FIGS. 5A and 5B. Accordingly, the source/drain trenches 204B may have bottom surfaces 270. In the depicted embodiments, a distance between the bottom surfaces 270 and the top surface of the substrate 102 is distance 430. Referring to FIGS. 22A and 22B, an etching process is conducted to remove portions of the semiconductor layers 110 from the source/drain trenches 204B, thereby forming gaps 205. This process may be similar to those described above with respect to block 34 of FIG. 2B. Referring to FIGS. 23A and 23B, inner spacers 206 are formed in the gaps 205 between the adjacent semiconductor layers 120. The inner spacers 206 are substantially similar to the inner spacers 206 described above with respect to FIGS. 13A and 13B.

Figure 24C:
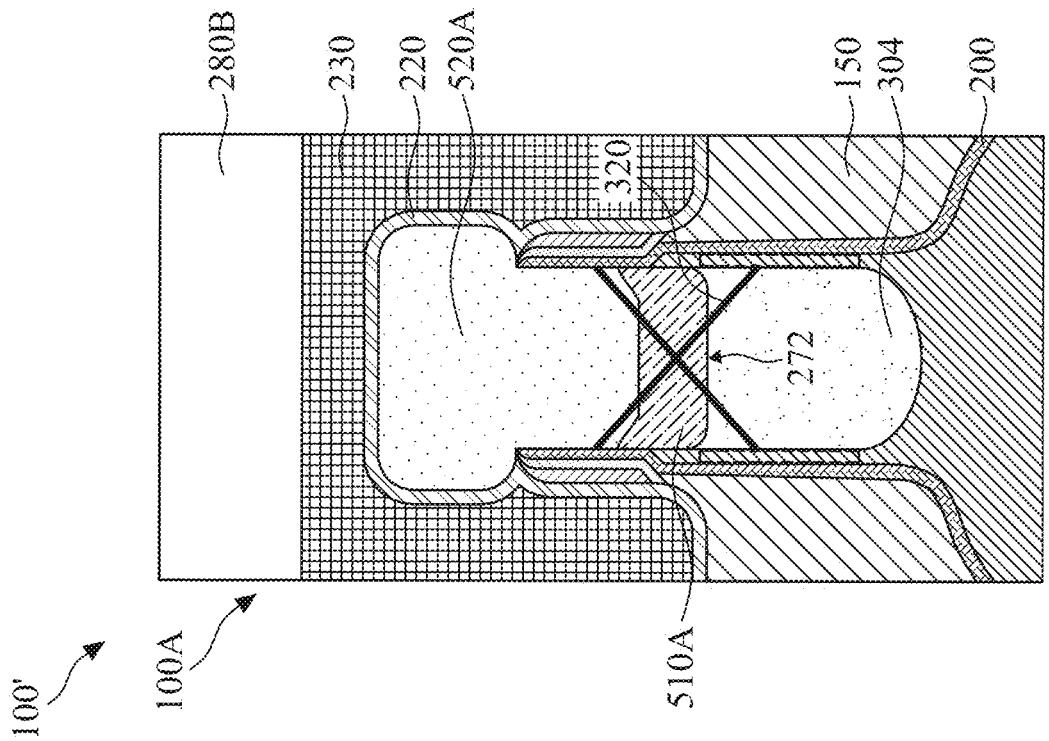
Figure 24D:
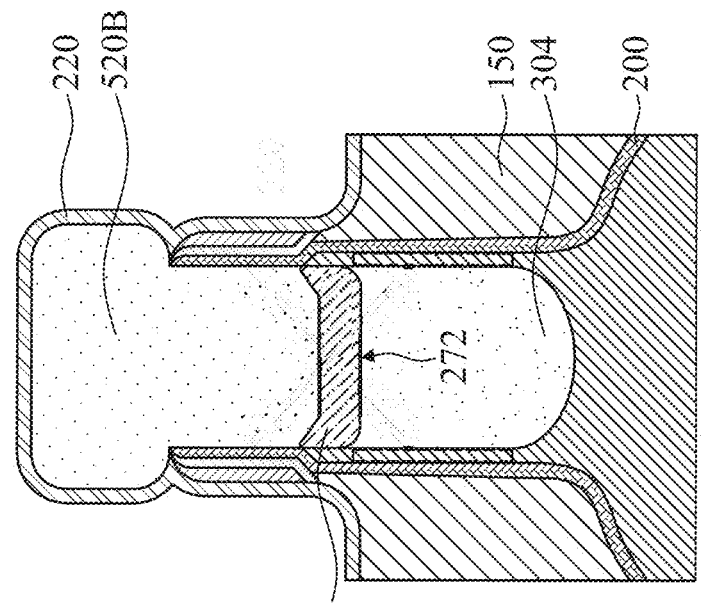

Referring to block 30 of FIG. 18B and FIGS. 24A and 24B, epitaxial layers 510B and 520B are formed in the source/drain trenches 204B. The epitaxial layers 510B may be formed directly on the bottom surfaces 270 of the source/drain trenches 204B. The epitaxial layers 510B and 520B may each be similar to the epitaxial layers 510 and 520 described above with respect to FIGS. 14A and 14B, and therefore also similar to the epitaxial layers 510A and 520A described above with respect to FIG. 20A, however, with several distinctions. For example, the bottom surfaces for the epitaxial layers 510B extends below the top surface of the substrate 102 by the distance 430. By contrast, the bottom surfaces for the epitaxial layers 510A extends below the top surface of the substrate 102 by the distance 440. As described above, the distance 440 is greater than the distance 430. Accordingly, the bottom surfaces of the epitaxial layers 510B extends higher than the bottom surfaces of the epitaxial layers 510A. Moreover, in the depicted embodiments, the epitaxial layers 510B and 520B do not include dislocations similar to the dislocations 320 described above. These distinctions are further illustrated in FIGS. 24C and 24D, which illustrate cross-sectional sideviews of the NMOS component 100A and PMOS component 100B along the B-B' plane (see FIG. 1A). Furthermore, because epitaxial layers 510B and 520B are configured for PMOS component 100B, the epitaxial layers 510B and/or 520B may have a dopant structure that is different from that of the epitaxial layers 510A and/or 520A. For example, the epitaxial layers 510B and/or 520B may include a p-type dopant, such as boron (B), gallium (Ga), other suitable p-type dopant, or combinations thereof. Moreover, in some embodiments, the epitaxial layers 510B and/or 520B may include germanium (Ge). Ge has a greater atomic size as compared to Si. Therefore, Ge as a dopant in the epitaxial source/drain features directly adjacent the channel layers 120 asserts a compressive stress directly on the channel layers 120. This also increases the charge carrier mobility (here, hole mobility) of the PMOS component 100B. Additionally, an interface between the epitaxial layers 510B and 520B may extend along, above, or below the interface between the epitaxial layers 510A and 520A.

Figures 25A, 25B:
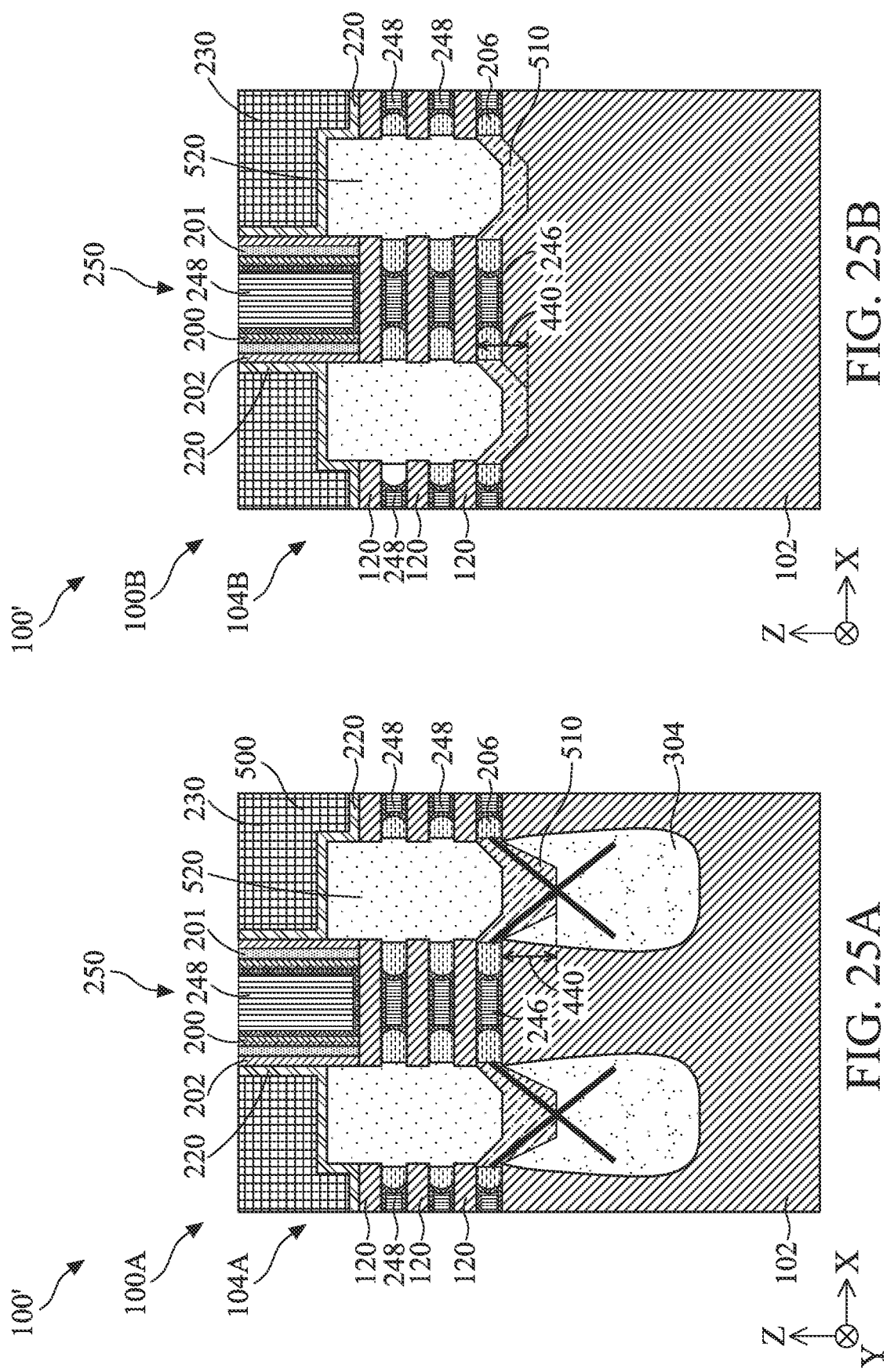

Referring to block 32 of FIG. 18B and FIGS. 25A and 25B, a gate replacement process is conducted to replace the dummy gate stacks 240 in the PMOS region into a metal gate stack. In some embodiments, this process is similar to those described above with respect to blocks 40-46 of FIG. 2C, and to block 32 of FIG. 18B. Accordingly, the metal gate stacks in the PMOS region may be similar to the metal gate stacks in the NMOS region. However, in some embodiments, the conductive metal layers of the PMOS component 100B may include different metal materials from those of the NMOS component 100A. For example, as described above, the NMOS component 100A may include a conductive material layer 248A. The conductive material layer 248A may include Ti, Ag, TaAl, TaAlC, TiAlN, TaC, TaCN, TaSiN, Mn, Zr. By contrast, the PMOS component 100B may include a conductive material layer 248B. The conductive material layer 248B may include titanium nitride (TiN), ruthenium (Ru), iridium (Ir), osmium (Os), rhodium (Rh), other suitable p-type work function materials, or combinations thereof. Because the gate replacement process does not substantially alter the source/drain regions of the NMOS component 100A and PMOS component 100B, the epitaxial layers 510A and 520A, and the epitaxial layers 510B and 520B are not substantially altered, as compared to before the gate replacement process. This is reflected in FIGS. 25C and 25D.

Accordingly, the device 100' includes the NMOS component 100A and PMOS component 100B that are different in several aspects. For example, the NMOS component 100A includes a stress region 304 while the PMOS component 100B does not include similar stress regions. For example, the epitaxial layers 510A and 520A of the NMOS component 100A includes dislocations that extend from below the epitaxial layers 510A (such as from the stressor regions 304), and the PMOS component 100B may not be designed to include such dislocations. For instance, the epitaxial layers 510B and 520B of the PMOS component 100B may be free of dislocations that originate from below the bottom surfaces of the epitaxial layers 510B. For example, the epitaxial layers 510A extends to a depth that has a distance 440 from the top surface of the substrate 120, while the epitaxial layers 510B extends to a depth that has a distance 430 from the top surface of the substrate 120. The distance 440 is greater than the distance 430. For example, the epitaxial layers 510A and 520A includes n-type dopants, while the epitaxial layers 510B and 520B include p-type dopants. In some embodiments, NMOS component 100A and the PMOS component 100B may include a same component but in different locations and at different concentrations to achieve different functionalities. For example, NMOS component 100A may include Ge in the stressor regions 304. The Ge may have been implanted during the process 620 to initiate the formation of dislocations, thereby eventually effect a tensile stress on the channel layers 120. PMOS component 100B may also include Ge, but instead in the epitaxial layers 510B and/or 520B, which asserts a direct compressive stress on the channel layers 120. The NMOS component 100A may include the Ge at a concentration of about $1\times10^{17}$ atoms per cm$^3$ to about $5\times10^{19}$ atoms per cm$^3$, while the PMOS component 100B may include the Ge at a concentration of about $5\times10^{21}$ atoms per cm$^3$ to about $4\times10^{22}$ atoms per cm$^3$. Moreover, for example, the NMOS component 100A includes n-type work function metals, while the PMOS component 100B includes p-type work function metals. For example, the NMOS component 100A includes a tensile stress on the channel layers 120, while the PMOS component 100B includes a compressive stress on the channel layers 120. Additionally, fin structures 104A of the NMOS component 100A may have a lateral width 486 that is greater than 10 nm, although fin structures 104B of the PMOS component 100B may have a lateral width 486 that is less than 10 nm.

Methods 10 and 10' above describe two example methods of the present disclosure. Processing steps may be added to or eliminated from the methods 10 or 10' before or after any of the described steps. Additional steps can be provided before, during, and after the method 10 or 10', and some of the steps described may be replaced or eliminated, for additional embodiments of the method. It is further understood that additional features can be added in the device 100 or 100', and some of the features described may be replaced or eliminated, for additional embodiments of the device 100 or 100'. Moreover, certain details related to some of the processing steps are provided in U.S. Pat. No. 9,293,534 entitled "Formation of dislocations in source and drain regions of FinFET devices" to Tsai and U.S. Pat. No. 9,595,522 entitled "Semiconductor device with a dislocation structure and method of forming the same" to Tsai. The content of both these patents are hereby incorporated by reference in their entirety.

Though not intended to be limiting, embodiments of the present disclosure offer benefits for semiconductor processing and semiconductor devices. For example, the disclosed method provides nano-sheet-based devices having increased tensile stresses in the channel layers. For example, in some embodiments, the tensile stress in the channel layers is increased by about 0.5 GPa to about 2.0 GPa. In some embodiments, the tensile stress in the channel region is increased by about 0.7 GPa to about 1.2 GPa. As a result, the device performances (such as drive currents and speeds) are improved. In some embodiments, the drive current of an NMOS device 100 is increased by about 5% to about 15% depending on parameters of the NMOS device 100.

In one general aspect, the present disclosure is directed to a method. The method includes receiving a semiconductor substrate. The semiconductor substrate has a top surface and includes a semiconductor element. Moreover, the semiconductor substrate has a fin structure formed thereon. The method also includes recessing the fin structure to form source/drain trenches, forming a first dielectric layer over the recessed fin structure in the source/drain trenches, implanting a dopant element into a portion of the fin structure beneath a bottom surface of the source/drain trenches to form an amorphous semiconductor layer, forming a second dielectric layer over the recessed fin structure in the source/drain trenches, annealing the semiconductor substrate, and removing the first and second dielectric layers. After the annealing and the removing steps, the method further includes further recessing the recessed fin structure to provide a top surface. Additionally, the method includes forming an epitaxial layer from and on the top surface.

In some embodiments, the annealing of the dopant element includes adjusting annealing conditions to facilitate recrystallization and dislocations propagation. In some embodiments, the portion of the fin structure has a bottom surface at a first height relative to the top surface of the semiconductor substrate. And the further recessing of the recessed fin structure includes further recessing to a second depth relative to the top surface of the semiconductor substrate, where the second height is above the first height. In some embodiments, the further recessing of the recessed fin structure includes removing a portion of the amorphized semiconductor layer. In some embodiments, the implanting includes implanting germanium (Ge) at a concentration less than about $5 \times 10^{19}$ atoms per cm3. In some embodiments, the forming of the epitaxial layer includes forming the epitaxial layer substantially free of the dopant element. In some embodiments, the fin structure includes a stack of first and second semiconductor layers in an interleaving configuration. Moreover, the method further includes removing the first semiconductor layers to form suspended second semiconductor layers. In some embodiments, the implanting includes implanting to the portion having a top surface extending below a bottom surface of the lowest suspended second semiconductor layers. In some embodiments, the fin structure is a first fin structure in a first device region, the source/drain trenches are first source/drain trenches in the first device region, and the epitaxial layer is a first epitaxial layer in the first device region. The receiving includes receiving the semiconductor substrate having a second fin structure formed thereon in a second device region. Moreover, the method further includes recessing the second fin structure to form second source/drain trenches and forming a second epitaxial layer on a bottom surface of the second source/drain trenches. The second epitaxial layer includes silicon germanium with a germanium concentration greater than about $5 \times 10^{21}$ atoms per cm3. In some embodiments, the dopant element has an atomic size equal to or greater than an atomic size of the semiconductor element.

In one general aspect, the present disclosure is directed to a method. The method includes receiving a fin structure on a substrate. The fin structure has a stack of first semiconductor layers and second semiconductor layers. The first semiconductor layers and the second semiconductor layers have different materials. The method also includes forming a gate structure over the fin structure, and removing portions of the fin structure on both sides of the gate structure to form trenches. The trenches each expose a top surface of the substrate. The method further includes forming a first dielectric layer on bottom surfaces of the trenches; implanting a doping species into semiconductor regions below the bottom surfaces of the trenches through the first dielectric layer; forming a second dielectric layer on the first dielectric layer; annealing the substrate to generate dislocations; removing the first and the second dielectric layers. The method additionally includes removing amorphous materials to expose a crystalized surface. The crystalized surface includes the dislocations. Furthermore, the method includes epitaxially growing source/drain features from crystalized surface.

In some embodiments, before the forming of the first dielectric layer, the method includes forming an epitaxial layer on the bottom surfaces of the trenches. The forming of the first dielectric layer includes forming on top surfaces of the epitaxial layer, and the implanting includes implanting into semiconductor regions below bottom surfaces of the epitaxial layer. In some embodiments, the epitaxially growing includes extending the dislocations into the source/drain features. In some embodiments, the epitaxially growing of the source/drain features includes growing a first epitaxial layer on the crystalized surface, growing a second epitaxial layer on the first epitaxial layer, and extending the dislocations into the second epitaxial layers.

In one general aspect, the present disclosure is directed to a device. The device includes a semiconductor substrate; a fin structure on the substrate extending along a first direction; and source/drain features formed on the fin structure. The source/drain features each include a first epitaxial layer having a first dopant and a second epitaxial layer having a second dopant on the first epitaxial layer. The second dopant is different from the first dopant. The device also includes vertically stacked channel layers between and connecting the source/drain features; a gate structure interposing between the source/drain features and engaging the channel layers; and stressor regions below the source/drain features. Moreover, the device includes a plurality of dislocations extending from the stressor regions across bottom surfaces of the first epitaxial layers into the first epitaxial layers, and across bottom surfaces of the second epitaxial layers into the second epitaxial layers.

In some embodiments, the fin structure includes a semiconductor element, and the stressor region includes an implanted element. The implanted element has a radius greater than the semiconductor element. Moreover, the source/drain features are free of the implanted element. In some embodiments, the stressor region includes implanted species at a concentration of about $1 \times 10^{17}$ atoms per cm3 to about $5 \times 10^{19}$ atoms per cm3. In some embodiments, the source/drain features are first source/drain features in an n-type device region, and the device further includes second source/drain features in a p-type device region. The first source/drain features extend to a first depth below a top surface of the substrate, the second source/drain features extend to a second depth below the top surface of the substrate. The second depth is closer to the top surface of the substrate than the first depth. In some embodiments, the second source/drain features are free of dislocations that originate from below bottom surfaces of the second source/drain features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a channel region comprising a plurality of nanostructures over a substrate;
a gate structure wrapping around each nanostructure of the plurality of nanostructures;
a source/drain feature physically coupled to and extending along sidewall surfaces of the plurality of nanostructures;
a stressor region embedded in the substrate and disposed below the channel region, wherein the source/drain feature extends into the stressor region; and at least one dislocation extending from the stressor region into the source/drain feature.

2. The device of claim 1, wherein the source/drain feature comprises a first epitaxial layer and a second epitaxial layer on the first epitaxial layer.

3. The device of claim 2, wherein the first epitaxial layer comprises a first dopant, and the second epitaxial layer comprises a second dopant different from the first dopant.

4. The device of claim 2, wherein the at least one dislocation extends into the first epitaxial layer.

5. The device of claim 1, wherein the stressor region comprises a recrystallized semiconductor region.

6. The device of claim 2, wherein a topmost surface of the first epitaxial layer is above a top surface of the substrate and is a concave surface.

7. The device of claim 1, wherein the gate structure is vertically overlapped with the stressor region.

8. The device of claim 1, wherein the at least one dislocation propagates along a <111> direction of a silicon semiconductor material.

9. The device of claim 1, further comprising:
a plurality of inner spacers disposed between the gate structure and the source/drain feature,
wherein the source/drain feature comprises a first epitaxial layer and a second epitaxial layer over the first epitaxial layer, wherein the first epitaxial layer is in direct contact with a bottommost inner spacer of the plurality of inner spacers, and the second epitaxial layer is in direct contact with a topmost inner spacer feature of the plurality of inner spacers.

10. A device, comprising:
a channel region comprising a plurality of nanostructures over a substrate;
a gate structure comprising a first portion under a topmost nanostructure of the plurality of nanostructures and a second portion over the plurality of nanostructures;
source/drain features adjacent to the channel region, the source/drain features each including a first epitaxial layer and a second epitaxial layer on the first epitaxial layer, the second epitaxial layer having a dopant different from the first epitaxial layer;
inner spacer features providing isolation between the source/drain features and the first portion of the gate structure;
a plurality of dislocations extending into the source/drain features; and
a recrystallized region disposed in the substrate, wherein, in a cross-sectional view cut through the gate structure and the source/drain features, one of the plurality of dislocations extends from the recrystallized region into the first epitaxial layer and terminates on a sidewall surface of a bottommost inner spacer feature of the inner spacer features.

11. The device of claim 10, wherein at least 70% of a volume of the first epitaxial layer is below a top surface of the substrate.

12. The device of claim 10, wherein, in the cross-sectional view, a portion of the recrystallized region does not vertically overlap with the source/drain features.

13. The device of claim 10, wherein, in a cross-sectional view cut through one of the source/drain features without cut through the gate structure, another one of the plurality of dislocations extends across the first epitaxial layer and extends into the second epitaxial layer.

14. The device of claim 10, wherein the dopant comprises an N-type dopant.

15. The device of claim 10, further comprising:
a gate spacer extending along sidewall surfaces of the gate structure;
a dielectric feature extending along a lower portion of sidewall surfaces the source/drain features, wherein the gate spacer and the dielectric feature have a same composition; and
an etch stop layer extending along the gate spacer, the dielectric feature and the source/drain features.

16. A device, comprising:
a semiconductor substrate;
a first source/drain feature and a second source/drain feature over the substrate, the first source/drain feature including a first epitaxial layer having a first dopant and a second epitaxial layer having a second dopant and covering a top surface of the first epitaxial layer, the second dopant being different from the first dopant;
vertically stacked channel layers between and connecting the first and second source/drain features;
a gate structure interposing between the first and second source/drain features and wrapping around the channel layers;
first and second stressor regions below the first and second source/drain features, respectively; and
a plurality of dislocations extending from the first stressor region into the first epitaxial layer of the first source/drain feature, wherein the plurality of dislocations extend across bottom surfaces of the first epitaxial layer and terminate on a sidewall surface of the first epitaxial layer.

17. The device of claim 16, wherein the channel layers include a semiconductor element, and the first and second stressor regions include an implanted element having a radius greater than the semiconductor element, and wherein the first and second source/drain features are free of the implanted element.

18. The device of claim 16, wherein the first stressor region includes implanted species at a concentration of about $1\times10^{17}$ atoms per $cm^3$ to about $5\times10^{19}$ atoms per $cm^3$.

19. The device of claim 16, wherein the first and second source/drain features are n-type source/drain features in an n-type device region, the device further comprising p-type source/drain features in a p-type device region, wherein the n-type source/drain features extend to a first depth below a top surface of the substrate, the p-type source/drain features extend to a second depth below the top surface of the substrate, and the second depth is closer to the top surface of the substrate than the first depth.

20. The device of claim 19, wherein the p-type source/drain features are free of dislocations that originate from below bottom surfaces of the p-type source/drain features.

* * * * *